United States Patent
Fong et al.

(10) Patent No.: US 11,626,392 B2
(45) Date of Patent: Apr. 11, 2023

(54) METHOD OF FORMING SEMICONDUCTOR DEVICE USING RANGE COMPENSATING MATERIAL

(71) Applicant: Silicon Genesis Corporation, Fremont, CA (US)

(72) Inventors: Theodore E. Fong, Pleasanton, CA (US); Michael I. Current, San Jose, CA (US)

(73) Assignee: Silicon Genesis Corporation, Fremont, CA (US)

( * ) Notice: Subject to any disclaimer, the term of this patent is extended or adjusted under 35 U.S.C. 154(b) by 0 days.

(21) Appl. No.: 17/175,357

(22) Filed: Feb. 12, 2021

(65) Prior Publication Data

US 2021/0242184 A1 Aug. 5, 2021

Related U.S. Application Data

(63) Continuation of application No. 16/797,834, filed on Feb. 21, 2020, now Pat. No. 10,923,459, which is a
(Continued)

(51) Int. Cl.
*H01L 25/10* (2006.01)
*H01L 21/822* (2006.01)
(Continued)

(52) U.S. Cl.
CPC ...... *H01L 25/105* (2013.01); *H01L 21/76254* (2013.01); *H01L 21/8221* (2013.01);
(Continued)

(58) Field of Classification Search
CPC ............ H01L 25/105; H01L 21/76254; H01L 21/8221; H01L 24/83; H01L 24/94;
(Continued)

(56) References Cited

U.S. PATENT DOCUMENTS 6,120,597 A    9/2000 Levy et al.
6,191,007 B1 * 2/2001 Matsui ................. H01L 21/84
                                                    438/455
(Continued)

FOREIGN PATENT DOCUMENTS

JP    2002503885 A   5/2002
KR    20140104429 A  8/2014

OTHER PUBLICATIONS

2014 SOI—3D-Subthreshold Microelectronics Technology Unified Conference (S3S), IEEE. 2014, p. 1.
(Continued)

*Primary Examiner* — Latanya N Crawford Eason

(57) ABSTRACT

A method of forming a semiconductor device includes providing a semiconductor substrate with a circuit layer, forming a range compensating layer over the semiconductor substrate, the range compensating layer having a plurality of different thicknesses, each of the plurality of different thicknesses being inversely proportional to a stopping power of structures disposed under the respective thickness of the range compensating layer, implanting ions into the semiconductor substrate, the ions traveling through the range compensating layer and the circuit layer to define a cleave plane in the semiconductor substrate, removing the range compensating layer, and cleaving the semiconductor substrate at the cleave plane. The range compensating layer can be used to compensate for variations in ion penetration depth.

21 Claims, 38 Drawing Sheets

Related U.S. Application Data continuation of application No. 16/057,747, filed on Aug. 7, 2018, now Pat. No. 10,573,627, which is a continuation-in-part of application No. 15/899,622, filed on Feb. 20, 2018, now abandoned, which is a continuation-in-part of application No. 15/829,442, filed on Dec. 1, 2017, now Pat. No. 10,049,915, which is a continuation-in-part of application No. 15/618,048, filed on Jun. 8, 2017, now abandoned, said application No. 15/618,048 is a continuation of application No. 14/993,015, filed on Jan. 11, 2016, now Pat. No. 9,704,835.

(60) Provisional application No. 62/460,653, filed on Feb. 17, 2017, provisional application No. 62/120,265, filed on Feb. 24, 2015, provisional application No. 62/101,954, filed on Jan. 9, 2015.

(51) Int. Cl.
*H01L 25/00* (2006.01)
*H01L 21/762* (2006.01)
*H01L 23/00* (2006.01)
*H01L 27/06* (2006.01)

(52) U.S. Cl.
CPC .............. *H01L 24/83* (2013.01); *H01L 24/94* (2013.01); *H01L 25/50* (2013.01); *H01L 24/08* (2013.01); *H01L 27/0688* (2013.01); *H01L 2224/08145* (2013.01); *H01L 2224/80* (2013.01); *H01L 2224/83013* (2013.01); *H01L 2224/83099* (2013.01); *H01L 2225/1094* (2013.01); *H01L 2924/00* (2013.01); *H01L 2924/0002* (2013.01); *H01L 2924/14* (2013.01)

(58) Field of Classification Search
CPC ..... H01L 25/50; H01L 24/08; H01L 27/0688; H01L 2924/14; H01L 21/76259
See application file for complete search history.

(56) References Cited

U.S. PATENT DOCUMENTS

| | | | |
|---|---|---|---|
| 6,346,459 | B1 | 2/2002 | Usenko et al. |
| 6,528,391 | B1 | 3/2003 | Henley et al. |
| 6,573,565 | B2 | 6/2003 | Clevenger et al. |
| 6,764,898 | B1 | 7/2004 | En et al. |
| 6,780,759 | B2 | 8/2004 | Farrens et al. |
| 6,881,644 | B2 | 4/2005 | Malik et al. |
| 6,908,832 | B2 | 6/2005 | Farrens et al. |
| 7,078,317 | B2 | 7/2006 | Henley |
| 7,094,666 | B2 | 8/2006 | Henley et al. |
| 7,160,790 | B2 | 1/2007 | Henley et al. |
| 7,166,520 | B1 | 1/2007 | Henley |
| 7,348,258 | B2 | 3/2008 | Henley et al. |
| 7,351,644 | B2 | 4/2008 | Henley |
| 7,354,815 | B2 | 4/2008 | Henley |
| 7,371,660 | B2 | 5/2008 | Henley et al. |
| 7,378,330 | B2 | 5/2008 | Henley et al. |
| 7,390,724 | B2 | 6/2008 | Henley et al. |
| 7,391,047 | B2 | 6/2008 | Henley et al. |
| 7,399,680 | B2 | 7/2008 | Henley |
| 7,427,554 | B2 | 9/2008 | Henley et al. |
| 7,462,526 | B2 | 12/2008 | Henley |
| 7,479,441 | B2 | 1/2009 | Kirk et al. |
| 7,595,499 | B2 | 9/2009 | Henley et al. |
| 7,598,153 | B2 | 10/2009 | Henley et al. |
| 7,629,666 | B2 | 12/2009 | Henley |
| 7,759,220 | B2 | 7/2010 | Henley |
| 7,772,088 | B2 | 8/2010 | Henley et al. |
| 7,910,458 | B2 | 3/2011 | Henley |
| 8,012,851 | B2 | 9/2011 | Henley et al. |
| 8,071,463 | B2 | 12/2011 | Henley |
| 8,124,499 | B2 | 2/2012 | Henley et al. |
| 8,133,800 | B2 | 3/2012 | Henley et al. |
| 8,143,165 | B2 | 3/2012 | Henley |
| 8,153,513 | B2 | 4/2012 | Henley |
| 8,222,119 | B2 | 7/2012 | Henley |
| 8,241,996 | B2 | 8/2012 | Henley et al. |
| 8,293,619 | B2 | 10/2012 | Henley |
| 8,329,557 | B2 | 12/2012 | Brailove et al. |
| 8,330,126 | B2 | 12/2012 | Henley et al. |
| 8,395,259 | B2 | 3/2013 | Eun |
| 8,637,382 | B2 | 1/2014 | Henley |
| 9,336,989 | B2 | 5/2016 | Henley |
| 9,362,439 | B2 | 6/2016 | Henley |
| 9,460,908 | B2 | 10/2016 | Henley |
| 10,049,915 | B2 | 8/2018 | Fong et al. |
| 2002/0173872 | A1 | 11/2002 | Malik |
| 2005/0104027 | A1 | 5/2005 | Lazarev |
| 2005/0150597 | A1 | 7/2005 | Henley et al. |
| 2005/0247668 | A1 | 11/2005 | Malik et al. |
| 2006/0240645 | A1 | 10/2006 | Henley |
| 2007/0029043 | A1 | 2/2007 | Henley |
| 2007/0032044 | A1 | 2/2007 | Henley |
| 2007/0051299 | A1 | 3/2007 | Ong et al. |
| 2008/0044938 | A1 | 2/2008 | England et al. |
| 2008/0128641 | A1 | 6/2008 | Henley et al. |
| 2008/0206963 | A1 | 8/2008 | Henley et al. |
| 2009/0152162 | A1 | 6/2009 | Tian et al. |
| 2014/0329372 | A1 | 11/2014 | Aga et al. |
| 2016/0204088 | A1 | 7/2016 | Fong et al. |
| 2017/0301657 | A1 | 10/2017 | Fong et al. |

OTHER PUBLICATIONS

2015 SOI—3D-Subthreshold Microelectronics Technology Unified Conference (S3S), IEEE, 2015, p. 1.

Beyne, "Next Technologies for Further Adoption of 3D System Integration Technologies," European 3D TSV Summit, IMEC, 2016, pp. 33.

Chen, et al.,"Materials Challenges inTthree-Dimensional Integrated Circuits," MRS Bulletin, 2015, vol. 40 (3), pp. 219-222.

Chen, et al., "Vertical Interconnects of Microbumps in 3D Integration," MRS Bulletin, 2015, vol. 40 (3), pp. 257-263.

Clermidy, et al., "Technology Scaling: The CoolCubeTM Paradigm," IEEE, SOI—3D-Subthreshold Microelectronics Technology Unified Conference (S3S), 2015, pp. 4.

Current, et al., "Preliminary Steps Towards Implementing Intimate 3D-IC Stacking with Layer Transfer and Atomic Bonding Methods," IEEE SOI—3D-Subthreshold Microelectronics Technology, 2015, pp. 3.

Du, et al. "Emerging 3DVLSI: Opportunities and Challenges," IEEE, SOI—3D-Subthreshold Microelectronics Technology Unified Conference (S3S), 2015, pp. 5.

Ebrahimi, et al., "Monolithic 3D Integration Advances and Challenges: From Technology to System Levels," IEEE, SOI—3D-Subthreshold Microelectronics Technology Unified Conference (S3S), 2014, pp. 2.

Fitzgerald, et al., "Monolithic 3D Integration in a CMOS Process Flow," IEEE, SOI—3D-Subthreshold Microelectronics Technology Unified Conference (S3S), 2014, pp. 3.

Gu, "Material Innovation Opportunities for 3D Integrated Circuits from a Wireless Application Point of View," MRS Bulletin, 2015, vol. 40 (3), pp. 233-241.

Heinig, "Enabling 3D Systems—A Comprehensive Approach from Design to Technology," European 3D Summit, 2016, pp. 27.

Iyer, "Monolithic Three-Dimensional Integration for Memory Scaling and Neuromorphic Computing," IEEE, SOI—3D-Subthreshold Microelectronics Technology Unified Conference (S3S), 2015, pp. 7.

Iyer, "Three-Dimensional Integration: An Industry Perspective," MRS Bulletin, 2015, vol. 40 (3), pp. 225-232.

Jiang, et al., "Through-Silicon via Stress Characteristics and Reliability Impact on 3D Integrated Circuits," MRS Bulletin, 2015, vol. 40 (3), pp. 248-256.

Koyanagi, et al., "Applications of Three-Dimensional LSI," MRS Bulletin, 2015, vol. 40 (3), pp. 242-247.

(56) References Cited

OTHER PUBLICATIONS

Liu, et al., "Sustaining the Silicon Revolution: From 3-D Transistors to 3-D Integratio," IEEE, SOI—3D-Subthreshold Microelectronics Technology Unified Conference (S3S), 2015, pp. 3.

Maleville, "Engineered Substrates for Moore and More than Moore's Law: Device Scaling: Entering the Substrate Era," IEEE, SOI—3D-Subthreshold Microelectronics Technology Unified Conference (S3S), 2015, pp. 5.

Mitra, "From Nanodevices to Nanosystems: The N3XT Information Technology," IEEE, SOI—3D-Subthreshold Microelectronics Technology Unified Conference (S3S), 2015, p. 1.

Nayak, et al., "Power, Performance, and Cost Comparisons of Monolithic 3D ICs and TSV-Based 3D ICs," IEEE SOI—3D-Subthreshold Microelectronics Technology, 2015, pp. 2.

Or-Bach, et al., "Modified ELTRAN®—A Game Changer for Monolithic 3D," IEEE SOI—3D-Subthreshold Microelectronics Technology, 2015, pp. 3.

Or-Bach, et al., "Precision Bonders—A Game Changer for Monolithic 3D," IEEE, SOI—3D-Subthreshold Microelectronics Technology Unified Conference (S3S), 2014, pp. 4.

Pabo, "Heterogeneous Integration Enabled by Advanced Wafer Bonding," IEEE 3S3 Proceedings, 2015, http://http://s3sconference.org/program/highlights-of-our-2015-conference/, pp. 3.

Panth, et al., "Design challenges and solutions for ultra-high-density monolithic 3D ICs," IEEE, SOI—3D-Subthreshold Microelectronics Technology Unified Conference (S3S), 2014, pp. 2.

Patton, "New Game-Changing Product Applications Enabled by SOI," IEEE, SOI—3D-Subthreshold Microelectronics Technology Unified Conference (S3S), 2015, p. 1.

PCT Search Report for Application No. PCT/US18/63328, dated on Mar. 26, 2019.

Proton Energy Requirements for M3D Layer Splitting: Rev2, 2014, pp. 1-10.

Report on S3S14: SOI—3D-Subthreshold Microelectronic Technology Unified Conference, IEEE, 2014, pp. 1-11.

Sekar, "3D memory with Shared Lithography Steps: The memory industry's plan to Cram more Components onto Integrated Circuits,".

Sollier, et al., "300 mm InGaAsOI Substrate Fabrication using the Smart CutTM Technology," IEEE, SOI—3D-Subthreshold Microelectronics Technology Unified Conference (S3S), 2015, pp. 2.

Sugaya, et al., "New Precision Alignment Methodology for CMOS Wafer Bonding," IEEE, SOI—3D-Subthreshold Microelectronics Technology Unified Conference (S3S), 2014, pp. 3.

Torki, "3D-IC Integration," CMP Annual Users Meeting, 2013, pp. 47.

Uhrmann, et al., "Monolithic IC Integration Key Alignment Aspects for High Process Yield," IEEE, SOI-3D-Subthreshold Microelectronics Technology Unified Conference (S3S), 2014, pp. 2.

Vinet, et al., "Monolithic 3D Integration: A powerful Alternative to Classical 2D Scaling ," IEEE, SOI-3D-Subthreshold Microelectronics Technology Unified Conference (S3S), 2014, pp. 3.

Yonehara, "Epitaxial Layer Transfer Technology and Application," IEEE SOI-3D-Subthreshold Microelectronics Technology, 2015, p. 1.

Extended European Search Report for EP 18883845.2, dated Aug. 3, 2021.

* cited by examiner

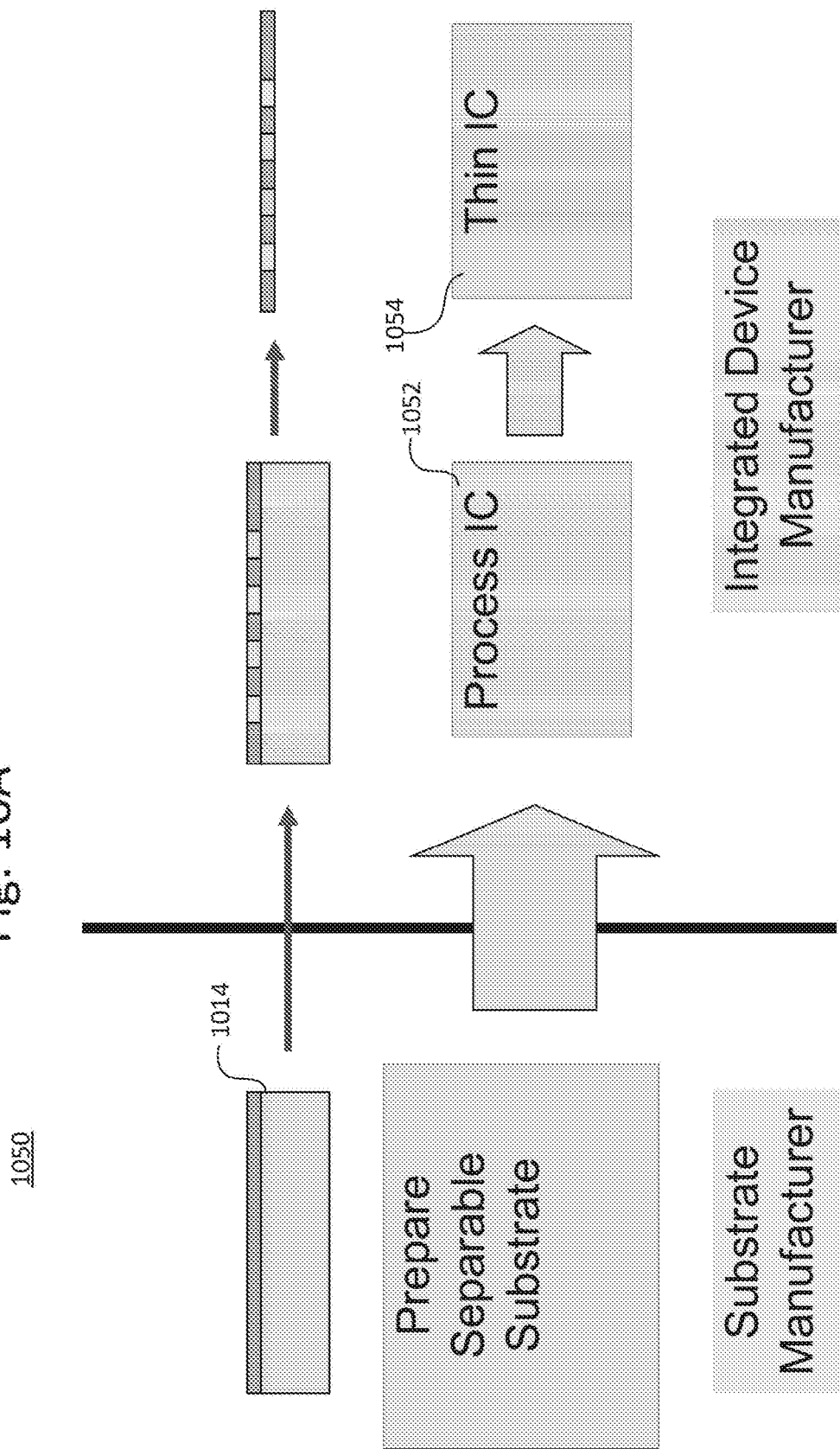

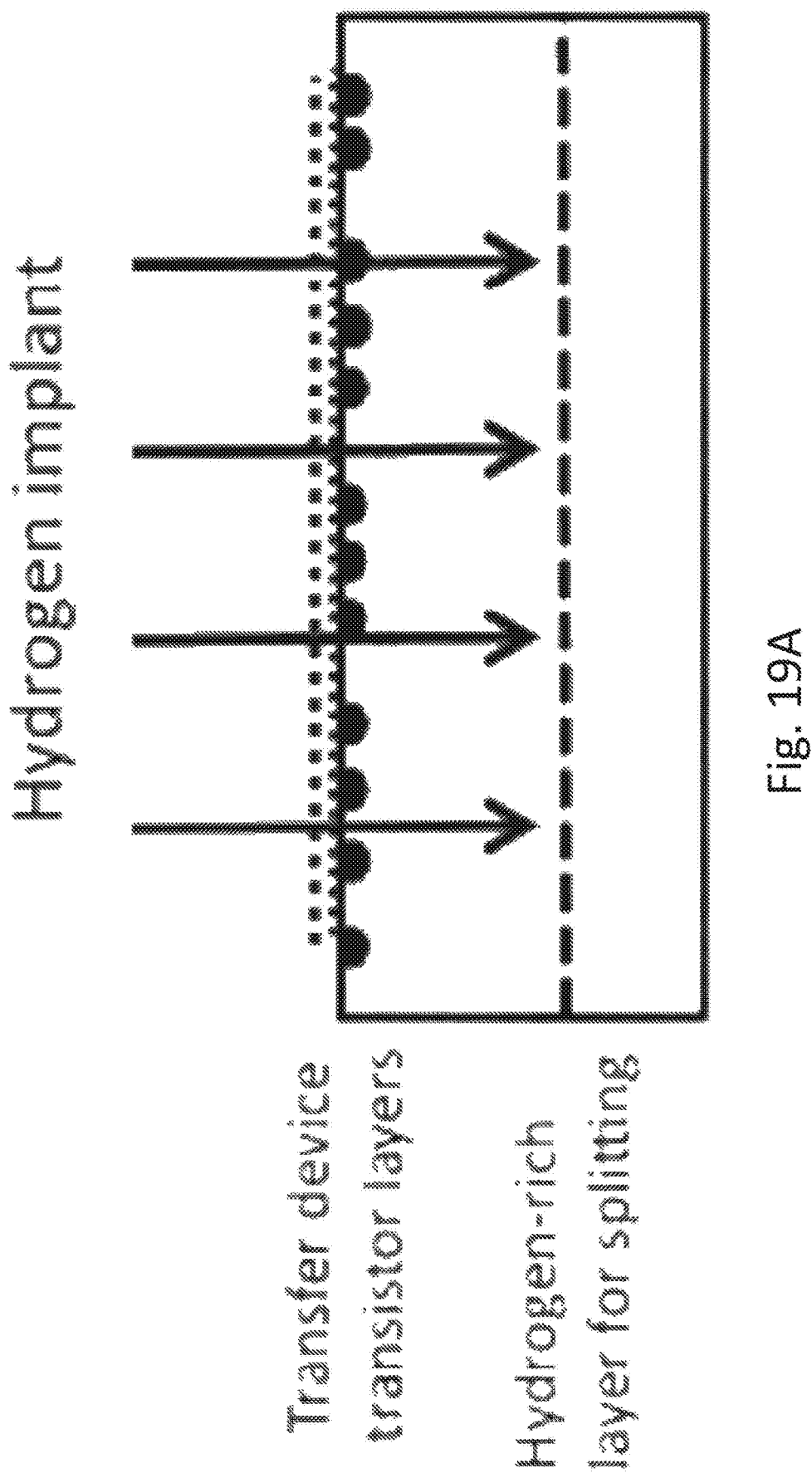

METHOD OF FORMING SEMICONDUCTOR DEVICE USING RANGE COMPENSATING MATERIAL

CROSS-REFERENCE TO RELATED APPLICATIONS

This application is a continuation of U.S. application Ser. No. 16/797,834 filed Feb. 21, 2020, now issued as U.S. Pat. No. 10,923,459 on Feb. 16, 2021, which is continuation of U.S. application Ser. No. 16/057,747, filed Aug. 7, 2018, now issued as U.S. Pat. No. 10,573,627 on Feb. 25, 2020, which is a continuation in part of U.S. application Ser. No. 15/899,622, filed Feb. 20, 2018, which claims priority to provisional application No. 62/460,653, filed Feb. 17, 2017, and is a continuation in part of U.S. application Ser. No. 15/829,442, filed Dec. 1, 2017, issued as U.S. Pat. No. 10,049,915 on Aug. 14, 2018, which is a continuation in part of U.S. application Ser. No. 15/618,048, filed Jun. 8, 2017, which is a continuation of U.S. Pat. No. 9,704,835, issued on Jul. 11, 2017, which claims priority to each of the following provisional applications: U.S. Provisional Patent Application No. 62/120,265, filed Feb. 24, 2015, and U.S. Provisional Patent Application No. 62/101,954, filed Jan. 9, 2015. Each of these documents is incorporated in its entirety herein.

BACKGROUND

Semiconductor substrates in conventional chip stacks are typically thinned using a mechanical backgrinding process. Backgrinding imparts a high level of mechanical stress to the devices and can result in substantial thickness variation. Therefore, other processes for separating substrates are desirable.

One approach to substrate thinning is described in U.S. Pat. No. 6,316,333 (hereinafter, "Bruel"). Bruel describes implanting ions through gate structures to form a cleaving plane in a substrate and removing a portion of the substrate by cleaving along the cleave plane. Bruel acknowledges that ion implantation causes damage to device structures, e.g, channel regions, that can render the devices inoperable. Bruel describes building structures on the exposed surface of a substrate to selectively block ion implantation, thereby reducing damage to structures that are disposed directly beneath the blocking structures.

However, there are several limitations to Bruel's proposal. The structures described by Bruel are relatively large, e.g. gate lengths of 0.5 microns. Current devices use structures that are much smaller, e.g. gate lengths of 30 nanometers or less, which are more than an order of magnitude smaller than the gate length described by Bruel. In order to accumulate sufficient hydrogen ions to perform a cleaving operation, ions must be implanted through a substantial portion of a device surface. Moreover, modern devices are increasingly complex and include higher quantities of sensitive structures. Some of these structures, such as vertical transistors, have vertical components that are longer than horizontal components, which presents a greater opportunity for damage from a vertically oriented ion that passes through the structure.

In addition, larger structures are generally more robust to ion damage than smaller structures. A smaller structure will have fewer atoms and be more sensitive to the disruption of an atom within the structure. For example, a barrier layer that has a feature size of 10 nm may have a thickness in the tens of atoms, so that disruption of a single atom may have a significant effect on the barrier property.

TECHNICAL FIELD

The present disclosure relates generally to the manufacture of integrated circuit devices. By way of example, the integrated circuits can include, among others, memory devices, processor devices, digital signal processing devices, application specific devices, controller devices, communication devices, and others.

SUMMARY

Embodiments of the present disclosure relate to semiconductor devices including ion cleaving technology. Embodiments may be employed to form three-dimensional integrated circuit (3DIC) by implanting ions through a circuit layer to form a cleave plane, repairing damage caused by the implantation, and stacking semiconductor substrates. The substrates may be processed at the wafer scale.

In an embodiment, process of forming a 3DIC includes providing a first substrate with a circuit layer that includes plurality of dielectric and conductive structures, implanting ions through the circuit layer and into the first substrate to form a cleave plane, and after implanting the ions through the circuit layer, exposing the semiconductor substrate to a hydrogen gas mixture for a first time at a first temperature to repair damage caused by the implanted ions. A first portion of the first substrate with the plurality of dielectric and conductive structures disposed thereon is separated from a second portion of the first substrate by cleaving at the cleave plane, the first portion of the substrate is bonded to a second substrate. At least a portion of the conductive structures of the first substrate may subsequently be connected to conductive structures of the second substrate. The first temperature may be from 300 C to 500 C, and the time may be at least one-half hour. The conductive and dielectric structures may include high-K dielectric structures comprising at least one material with a K of 10 or greater.

The first and second substrates may be wafer scale substrates, and the first substrate may not be exposed temperatures above, for example, 300 C, 400 C, 450 C or 500 C after implanting the ions and before separating the first portion from the second portion.

In an embodiment, the hydrogen gas mixture has at least 1% hydrogen gas and a remainder of the gas mixture is one or more inert gas. For example, the gas mixture may be a forming gas.

The ions may be implanted at a temperature of less than 100 C and a proton energy that is sufficient to place a majority of recoil damage and the cleave plane deeper than a depletion layer thickness of an operating transistor.

In an embodiment, a process for repairing damage caused by implanting ions through a circuit layer that includes conductive and dielectric structures into a semiconductor substrate is performed by exposing the semiconductor substrate to a hydrogen gas mixture for a first time at a first temperature after implanting ions through the conductive and dielectric structures of the semiconductor substrate. The conductive and dielectric structures may include high-K dielectric structures that include at least one of hafnium oxide ($HfO_2$), hafnium silicon oxide ($HfSiO_2$), hafnium silicate ($HfSiO_4$), tantalum oxide ($TaO_5$), tungsten oxide ($WO_3$), cerium oxide ($CeO_2$), titanium oxide ($TiO_2$), yttrium oxide ($Y_2O_3$), strontium titanate ($SrTiO_3$), lanthanum aluminate (LaAlO$_3$), niobium pentoxide (NiO$_5$), zirconium silicate (ZrSiO$_4$) and zirconium oxide (ZrO$_2$).

The hydrogen gas mixture may have at least 1% hydrogen gas and a remainder of one or more inert gas, such as a forming gas. The exposure time may be at least 30 minutes, and the first temperature may be, for example, from 300 C to 500 C or from 350 C to 450 C. In an embodiment, the first time is from one half hour to five hours and the first temperature is from 350 C to 450 C.

In an embodiment, the dielectric structures may include at least one dielectric material with a K of 20 or more, the first temperature is from 300 C to 500 C, the hydrogen gas mixture includes at least 1% hydrogen, and the temperature is at least 30 minutes, and the ions are implanted to form a cleave plane below the circuit layer.

A method of forming a device includes providing a first substrate, depositing a thickness of range compensating material on a first surface of the first substrate, implanting ions into the first substrate, the ions traveling through the range compensating material to define a cleave profile in the first substrate, the cleave profile including at least one contour that corresponds to the thickness of absorber material, removing the absorber material, and cleaving the first substrate at the cleave profile, thereby exposing the at least one contour. In an embodiment, the at least one contour is a coolant channel. The range compensating material may be a photoresist material.

The method of forming a device may include, after cleaving the first substrate, coating exposed surfaces of the coolant channel with a coating layer. The coating material may be a material that prevents a chemical reaction between a coolant fluid and the first substrate material. For example, the coating material may be a nitride material or an oxide material. The thermal conductivity of the coating material may be higher than a thermal conductivity of a bulk material of the first substrate. In some embodiments, the first substrate has a thermal conductivity that is greater than 130 W/m-K at a temperature of 25 degrees Celsius. The first substrate may include carbon, for example in embodiments in which the first substrate is a diamond or graphite material.

After cleaving, the cleaved surface of the first substrate may be bonded to a second substrate having a circuit layer. In such an embodiment, the bond may be formed by an oxide layer deposited on a surface of the second substrate. When the range compensating layer is removed, a bond layer may be deposited on the first surface of the first substrate, and used to bond a third substrate comprising a circuit layer to the bonding layer on the first surface of the first substrate. The first, second and third substrates may be wafer scale substrates.

In some embodiments, hydrogen ions are implanted through one or more circuit layer that includes high-K dielectric and conductive elements. In such embodiments, ion implantation may damage the dielectric and conductive elements. The damage may be repaired by exposing the substrate to an atmosphere that includes a hydrogen gas and an inert gas at a temperature of from 350 degrees Celsius to 500 degrees Celsius for at least 30 minutes to repair damage to the dielectric structures.

In an embodiment, a method for forming a stacked semiconductor device includes implanting ions through dielectric and conductive structures of a first substrate to define a cleave plane in the first substrate, cleaving the first substrate at the cleave plane to obtain a cleaved layer including the dielectric and conductive structures, bonding at least one die to the first substrate, the at least one die having a smaller width than a width of the first substrate, depositing a planarization material over the at least one die, planarizing the planarization material to form a planarized upper surface over the at least one die, and stacking a third substrate on the planarized upper surface.

The ions may be implanted at a temperature of 100 degrees Celsius or less. In an embodiment the ions are implanted at room temperature.

In some embodiments, a total thickness variation (TTV) of material cleaved from the substrate is 4% or less, 2% or less, or 1% or less. The first, second and third substrates may be wafer scale substrates. Furthermore, after cleaving the first substrate, the first substrate may be annealed to repair damage to the dielectric and conductive structures caused by the ions.

In an embodiment, an annealing process that repairs damage to the dielectric and conductive structures is performed at a temperature of 350 Celsius or greater in an environment that includes hydrogen gas. Conditions in a repair process should be sufficient to allow hydrogen to penetrate the device surface and bond to a molecule that was damaged by an implantation process. In one specific embodiment, the repair annealing is conducted at a temperature of 400 Celsius in an atmosphere that includes from 2 to 5 percent hydrogen, with a remainder being one or more inert gas. In an embodiment, the repair annealing is conducted for a period of time that is sufficient to allow the hydrogen gas to diffuse though circuit structures in a device, which may include an interconnect network of metal and low-dielectric constant dielectric material, and to occupy passivating sites at damaged dielectric bonds. In an embodiment, annealing is conducted at a temperature of 400 Celsius for one hour.

An embodiment may include depositing a dielectric material over the at least one die after bonding the at least one die to the first substrate and before bonding the third substrate over the at least one die.

Before implanting the ions, a range compensating layer may be formed over the first substrate.

After the first substrate is cleaved, the first substrate may be bonded to a second substrate. In an embodiment, the second substrate has second dielectric and conductive structures, and the second substrate is formed by implanting ions through the second dielectric and conductive structures. The first, second and third substrates may be wafers.

A small die may be one of several types of devices, including an amplifier, a RF tuner, a radio tuner, a Light Emitting Diode, and an optical sensor.

The plurality of conductive structures bay be a plurality of transistors with a respective plurality of conductive gates that are separated from respective channel regions by gate dielectrics.

In an embodiment, a method of forming a three-dimensional integrated circuit includes providing a first semiconductor substrate with a first circuit layer including conductive metal and dielectric materials, implanting ions through the plurality of conductive metal and dielectric materials of the first circuit layer to create a first cleave plane in the first substrate, cleaving the first substrate at the first cleave plane, providing a second semiconductor substrate with a second circuit layer including conductive metal and dielectric materials, implanting ions through the conductive metal and dielectric materials of the second circuit layer to create a second cleave plane in the second substrate, cleaving the second substrate at the second cleave plane, bonding the first substrate to the second substrate, stacking at least one die on the second substrate, the die having a width that is less than a width of the first plurality of circuit structures, depositing a planarization material over the at least one die, planarizing the planarization material to form a planarized upper surface over the at least one die, and stacking a third substrate on the planarized upper surface.

In an embodiment, a method of forming a semiconductor device includes forming an ion range compensating layer over a surface of a first substrate, implanting ions through the ion range compensating layer and dielectric and conductive structures of the first substrate to define a cleave plane in the first substrate, cleaving the first substrate at the cleave plane to obtain a cleaved layer including the dielectric and conductive structures, bonding at least one die to the first substrate, the at least one die having a smaller width than a width of the first substrate;

depositing a planarization material over the at least one die, planarizing the planarization material to form a planarized upper surface over the at least one die, and stacking a third substrate on the planarized upper surface.

According to the present disclosure, techniques generally related to the manufacture of integrated circuit devices are provided. More particularly, the present disclosure provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, application specific devices, controller devices, communication devices, and others.

A method comprises providing a first substrate having dielectric structures and conductive structures. Ions are implanted into the first substrate, the ions traveling through the dielectric structures and the conductive structures to define a cleave plane in the first substrate. The first substrate is cleaved at the cleave plane to obtain a cleaved layer having the dielectric structure and the conductive structures. The cleaved layer is used to form a three-dimensional integrated circuit device having a plurality of stacked integrated circuit (IC) layers, the cleaved layer being one of the stacked IC layers.

Three-dimensional stacking and interconnection of heterogeneous and non-uniform layers, such as fully fabricated integrated circuits are provided. Techniques are included for a substantial reduction in inter-layer separation and increase in the available inter-layer connection density, leading to increased signal bandwidth and system functionality, compared to existing chip stacking methods using interposers and through-Silicon vias (TSVs). The present techniques extend the use of high-energy proton implants for splitting and layer transfer developed for homogeneous materials, such as the fabrication of Silicon-on-Insulator (SOI) wafers, with modifications appropriate for layer transfer of heterogeneous layers and consideration for damage effects in device structures.

In an example, the present disclosure provides techniques including a method for fabricating an integrated circuit. The method includes providing a semiconductor substrate comprising a surface region, a plurality of transistor devices formed overlying the surface region, an interlayer interconnect region comprising a structured metal layer and a structured dielectric layer and an inter-layer connection overlying the plurality of transistor devices, and a dielectric material overlying the interconnection region to provide a bonding interface, although there can be variations. The method includes forming an unpatterned photoresist material overlying the bonding interface provided from the dielectric material. In an example, the unpatterned photoresist material is configured to shield one or more of the plurality of transistors from electromagnetic radiation in a wavelength range of below 400 nm and to selectively adjust a depth of a subsequent implanting process. The method subjects the unpatterned photoresist material to the implantation process to introduce a plurality of hydrogen particles through the unpatterned photoresist material to a selected depth to a cleave region underlying the surface region of the semiconductor substrate to define a transfer device between the cleave region and a surface of the dielectric material to form a thickness of a multi-layer of a plurality of interconnected conductive metal layers and insulating dielectric having a total metal thickness of 3 to 5 microns or less. The method removes the unpatterned photoresist material after the hydrogen implant step. The method bonds the surface of the dielectric material overlying the transfer device to a transfer substrate to temporarily bond the semiconductor substrate to the transfer substrate.

In an example, the method subjects sufficient energy to a portion of the cleave region to remove an upper portion of the semiconductor substrate from a lower bulk substrate material, while using the transfer substrate to hold the upper portion of the semiconductor substrate such that the upper portion comprises a hydrogen damaged region. The energy can be provided spatially or globally as described in U.S. Pat. No. 6,013,563 (the '563 patent) assigned to Silicon Genesis Corporation, claims priority to May 12, 1997, and lists Francois J. Henley and Dr. Nathan Cheung, as inventors, commonly assigned, and hereby incorporated by reference in its entirety. In an example, the method subjects the hydrogen damaged region overlying the transfer device to a smoothing process to remove a portion or all of the hydrogen damaged region and to form a backside surface. In an example, the method forms a thickness of dielectric material overlying the backside surface.

In an example the backside surface is configured with one or more provisions for formation of an inter-layer conductive path linking to a bottom landing pad in the structured metal layer of the transfer device and a landing pad for a bonded conductive path to an adjacent device layers.

In an example, the method further comprises depositing a dielectric layer to form a suitable bonding interface on the structured metal layer, the structured metal layer comprising a 5 to 10 microns thick conducting layer formed over a densely patterned metal interconnect multi-layers for provision of a device power signal, a ground signal and a frequency synchronization signal, and the dielectric layer having a plurality of conductive paths through the dielectric layer on for bonding with inter-layer conductors in an upper, transfer device layer.

In an example, the method further comprises aligning of the transfer device layer to the semiconductor substrate to permanently bond the inter-layer conducting path. In an example, the method further comprises removing the temporary bonded semiconductor substrate from the transfer device. In an example, the method further comprises forming an internal flow path to allow coolant to traverse there through to cool the transfer device. The inter-layer coolant channels may be formed by use of a patterned photo resist layer added over the unpatterned photoresist layer. The thickness and/or location of the patterned photo resist layer may be chosen to adjust the local penetration depth of the proton beam to form a non-planar cleave surface in the substrate containing the top surfaces of the coolant channels, with the bottom surface provided by the lower bond plane.

In an example, the plurality of transistor devices are selected from at least one of CMOS devices, bipolar transistors, logic devices, memory devices, digital signal processing devices, analog devices, light absorbing and imaging devices, photo-voltaic cells or micro-electrical mechanical structures (MEMS), or any combination thereof.

In an example, the implantation process, proton energy ranges from 500 kilovolts to 2 MeV. In an example, the cleave region is positioned 1 to 10 microns from a top surface of the dielectric material. In an example, the unpatterned photoresist material is selected with high absorptivity of electromagnetic radiation with a wavelength less than 400 nm. In an example, the semiconductor substrate comprises a silicon or other suitable material for formation of electrical, optical or electromechanical devices.

In an example, the implantation process is provided at a dose ranging from 5E16 to 5E17 particles/centimeter$^2$. In an example, the implantation process is provided using a beam line implanter. In an example, the implantation process is provided by a linear accelerator (LINAC) or other variation.

In an example, the cleave region having a peak concentration at an edge of an implantation range. In an example, the cleave region comprises a plurality of hydrogen gas-filled micro-platelets. In an example, the cleave region is characterized by a stress sufficient to induce propagation of an approximately planar cleave region. In an example, the cleave region is configured as a uniform implantation region or a patterned implantation region. In an example, the cleave region is patterned or graded to facilitate a controlled cleaving action.

In an example, the method comprises forming a plurality of interconnect structures between the backside surface and either the plurality of transistors or the inter-connect region. In an example, the method further comprises providing a second semiconductor substrate comprising a plurality of second transistor devices and an overlying second dielectric material; and bonding the second dielectric material configured with the second semiconductor substrate to form a stacked semiconductor structure. In an example, the method further comprises forming a patterned photoresist material overlying the unpatterned photoresist material.

In an example, the plurality of transistor devices and the interconnect region are characterized by a thickness of three microns and less; wherein the implantation process is characterized by a range of five microns to ten microns such that a characteristic size of the plurality of transistor devices and the interconnect region does not influence the implantation process. In an example, the plurality of transistor devices and the interconnect region are characterized by a thickness of three microns and less; wherein the implantation process is characterized by a range of five microns to ten microns such that a characteristic spatial dimension of the range of the implantation is not interfered by the thickness of the plurality of transistor devices and the interconnect region. In an example, the plurality of transistor devices is provided for a memory array or a logic array.

In an example, the energy is selected from thermal, mechanical, chemical, electrical, or combinations thereof to provide a cleave inducing energy. In an example, the energy is provided to cause a controlled cleaving action including an initiation of cleaving and propagation of cleaving. In an example, the energy is provided to form a plurality of micro-platelet bubbles in the cleave region. A cleave surface may connect a network of the micro-platelet bubbles The present disclosure achieves these benefits and others in the context of known process technology. However, a further understanding of the nature and advantages of the present disclosure may be realized by reference to the latter portions of the specification and attached drawings.

BRIEF DESCRIPTION OF THE DRAWINGS

FIG. 10A shows IC processing and/or thinning steps performed downstream of the process flow shown in FIG. 10.

FIG. 19A shows a simplified cross-sectional view of high-energy, high dose proton implant to form a Hydrogen-rich layer placed several microns below the CMOS transistor layer.

DETAILED DESCRIPTION OF THE SPECIFIC EXAMPLES

Figure 1:
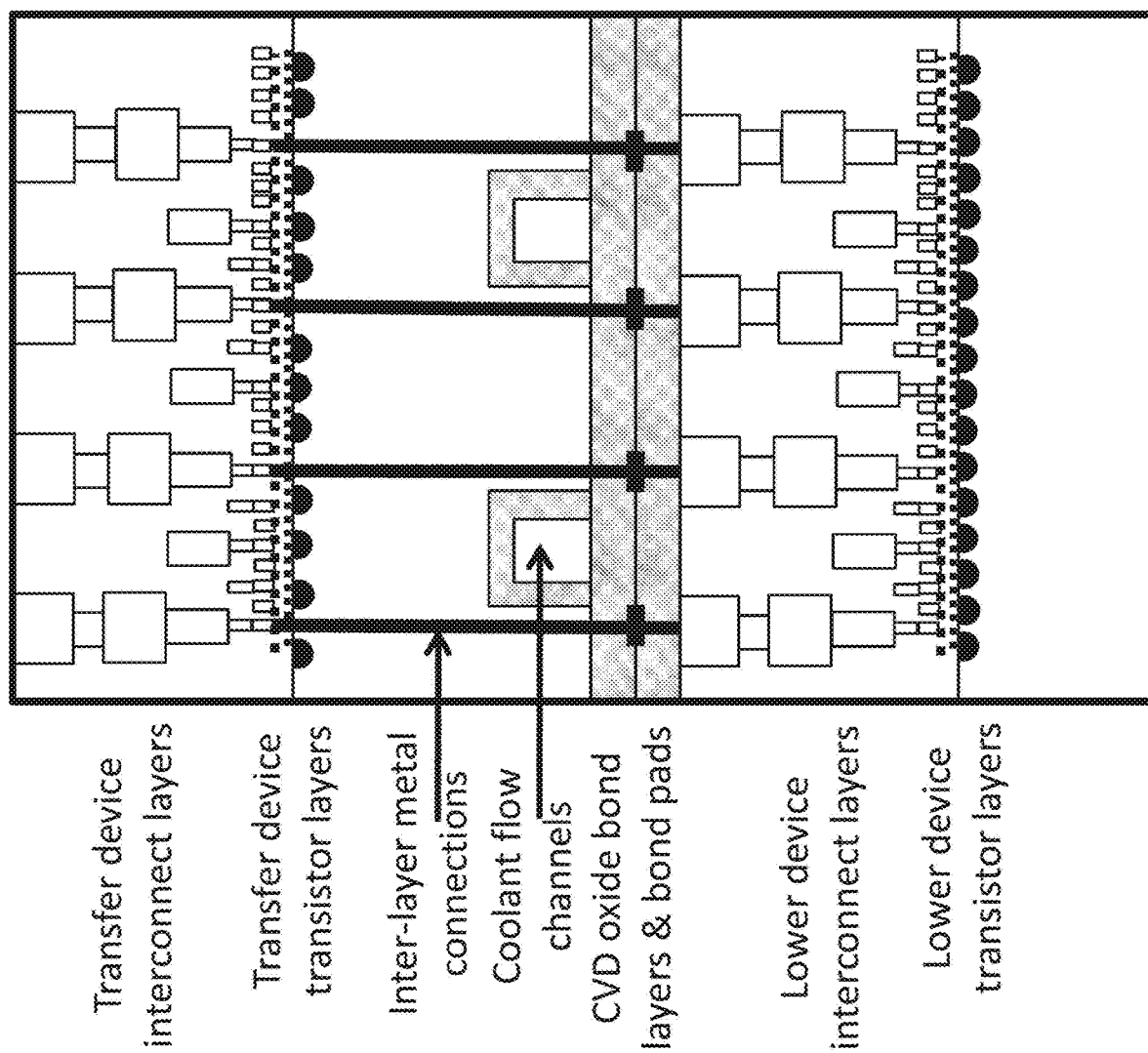
FIG. 1 is a schematic view of an embodiment of this disclosure.

According to the present disclosure, techniques generally related to the manufacture of integrated circuit devices are provided. More particularly, the present disclosure provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, digital signal processing devices, application specific devices, controller devices, communication devices, and others.

An embodiment builds and extends the capabilities of two large areas of technology, layer transfer methods for formation of bonded stacks of homogeneous layers, such as the formation of Silicon-on-Insulator (SOI) wafers and diverse methods in present use and development to form 3-D stacks of electrical devices through the use of complex interposer layers and sparse arrays of metal vias for inter-device connections.

An embodiment provides for methods of stacking and interconnection of diverse electrical and electro-mechanical layers with simplified bond and interconnect structures with physical scales that are a factor of 10 or more smaller than presently available interposer/TSV methods and providing for greatly increased number of inter-device electrical connection paths, resulting in greatly expanded data transfer bandwidth and 3-D device functionality. The present disclosure also provides for protection of sensitive device layers from harmful ultraviolet radiation associated with the use of high-energy proton beam lines and for construction of inter-level networks of coolant flow channels for removal of heat from the volume of the functions 3-D device stack. Further details of the present disclosure can be found throughout the present specification and more particularly below.

Embodiments may combine Silicon-On-Insulator (SOI) wafer formation approaches utilizing techniques such as H-cut separation and plasma-activated bonding to achieve a room temperature transfer process, combined with Si separation utilizing MeV proton technology, to achieve full-CMOS 3D stacking.

Such Layer-Transfer (LT) applied to 3D Wafer-Scale Packaging (WSP) can allow substantial benefits due to its high parallel connectivity and ability to use different processes. Embedded RAM/Cache layers are a natural application.

Conventional WSP approaches may experience challenges in one or more of the various areas of: bonding, layer alignment, layer thinning, and layer strata interconnect. For example, layer thinning to less than 10 μm can desirably lead to vias with smaller aspect ratios.

Use of plasma fusion bonding allows favorable alignment. And, embodiments as described herein may make layer alignment and interconnect practically achievable goals.

Embodiments utilizing LT technology involving cold processing, allow processing of wafers with Interlayer Dielectric (ILD)/metal interconnects. The plasma-activated fusion bond confers bond strength, ultra-thin bond, no glue layers. As described below, fast thinning operation is possible, without necessarily requiring chemical mechanical polishing (CMP), polishing, or grinding operations.

Embodiments may be compatible with a variety of IC processes, including those used to fabricate complementary metal oxide semiconductor (CMOS) and Random Access Memory (RAM) devices, etc.

The use of implantation at MeV energies allows thicker implantation through an entire device layer (10 μm). Thus, a full CMOS device layer can be transferred instead of partial layers.

Implant scanning techniques may be used. Examples can include obtaining channeling improvements through "dithering".

Utilization of MeV protons by embodiments for full CMOS stacking, may offer certain benefits. Embodiments may allow avoidance of shadowing due to CMOS layers that include transistor, dielectric, and/or metal layer structures.

A 1 MeV proton beam is sufficient to perform H-cut implants through 8 Cu metal interconnect layers and a full-depth CMOS microprocessor unit (MPU) with ≈10 μm Si penetration.

Such a 10 μm depth in Si, for a 1 MeV proton beam through a model 8-layer Cu interconnect array and connected CMOS transistor layer, is more than adequate for separation of damage peak from CMOS device region. A figure of merit for the desired minimum separation below the CMOS transistor layer of the proton damage region and bond oxide surface of the transferred layer substrate layer is the depletion depth into the substrate material of a biased, powered on, bulk CMOS array, on the order of 1 micrometer for a 1 V supply voltage and a 10 Ohm-cm substrate material. CMOS transistor layers comprising bulk "finFET" and "fully-depleted SOI" devices can have somewhat thinner substrate depletion thickness, depending on the device design and supply voltage. Relative precision (straggling/range) of 1 MeV proton profiles is much sharper than standard SOI wafer fabrication implants (at ≈40 keV).

It is further noted that H peak depth can be reduced by spin-on resist absorber layers. This aspect is further described in connection with FIGS. 1-9 discussed later below.

Figure 10:
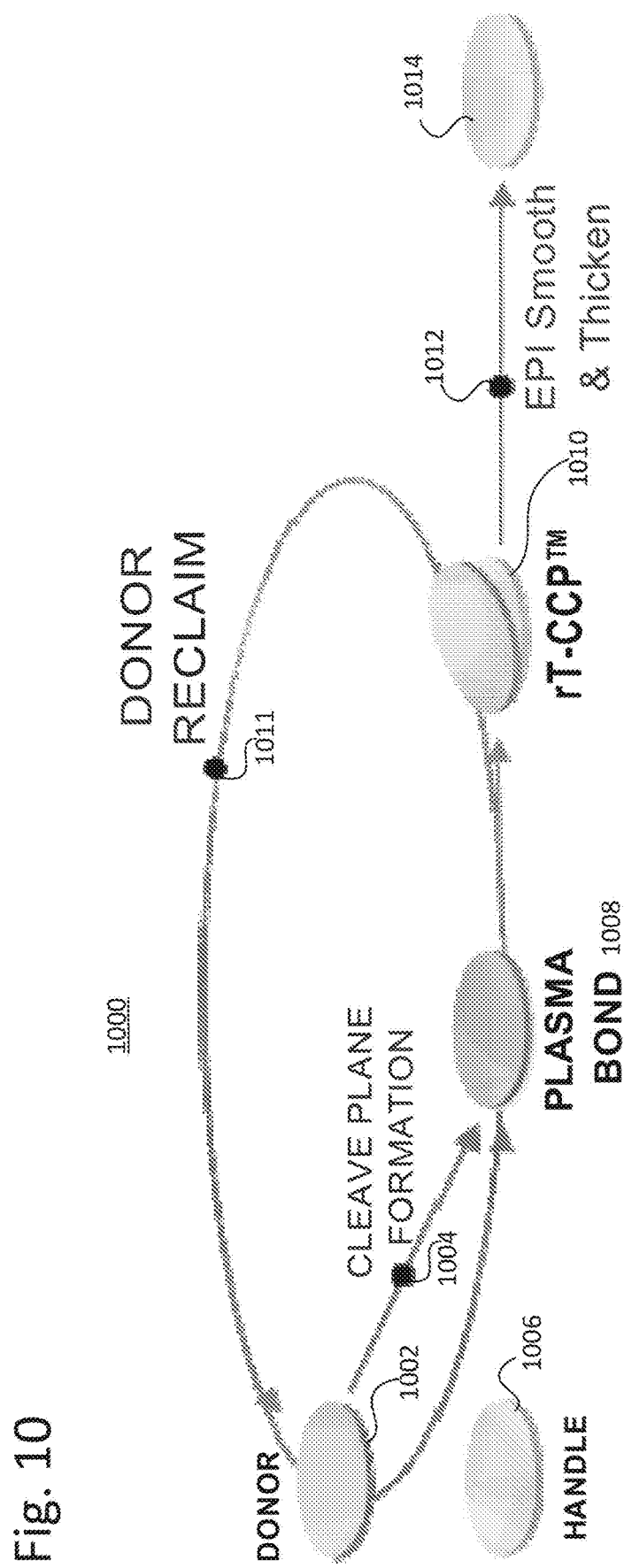
FIG. 10 shows one example of a process flow for preparing a separable substrate according to an embodiment.

FIG. 10 shows one example of a process flow 1000 for preparing a separable substrate according to an embodiment. Here, a donor substrate 1002 is subjected to cleave plane formation 1004, e.g., by the implantation of hydrogen ions.

Then, the donor substrate including the cleave plane is bonded to a handle substrate 1006, e.g. by a plasma-activated bonding process 1008. Next, the LT occurs by the performance of a room Temperature—Controlled Cleaving Process (rT-CCP™), such that a portion of the donor remains with the handle substrate. Alternatively, a portion of the donor may remain with a temporary carrier substrate if this layer is to be retransferred again to a permanent handle substrate (e.g., for back side illumination CMOS image sensors).

The remaining portion of the donor substrate is reclaimed 1011 for further use. The handle including the transferred layer 1010 may be subjected to further processing—e.g., epitaxial (EPI) smoothing and thickening 1012, to produce the separable substrate 1014.

FIG. 10A shows a simplified process flow 1050 illustrating downstream steps performed upon the substrate provided by a substrate manufacturer of FIG. 10. Those steps may comprise IC processing 1052 (see, e.g., FIG. 11 below) and/or thinning 1054 (see, e.g., FIGS. 12-15 below).

Figure 11:
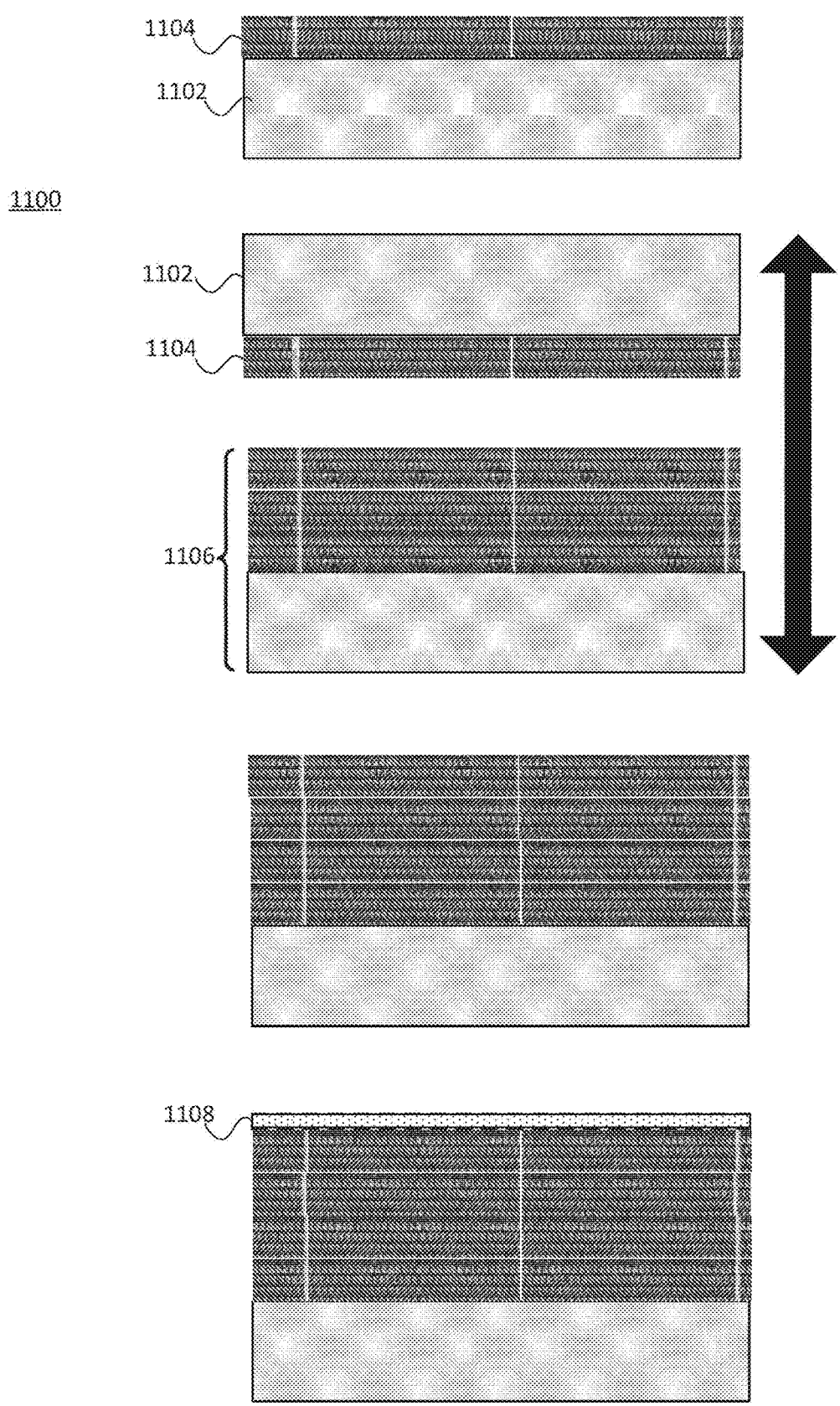
FIG. 11 shows a simplified view of a general IC process flow according to an embodiment.

Specifically, FIG. 11 shows a simplified view of a general IC process flow 1100 according to an embodiment. Here, the IC Maker received "special wafer" 1102 and processes IC layer "n+1" 1104 without any modifications.

Then, the IC layer is bonded onto the Wafer Scale Processing (WSP) stack (1 to n) 1106. After bonding, the wafer 1102 can be released.

Shown last in FIG. 11 is the performance of steps to such as interconnect processing, Chemical Mechanical Polishing (CMP), etc. to finish a layer 1108. This can be repeated for a layer "n+2".

At least four layer transfer (LT) packaging variants are possible. FIGS. 12-15 describe four options of LT for thinning.

Figure 12:
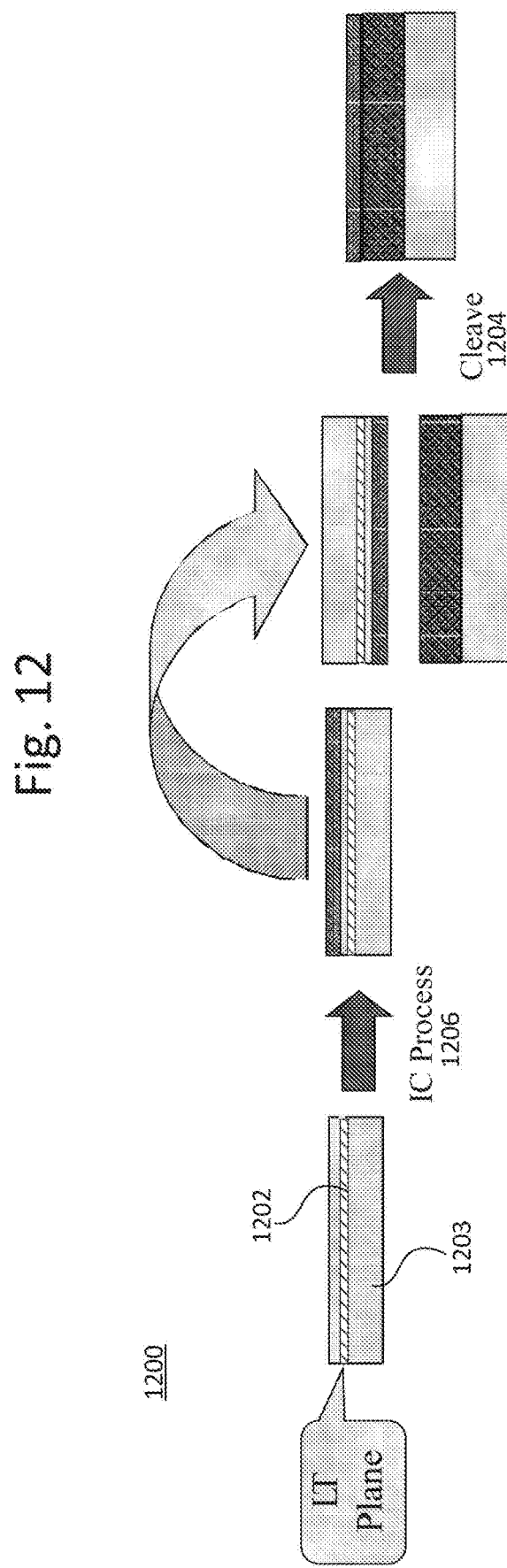
FIGS. 12-15 show simplified processing flows according to various alternative embodiments.

FIG. 12 shows an embodiment of LT after IC processing. The simplified process flow 1200 shown in this figure involves putting a cleave plane 1202 within the substrate 1203, and then cleaving 1204 after IC processing 1206. It requires more intrusive post-IC process steps.

Figure 13:
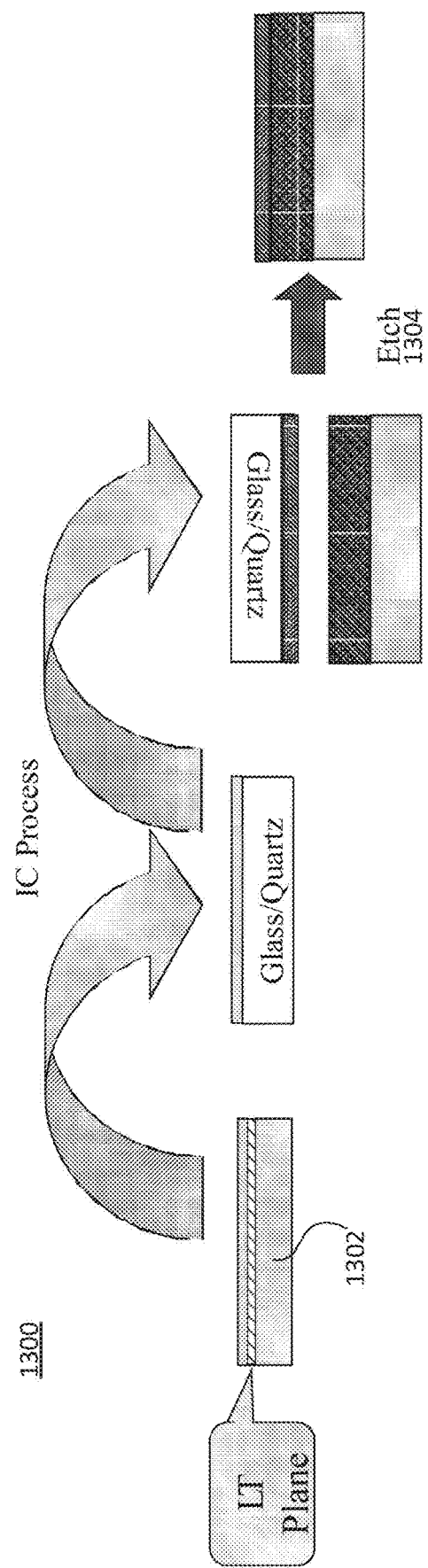

FIG. 13 shows an embodiment utilizing cleave onto an etchable substrate. The simplified process flow 1300 according to this embodiment allows the substrate 1302 to be more easily etched 1304 than SOI bond-grind back processes.

In such embodiments, the etchable substrate may be thin. An electrostatic (ES) chuck can be used to help stiffen cleave and handle the thin substrate. Transparent substrates can help with layer alignment.

Figure 14:
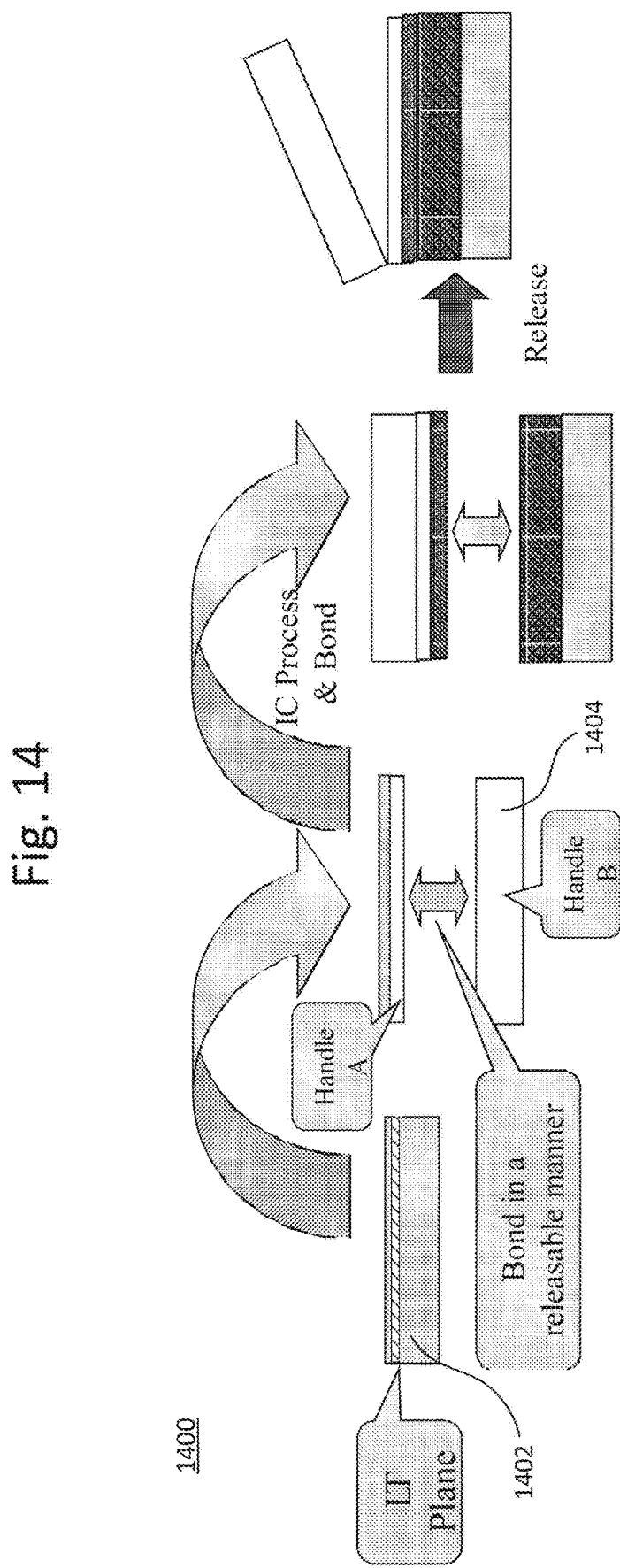

FIG. 14 shows an embodiment of a process flow 1400 where the substrate 1402 comprises a "thin" substrate attached to a releasable base substrate. The thin substrate can be utilized in the final 3D product. The releasable substrate is solely used for handling during the IC process.

Figure 15:
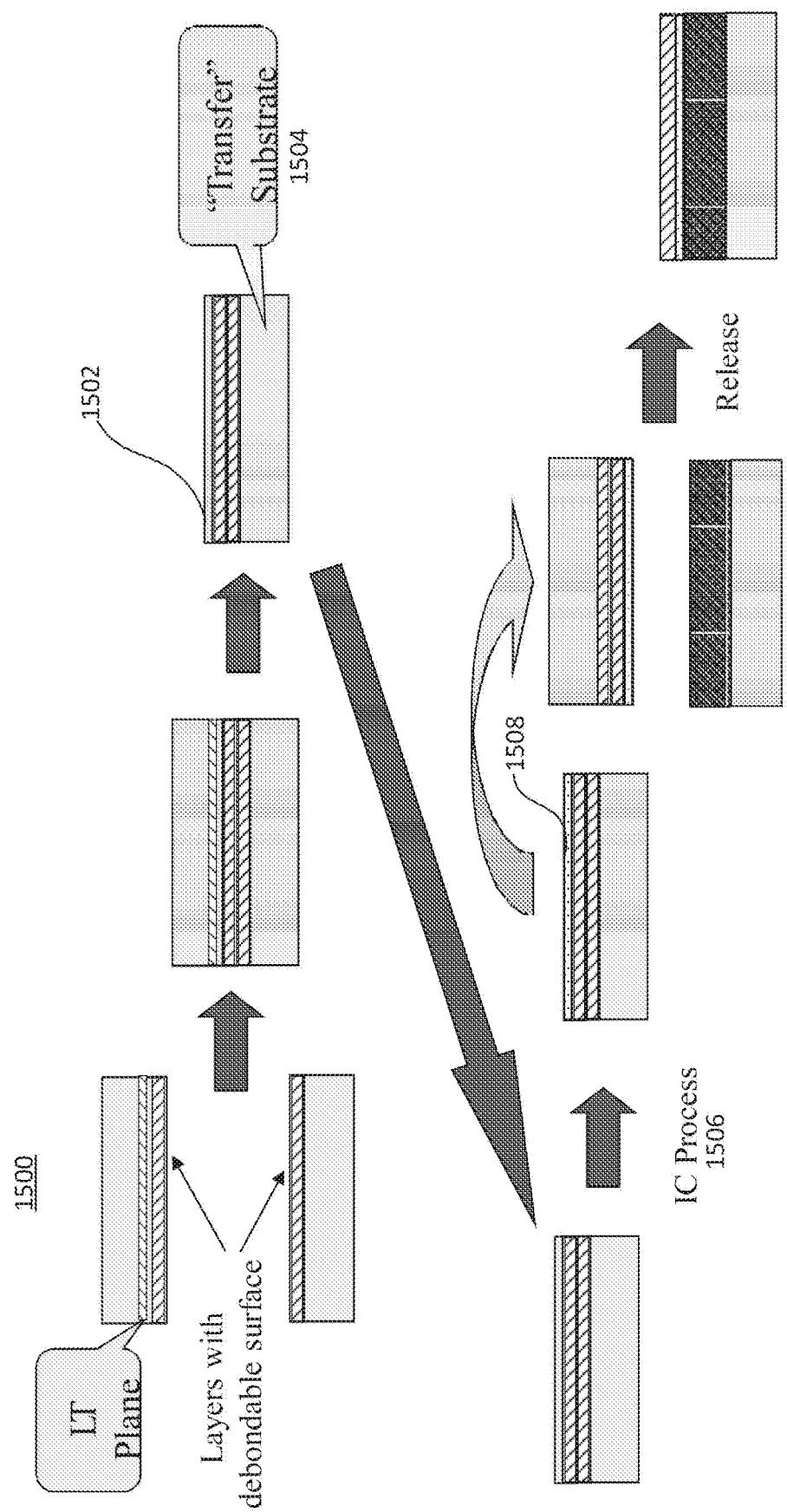

FIG. 15 shows a simplified process flow 1500 according to another embodiment. Here, the silicon film 1502 is mounted to a releasable substrate 1504. The releasable substrate is solely used for handling during IC process 1506 resulting in processed layer 1508. An internal release layer is used after LT. The release layer is put within the bond plane. LT is used to release the processed Si-layer, followed by thickening if necessary.

Certain features and benefits may accrue with one or more embodiments. For example, H-cut splitting and layer transfer techniques may be extended to beyond lamination of uniform composition layers to enable wafer-scale stacking of heterogeneous and non-uniform individual layers, with the specific application of intimate stacking of fully-fabricated integrated circuits, including transistor layers and multi-layer interconnect networks.

Embodiments may achieve high data transfer bandwidth with high-density inter-die interconnect with thin device stacking using "intimate bonding" with H-cut and layer transfer techniques.

Embodiments may increase manufacturability and device yield by use of room to modest-temperature process throughout the stacking process.

Some implementations may outline device layer lamination with H-cut and plasma-bonding operations (using high-alignment accuracy bonding tools).

Particular embodiments may utilize variations on front-back stack and front-front stack bonding, with corresponding interconnect depths and locations.

Some embodiments may thin total device layer elements (no need for interposers), with decreases in RC losses even for high-density inter-device via connections.

Various embodiments may lower stress via connections with much reduced "keep out" area from Cu/Si stress.

Certain embodiments may implement methods for post-splitting damage layer removal and substrate thickness reduction (selective etching)—appropriate for bonding and heat transfer requirements (much less stringent than SOI wafer layer lamination).

Certain additional factors of particular embodiments are also now described. Some such factors may deal with non-uniform total Cu-interconnect thickness in various IC designs.

For example, metrology can be used. A scan effect of non-uniform Cu density collects backscattered proton current from a large-angle collection electrode facing IC metal surface with a ≈1×1 um² aperture for MeV proton beam. A precision stage scanner for IC motion under aperture maps out net Cu density by backscatter current.

Design rules can be used to address non-uniformity. These design rules may specify allowable variations in total Cu thickness across IC device areas. Wafer-level splitting can be achieved with large-area checkerboard H distributions.

A manufacturing process can be used to address non-uniformity. For example, a "dummy" Cu or other similar material layer may be added at positions of low-Cu thickness, such as inter-layer metal via channels. Examples of other materials include materials such as CVD-deposited oxide and nitride dielectrics, polymers, and other metals. In general, the material should have sufficient ion stopping power and thickness to bring the location of deep proton peaks into an approximately similar depth across a cleave plane.

Embodiments may set the cleave plane depth, not directly affected by proton energy or variation in total Cu-layer densities, by constructing IC devices over a high-stress epi layer, such as a graded Si—Ge thin layer, to localize post-stopping H concentration along high-stress interfaces. The cleave plane will be set by the location of the high-concentration H distribution accumulated at the built in high-stress interface.

Total proton dose and related risk of dielectric bond damage (in low-k interconnect and high-k gate dielectrics) from electronic stopping events may be reduced, by increasing proton lattice damage accumulation (via nuclear stopping events) by lowered wafer temperature during proton implantation.

1A. A method, comprising:
providing a first substrate having dielectric structures and conductive structures;
implanting ions into the first substrate, the ions traveling through the dielectric structures and the conductive structures to define a cleave plane in the first substrate; and
cleaving the first substrate at the cleave plane to obtain a cleaved layer having the dielectric structure and the conductive structures,
wherein the cleaved layer is used to form a three-dimensional integrated circuit device having a plurality of stacked integrated circuit (IC) layers, the cleaved layer being one of the stacked IC layers.

The method of clause 1A, wherein the implantation is performed while keeping the first substrate at a temperature of 100 degrees Celsius or less.

In one embodiment, the implantation is performed at room temperature.

The method of clause 1A, wherein the implantation energy is greater than 100 KeV and the ions are protons.

The method of clause 3A, wherein the implantation energy is 300 KeV or greater.

The method of clause 3A, wherein the implantation energy is 500 KeV or greater.

The method of clause 3A, wherein the implantation energy is 1 MeV or greater.

The method of clause 1A, wherein the dielectric structures and the conductive structures are formed on the first substrate by performing a plurality of processing steps on the first substrate.

As mentioned above, certain embodiments may reduce H peak depth by spin-on resist absorber layers. This is now discussed below.

FIG. 1 is a schematic view of an embodiment at completion of a two-device 3D stacking process. The upper device layer, containing heterogeneous layers of transistors formed in semiconductor materials, usually Si, and a dense network of metal, usually Cu with various other metals for liners and vias, layers separated by low-dielectric constant electrical insulator materials, is separated from a semiconductor wafer after formation processing by hydrogen implant and associated cleaving process. During proton implant, the transfer device structure is covered with a uniform photoresist layer of sufficient thickness and properties to protect the device layers from damaging exposure to ultra-violet radiation from recombination processes in the proton beam line plasma. For the case shown in FIG. 1, the transferred device layer is also coated with a second photoresist layer patterned to adjust the depth of the proton beam and the resulting cleave surface along the paths of a network of coolant flow channels designed to remove heat from the volume of the completed 3-D device stack. Conductive structures include transistor junctions in the substrate and a metal interconnect network contacted to the transistor layer.

After mounting of the upper device layer to a temporary bond handle waver, the cleaved lower surface of the transfer device is processed to remove implant damage in the region of the cleave surface and adjust the thickness of the transfer device substrate layer. Then a CVD oxide layer is deposited on the lower surface to provide an efficient bonding surface and to provide an electrically insulating and passivated surface for the coolant flow channels, if present. The lower device surface is then etched and filled with metal to form inter-level electrical connection to the transfer device interconnect layers, through a substrate and deposited oxide layer thickness of the order of 1 or more microns. The inter-level metal lines in upper transfer device layers are terminated with metal bond pads with bond surfaces at the same plane as the deposited oxide bonding layer.

A similar deposited oxide is formed on the lower device top surface to provide efficient bonding, a network of vias are etched and filled with metal to provide electrical connections with the lower device interconnect layers. The lower metal lines are terminated by metal bond pads at the same plane as the lower deposited oxide surface.

The two sets of metal bonding pads are aligned in a precision bonding apparatus and subjected to bond anneal processing, completing the 2-level stack shown in FIG. 1 (with coolant channels).

Figure 2:
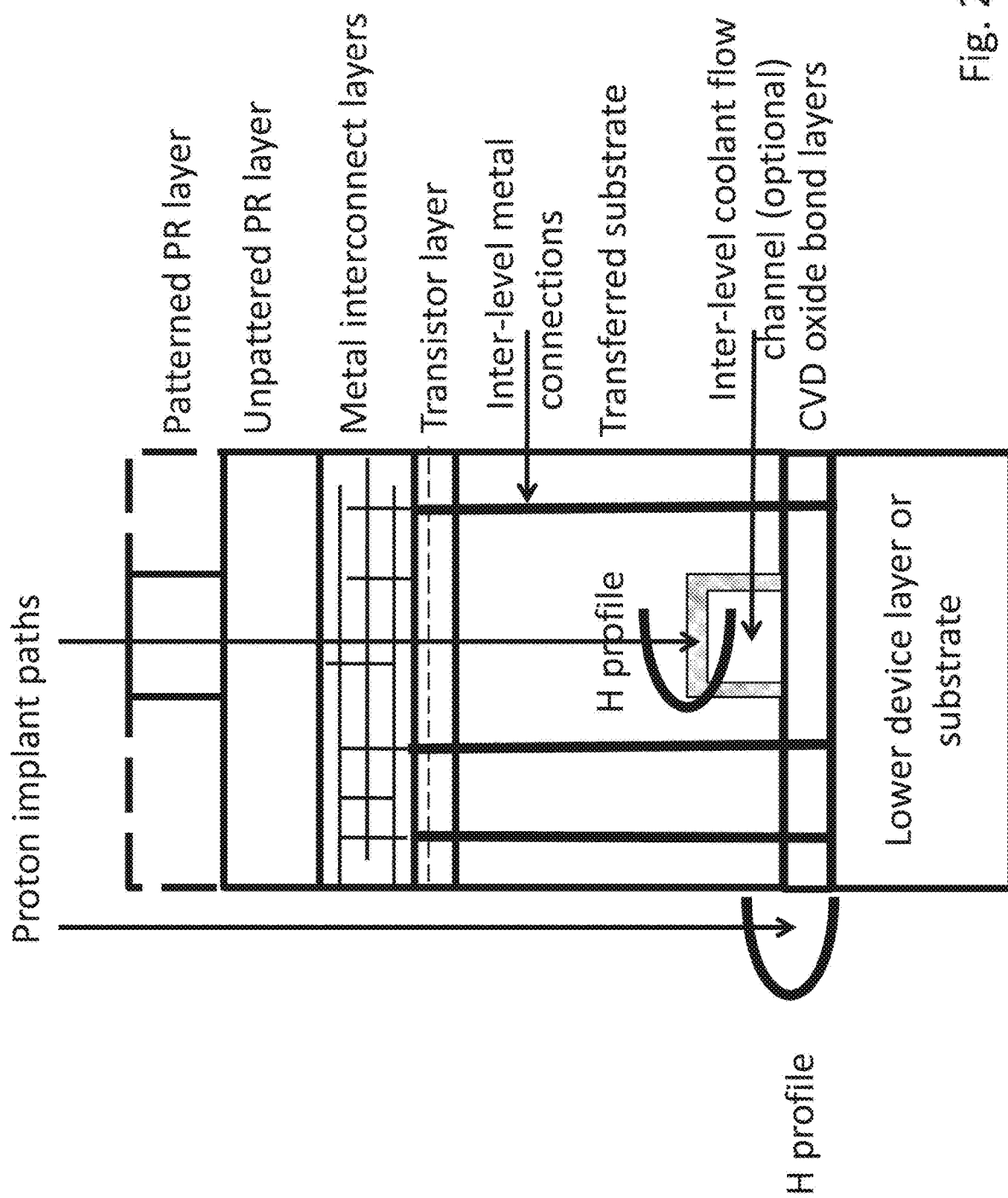
FIG. 2 illustrates a heterogeneous structure containing a layer of transistor devices and an upper network of metal and low-dielectric constant materials, with provisions for inter-layer coolant channels provided by implantation through an additional, patterned photo resist layer in an example.

FIG. 2 shows a view of patterned PR and device layer after layer transfer to lower device layer. In FIG. 2, a heterogeneous structure containing a layer of transistor devices and an upper network of metal and low-dielectric constant materials providing interconnects for an integrated circuit (IC) is coated with a uniform photoresist (PR) layer, where the resist properties and thickness is chosen to provide adequate protection for sensitive IC layers and interfaces from exposure to ultra-violet (wavelength less than 400 nm) radiation arising from recombination events in the proton accelerator beam line plasma. The thickness and stopping of the uniform PR layer is also chosen to adjust the range of the proton beam to a desired depth below the IC device transistor and depletion layers.

In FIG. 2, a second, patterned, PR layer is added over the uniform PR layer with the thickness and stopping of the second PR layer chosen to locally adjust the depth of the implanted proton distribution to provide a non-planar material splitting surface. When the transferred device layer is bonded to a lower device layer, after removal of the PR layers and temporary bonding to a holder layer, the non-planar splitting surface provides a network path, reflecting the patterning of the upper PR layer, for flow of coolant in the finished IC device stack for removal of heat during device operation.

Also shown in FIG. 2 are inter-level metal vias and bonding landing pads and oxide bonding interfaces which are added to the lower section of the upper transferred device layer before bonding to the lower device layers, described in more detail in later figures.

Top absorber layers may be used to (1) locally control the depth of the peak of the proton damage profile in the transfer device substrate, thereby controlling the location of cleave surface at separation; (2) define the lateral location and depth of coolant channels formed by the depth variations in the cleave surface; and/or (3) provide a protective layer to absorb UV-radiation arising from electron capture and subsequent radiative processes by proton ions in the accelerator beam line.

Certain embodiments of this process use an un-patterned, cross-linked photo-resist (PR) layer with a second PR layer deposited above, lithographically exposed and developed to leave a patterned PR over layer.

Other embodiments of this process may use CVD deposited dielectric films. In certain embodiments, an un-patterned CVD oxide layer is deposited on the top surface of the metal interconnect network of the device layer to be transferred to the 3DIC stack. The thickness of this first CVD oxide layer may be chosen so that the combined stopping power effects of the CVD oxide, device metal interconnect network and the device substrate places the proton and damage peaks at the desired depth of the main cleave plane surface below the transfer device transistor layer.

A CVD nitride layer is then deposited on the first CVD oxide layer to act as an etch stop to protect the underlying oxide layer during the etching of the top CVD oxide layer.

Then a second CVD oxide layer is deposited on the nitride layer. The thickness of the top CVD oxide layer may be chosen to locally shift the location of the peak of incident proton beam to be shallower than the location of the main cleave surface by the desired height of coolant flow channels to be formed by the subsequent bonding of the transferred device layers to a planar bonding surface on the top of an underlying device layer in the 3DIC stack.

A PR layer may then be deposited on the top oxide, lithographically exposed and developed to leave a patterned PR over-layer. This patterned PR layer protects the top CVD oxide layer in the locations where the coolant channels will be formed during the subsequent oxide etch step, with the nitride layer protecting the lower oxide layer.

Figure 2A:
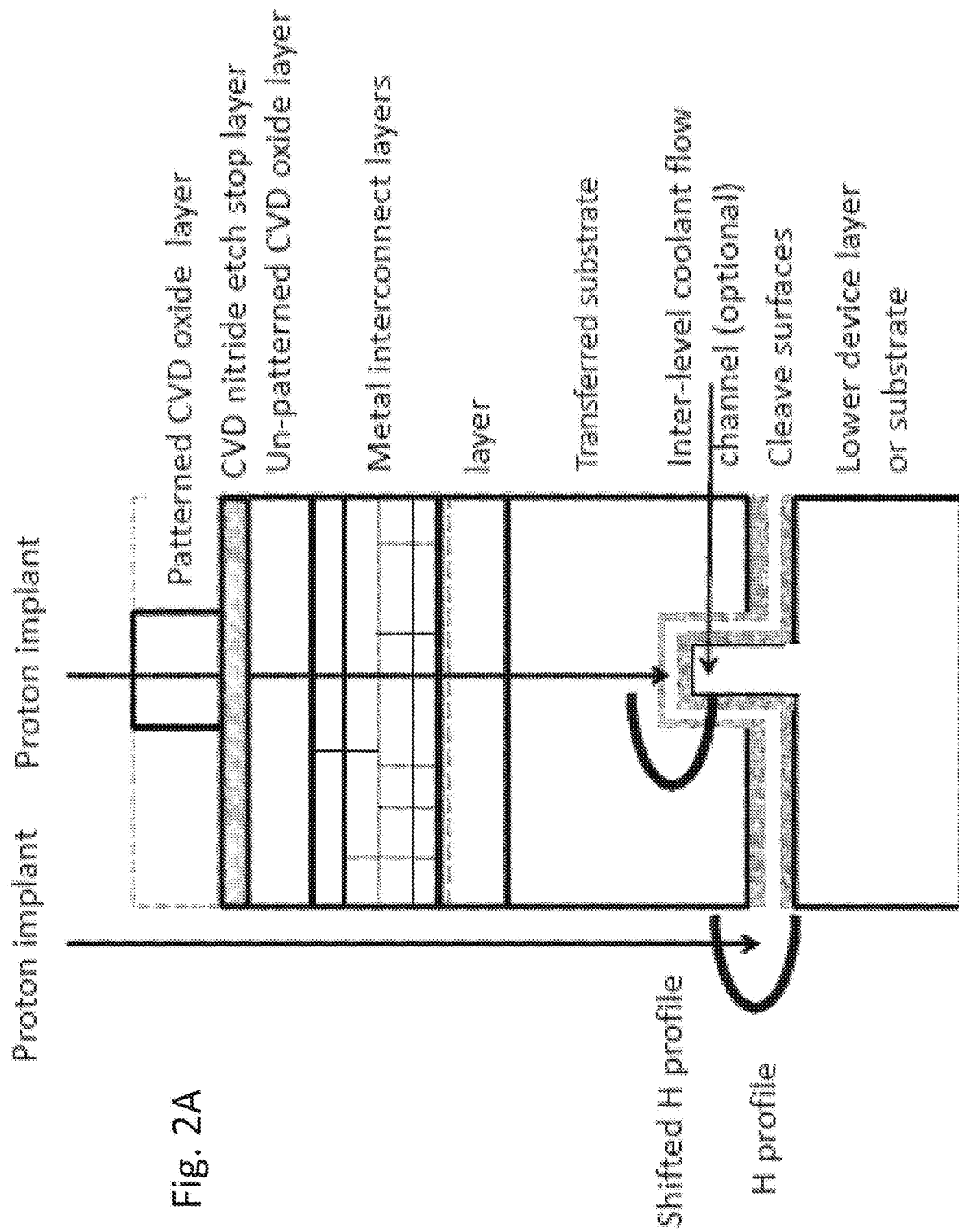
FIGS. 2A-B are simplified cross-sectional views showing use of patterned oxide as an absorber.

FIG. 2A is a simplified cross-sectional view of the transfer device layer at proton implant showing an un-patterned top CVD layer with thicknesses chosen to shift the peak of the proton profile to be at a depth of the desired location of the cleave surface. A patterned second CVD oxide layer, with thickness chosen to shift the proton beam peak to the height of the (optional) coolant channels to be formed during the subsequent bonding step to the 3DIC device stack. A CVD nitride layer deposited between the two oxide layers act as an etch stop for the top oxide patterning etch.

Figure 2B:
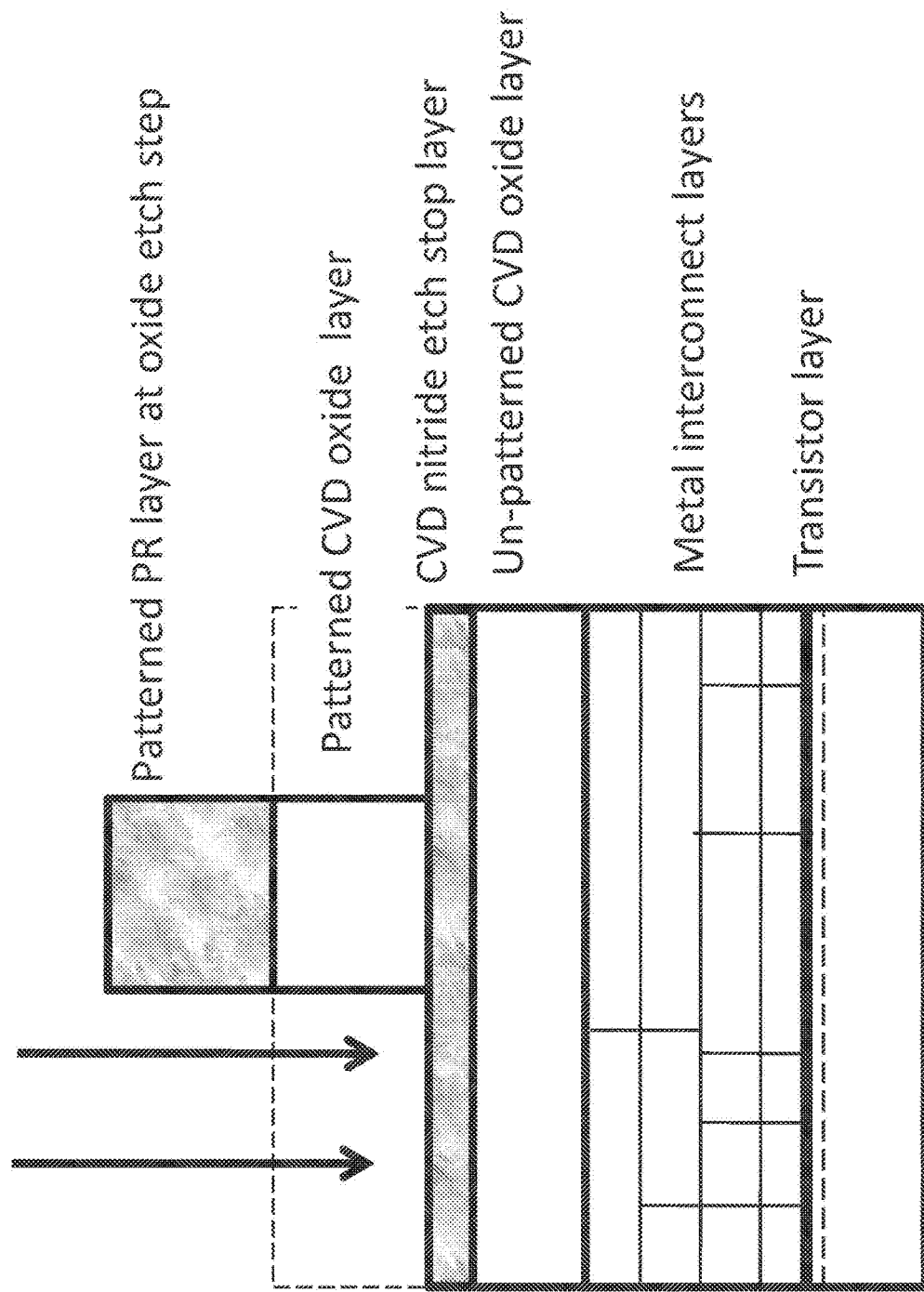

FIG. 2B is a simplified view of upper layers of the transfer device after deposition of un-patterned CVD oxide and nitride layers, deposition of a top CVD oxide and PR layers. After lithographic exposure and development of the PR pattern, exposed top CVD layer material is etched off. The nitride layer protects to the lower CVD layer from etch removal. The PR layer is removed prior to proton implant.

The use of CVD dielectric layers to form the top absorber layers may offer the manufacturing benefit of avoiding the process complications that accompany high-energy implants through polymer PR films, such as out-gassing of Hydrogen and other volatile materials due to the bond-breaking in the PR materials by collisions with the passing proton beam.

The local control of the proton implant profile into the device and substrate layer through the use of patterned and un-patterned CVD top layers can be used to compensate for local variations pattern density and total layer thickness in metal interconnect networks both across complex chip die and for processing diverse chip designs on in-process, large-area wafers. This capability for local control on the proton profile depth and location of the cleave surface at separation enables the use of a constant energy proton beam for processing of diverse device types, improving in-line wafer manufacturing efficiency.

Figure 3:
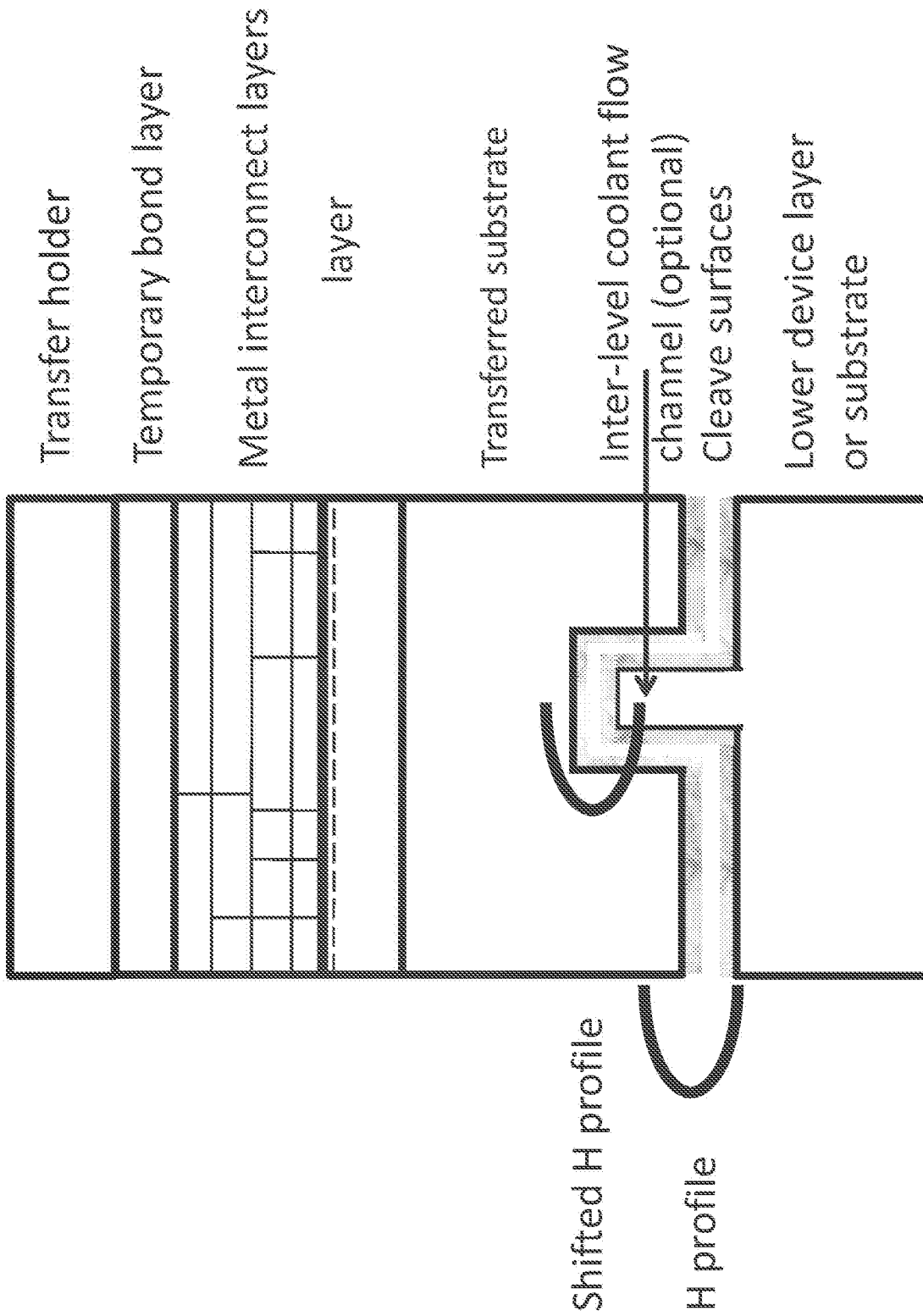
FIG. 3 is a schematic view of the transferred device layer viewed at the point of non-uniform surface cleaving after proton implants through patterned dual-layer photoresist (PR) layers, viewed after removal of the PR layers and attachment of a temporary-bonded transfer holder in an example.

FIG. 3 is a schematic view of the transferred device layer viewed at the point of non-uniform surface cleaving after proton implants through patterned dual-layer PR layers, viewed after removal of the PR layers and attachment of a temporary-bonded transfer holder. Following the non-uniform surface splitting, the damaged material surrounding the cleave planes, containing H-filled platelets and adjacent lattice damage regions, is removed and additional bottom layer material is removed leaving the desired depth of substrate material containing the IC device transistor and depletion regions.

In addition, the non-planar splitting surface is then treated with deposited oxide films to form passivated surface walls for coolant channels as well as formation of efficient bonding surfaces for attachment to adjacent device layers. The lower region of the transferred device layer is also processed to form inter-layer metal connection paths between the device layers, described in later figures and discussions.

FIGS. 4 through 9 illustrate the 3D stacking process for a generic set of IC layers using a uniform top PR layer, with no provisions for incorporated coolant channels, for simplicity. Further details of these drawings can be found throughout the present specification and more particularly below.

Figure 4:
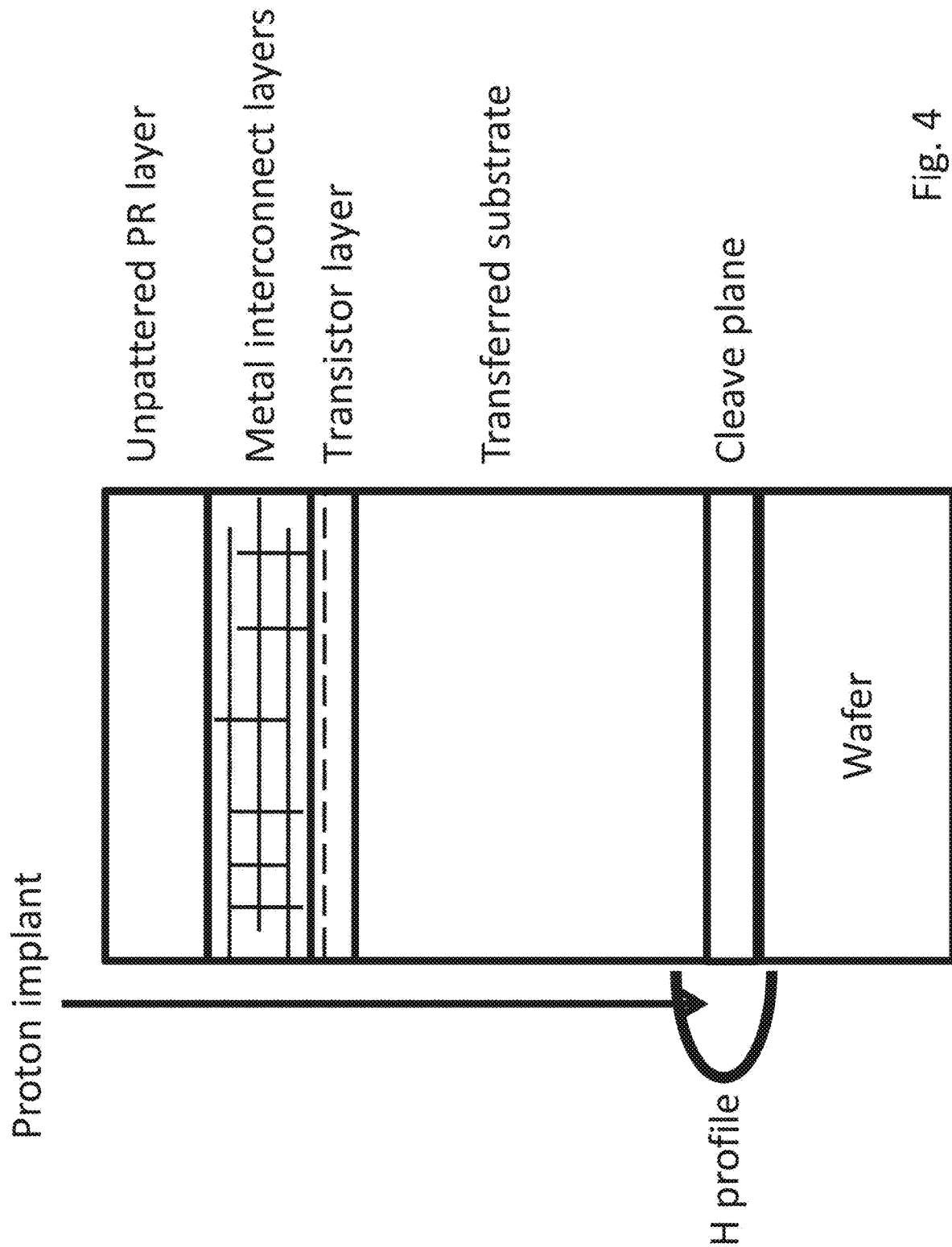
FIG. 4 sketches a to-be-transferred IC device at the point of the high-dose proton implant with a uniform PR layer in place over the device metal interconnect layers in an example.

FIG. 4 sketches a to-be-transferred IC device at the point of the high-dose proton implant, with a uniform PR layer in place over the device metal interconnect layers. The metal interconnect layers are typically a densely patterned, multi-layer structure, comprising 10 to 15 layers of Cu metal, for advanced logic devices, less for memory devices. The Cu metal layers and vias are electrically isolated by interleaved layers of low-dielectric constant insulating materials. The net Cu layer thickness is typically 3 microns or less in modern practice, without the 5 to 8 micron thick metal layers used for accurate distribution of device synchronization, or "clock", signals, power and ground. Provisions for additional of thick metal interconnects are offered as part of the inter-level stacking process.

The density, optical properties and thickness of PR are chosen to provide adequate protection of the underlying device layers from exposure to UV-wavelength recombination radiation from the proton accelerator beam line plasma and to adjust the depth of the proton peak and cleave plane below the transistor doping and depletion layers.

Figure 5:
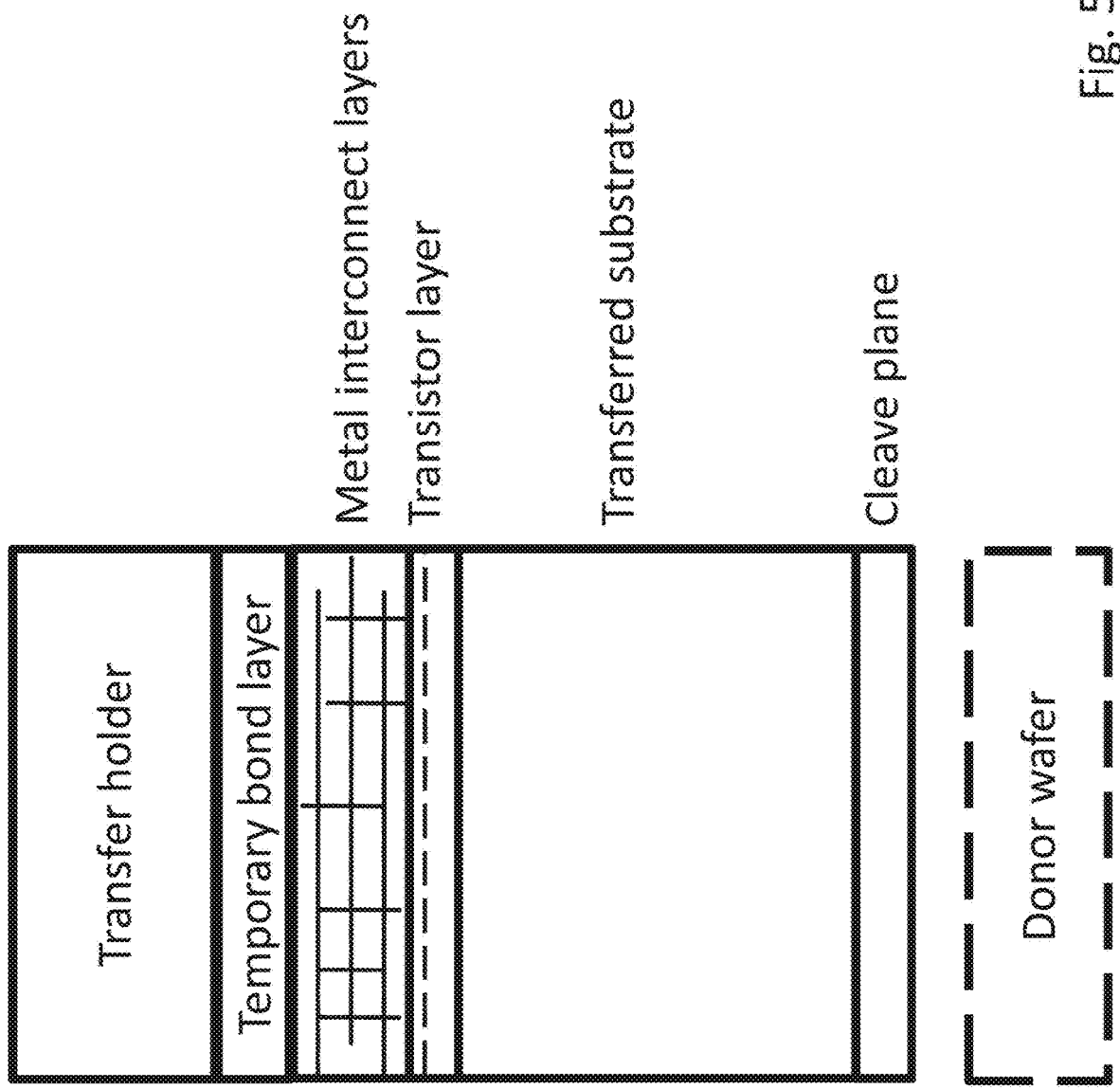
FIG. 5 is a simplified view of the transfer device layer after the proton implant, removal of the PR layer attachment of the temporary bonded transfer holder and completion of the wafer level cleaving process in an example.

A view of the transfer device layer after the proton implant, removal of the PR layer attachment of the temporary bonded transfer holder and completion of the wafer level cleaving process is shown in FIG. 5. The cleaving action can be effected by local application of energy in the form of mechanical, chemical, laser or other thermal exposure or global energy or any combination thereof. Cleaving can occur using any of the techniques disclosed in the '563 Patent, which had been incorporated by reference, a blister technique, or others.

Figure 6:
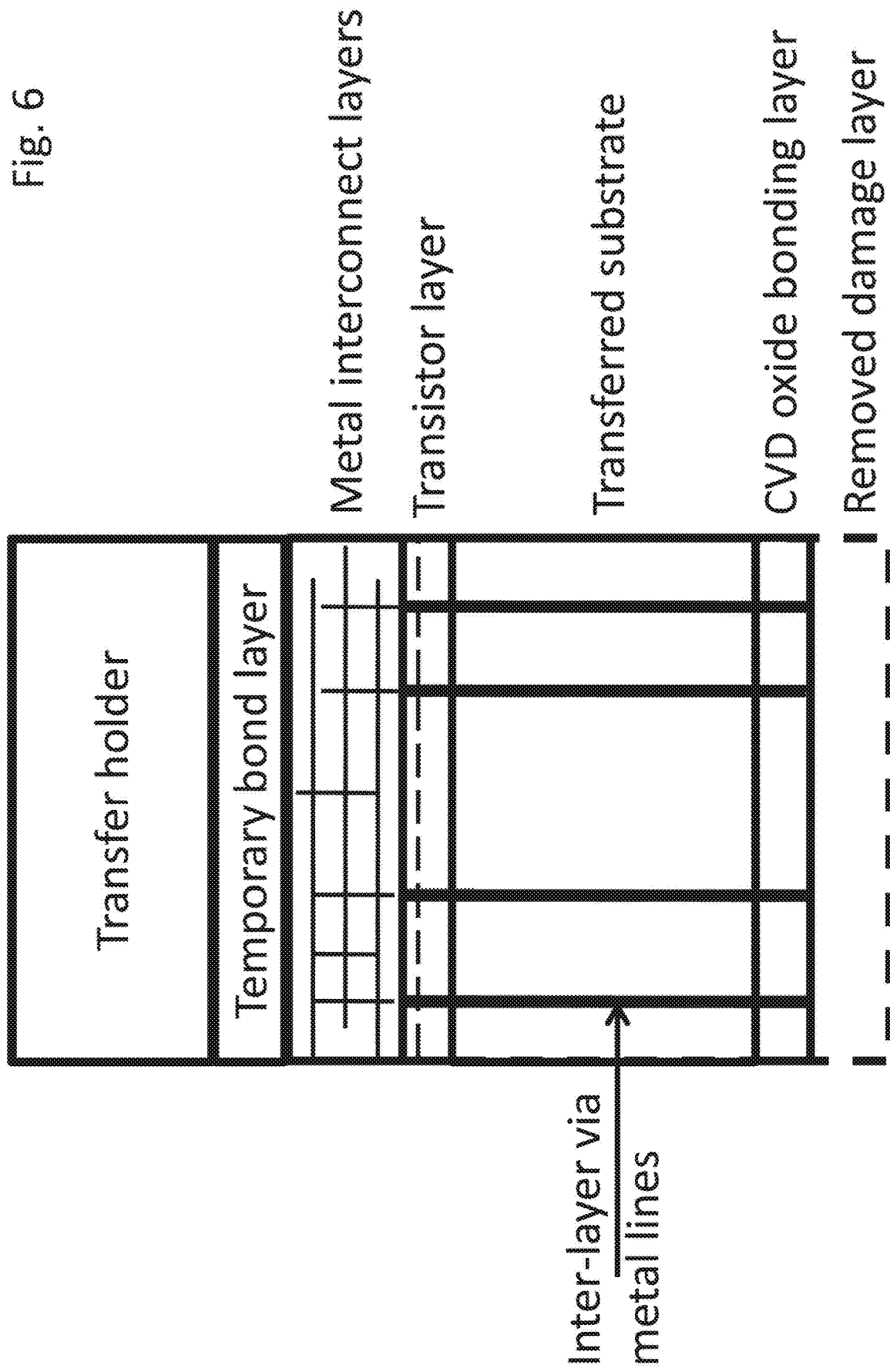
FIG. 6 shows the major steps applied to the bottom region of the transferred device layer comprising the formation of an oxide layer suitable for bonding after removal of the implant damage layer and final adjustment of the device layer substrate layer thickness and formation of the dense array of inter-layer metal connections and bonding pads in an example.

FIG. 6 shows the major steps applied to the bottom region of the transferred device layer which include removal of proton-damaged material in the immediate vicinity of the cleave plane as well as any additional material in order to obtain the desired transfer substrate thickness, formation by chemical vapor deposition (CVD) of a planar bonding interface and formation of inter-level metal lines connecting the transferred device metal interconnect network with lower bonding pads at the plane of the deposited bonding oxide interface. Inter-layer via formation is shown.

Figure 7:
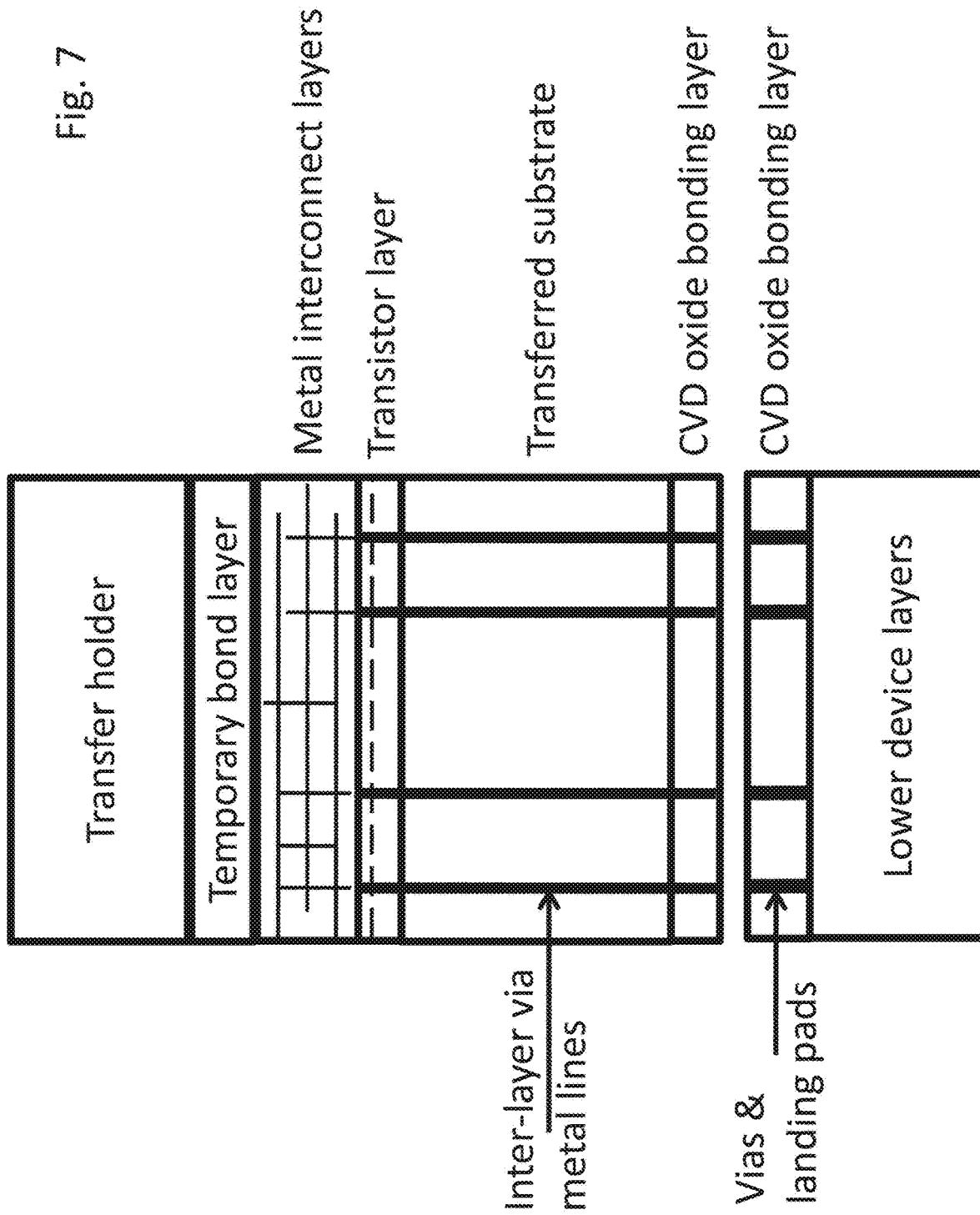
FIG. 7 shows the cleaved and prepared transferred device layer at the point of precision alignment with mating inter-connect structures on the upper surface of a lower device layer in the developing 3D device stack in an example.

FIG. 7 shows the cleaved and prepared transferred device layer at the point of precision alignment with mating interconnect structures on the upper surface of a lower device layer in the developing 3D device stack. An embodiment exploits the capabilities of advanced alignment and bonding apparatus with wafer level alignment tolerances in the range of 150 nm for 300 mm wafers. Vias and via landing pads are shown.

Figure 8:
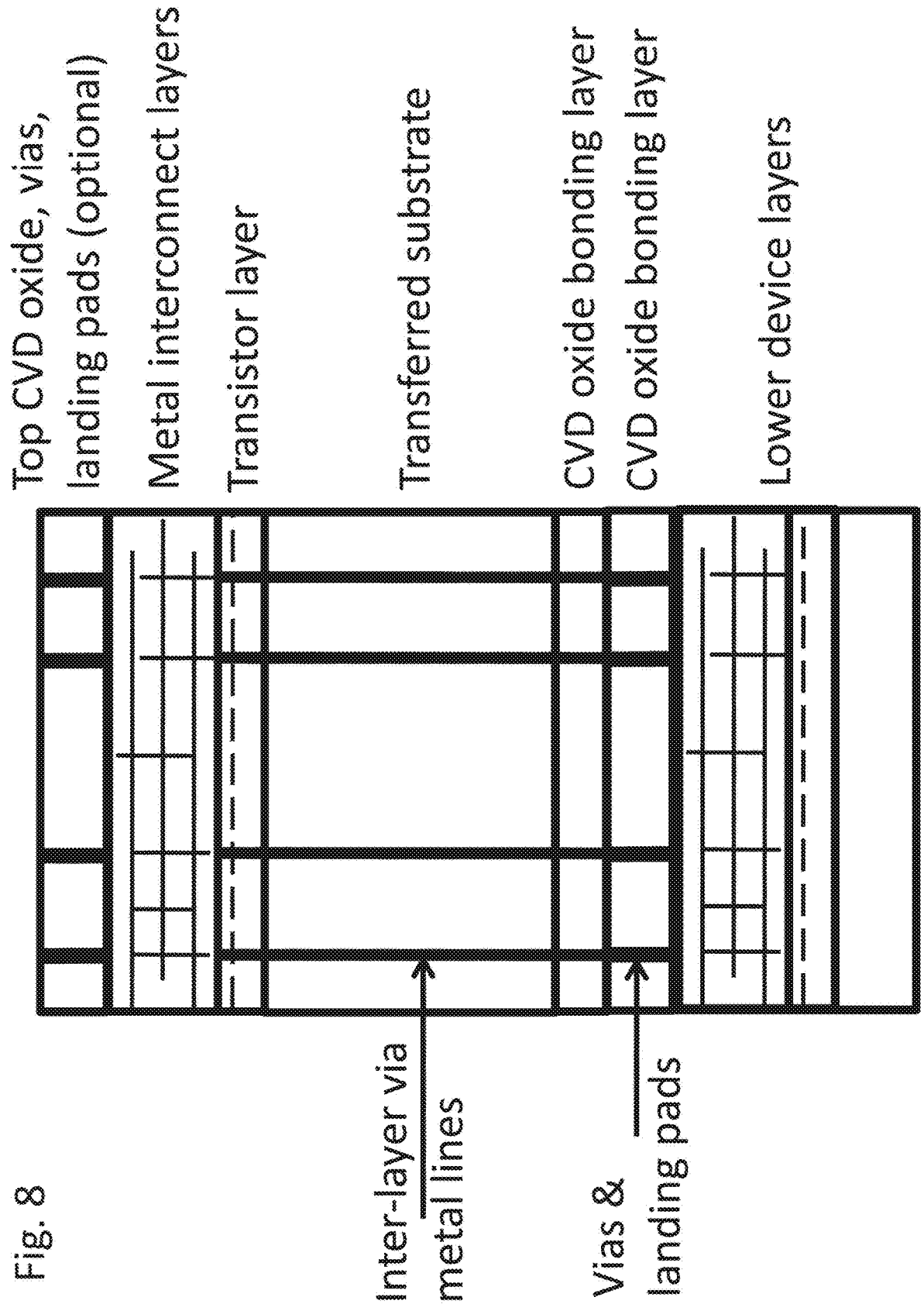
FIG. 8 shows a completed intimate 3D stack of a transferred IC device bonded to a lower device layer, with aligned inter-level metal lines in place and bonded at landing pads along the oxide layer bond interface in an example.

FIG. 8 shows a completed intimate 3D stack of a transferred IC device bonded to a lower device layer, with aligned inter-level metal lines in place and bonded at landing pads along the oxide layer bond interface. Also shown in FIG. 8 is a top deposited oxide layer with metal vias and landing pads at the bond interface level for subsequent stacking of an additional device layer on top of the present transferred device layer.

Figure 9:
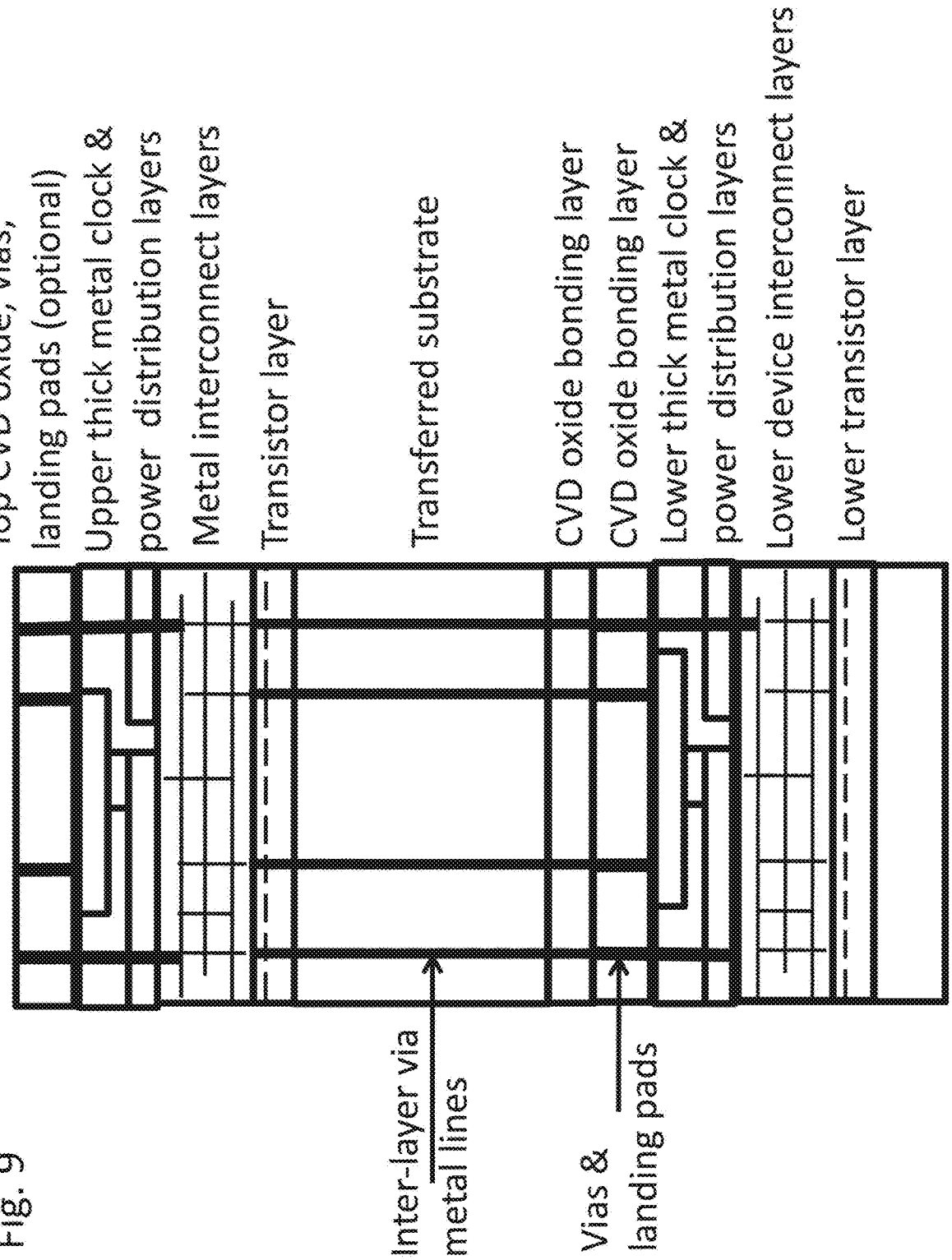
FIG. 9 shows a schematic example of two device layers stacked with thick metal interconnect layers in an example.

For 3D stacking of large-area, high performance logic IC devices, accurate delivery of power, clock and signal pulses require low-resistance paths provided by several micron thick metal lines. These metal layers are too thick to be implanted through with modest (1 or 2 MeV) energy proton beams but can be provided for, where needed, as part of the inter-level processing post implant and cleaving and before the stacking of subsequent device layers. FIG. 9 shows a schematic example of two device layers stacked with thick metal interconnect layers, the power device with the completed metal layers in place if it is the bottom device layer and the upper transferred device with the thick metal interconnects added after device transfer and permanent bonding and before the deposition of bonding oxide and formation of inter-level metal lines and bond landing pads. The dual device stack has incorporated thick metal clock & power distribution layers.

The discussion here is in terms of a stack of generic CMOS devices. A useful example is a stack of extended memory elements connected to a data transfer layer for high-bandwidth signal processing and computation, such as memory stacks presently formed with the use of interposer layers and metal connection lines, known as Through-Silicon vias (TSVs), with length of the order of 30 to 50 microns, over 10 times longer than the inter-level connections envisioned in an embodiment.

The utility of embodiments can be exploited to provide fabrication methods for intimate 3-D stacks of diverse electrical and electro-mechanical devices incorporating heterogeneous device layers for sensing of visual images, chemical environments and diverse physical conditions combined with stacked integrated circuits to provide signal processing, memory and data transmission in an integrated and robust 3-D device.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to an embodiment. The multi-layered substrate includes a silicon-on-insulator substrate, a variety of sandwiched layers on a semiconductor substrate, and numerous other types of substrates. One of ordinary skill in the art would easily recognize a variety of alternatives, modifications, and variations.

1B. A method for fabricating an integrated circuit, the method comprising:

providing a semiconductor substrate comprising a surface region, a plurality of transistor devices formed overlying the surface region, an interlayer interconnect region comprising a structured metal layer and a structured dielectric layer and an inter-layer connection overlying the plurality of transistor devices, and a dielectric material overlying the interconnection region to provide a bonding interface;

forming an unpatterned photoresist material overlying the bonding interface provided from the dielectric material, the unpatterned photoresist material is configured to shield one or more of the plurality of transistors from electromagnetic radiation in a wavelength range of below 400 nm and to selectively adjust a depth of a subsequent implanting process;

subjecting the unpatterned photoresist material to the implantation process to introduce a plurality of hydrogen particles through the unpatterned photoresist material to a selected depth to a cleave region underlying the surface region of the semiconductor substrate to define a transfer device between the cleave region and a surface of the dielectric material to form a thickness of a multi-layer of a plurality of interconnected conductive metal layers and insulating dielectric having a total metal thickness of 3 to 5 microns or less;

removing the unpatterned photoresist material after the hydrogen implant step;

bonding the surface of the dielectric material overlying the transfer device to a transfer substrate to temporarily bond the semiconductor substrate to the transfer substrate;

subjecting sufficient energy to a portion of the cleave region to remove an upper portion of the semiconductor substrate from a lower bulk substrate material, while using the transfer substrate to hold the upper portion of the semiconductor substrate such that the upper portion comprises a hydrogen damaged region;

subjecting the hydrogen damaged region overlying the transfer device to a smoothing process to remove a portion or all of the portion or all of the hydrogen damaged region and to form a backside surface; and forming a thickness of dielectric material overlying the backside surface.

2B. The method of clause 1B wherein the backside surface is configured with one or more provisions for formation of an inter-layer conductive path to linking to a bottom landing pad in the structured metal layer of the transfer device and a landing pad for a bonded conductive path to an adjacent device layers.

3B. The method of clause 2B further comprising depositing a dielectric layer to form a suitable bonding interface on the structured metal layer, the structured metal layer comprising a 5 to 10 microns thick conducting layer formed over a densely patterned metal interconnect multi-layers for provision of a device power signal, a ground signal and a frequency synchronization signal, and the dielectric layer having a plurality of conductive paths through the dielectric layer for bonding with inter-layer conductors in an upper, transfer device layer.

4B. The method of clause 3B further comprising aligning of the transfer device layer to the semiconductor substrate to permanently bond the inter-layer conducting path.

5B. The method of clause 4B further comprising removing the temporary bonded semiconductor substrate from the transfer device.

6B. The method of clause 5B further comprising forming an internal flow path to allow coolant to traverse there through to cool the transfer device.

7B. The method of clause 1B wherein the plurality of transistor devices are selected from at least one of CMOS devices, bipolar transistors, logic devices, memory devices, digital signal processing devices, analog devices, light absorbing and imaging devices, photo-voltaic cells or micro-electrical mechanical structures (MEMS), or any combination thereof.

8B. The method of clause 1B wherein implantation process ranges from 500 kilovolts to 2 MeV.

9B. The method of clause 1B wherein the cleave region is positioned 1 to 10 microns from a top surface of the dielectric material.

10B. The method of clause 1B wherein the unpatterned photoresist material is selected with high absorptivity of electromagnetic radiation with a wavelength less than 400 nm.

11B. The method of clause 1B wherein the semiconductor substrate comprises a silicon or other suitable material for formation of electrical, optical or electromechanical devices.

12B. The method of clause 1B wherein the implantation process is provided at a dose ranging from 5E16 to 5E17 particles/centimeter$^2$.

13B. The method of clause 1B wherein the implantation process is provided using a beamline implanter.

14B. The method of clause 1B wherein the implantation process is provided by a linear accelerator (LINAC) process.

15B. The method of clause 1B wherein the cleave region having a peak concentration at an edge of an implantation range.

16B. The method of clause 1B wherein the cleave region comprises a plurality of hydrogen gas-filled micro-platelets.

17B. The method of clause 1B wherein the cleave region is characterized by a stress sufficient to induce propagation of an approximately planar cleave region.

18B. The method of clause 1B further comprising forming a plurality of interconnect structures between the backside surface and either the plurality of transistors or the interconnect region.

19B. The method of clause 1B further comprising providing a second semiconductor substrate comprising a plurality of second transistor devices and an overlying second dielectric material; and bonding the second dielectric material configured with the second semiconductor substrate to form a stacked semiconductor structure.

20B. The method of clause 1B further comprising forming a patterned photoresist material overlying the unpatterned photoresist material.

21B. The method of clause 1B wherein the cleave region is configured as a uniform implantation region or a patterned implantation region.

22B. The method of clause 1B wherein the plurality of transistor devices and the interconnect region are characterized by a thickness of three microns and less; wherein the implantation process is characterized by a range of five microns to ten microns such that a characteristic size of the plurality of transistor devices and the interconnect region does not influence the implantation process.

23B. The method of clause 1B wherein the plurality of transistor devices and the interconnect region are characterized by a thickness of three microns and less; wherein the implantation process is characterized by a range of five microns to ten microns such that a characteristic spatial dimension of the range of the implantation is not interfered by the thickness of the plurality of transistor devices and the interconnect region.

24B. The method of clause 1B wherein energy is selected from thermal, mechanical, chemical, electrical, or combinations thereof to provide a cleave inducing energy.

25B. The method of clause 1B wherein the energy is provided to cause a controlled cleaving action including an initiation of cleaving and propagation of cleaving.

26B. The method of clause 1B wherein the energy is provided to form a plurality of micro-platelet bubbles in the cleave region.

27B. The method of clause 1B wherein the plurality of transistor devices is provided for a memory array or a logic array.

28B. The method of clause 1B wherein the cleave region is patterned or graded to facilitate a controlled cleaving action.

29B. A method for fabricating an integrated circuit, the method comprising:

providing a semiconductor substrate comprising a surface region, a plurality of transistor devices formed overlying the surface region, an interlayer interconnect region comprising a structured metal layer and a structured dielectric layer and an inter-layer connection overlying the plurality of transistor devices, and a dielectric material overlying the interconnection region to provide a bonding interface;

forming an absorber material overlying the bonding interface provided from the dielectric material, the absorber material configured to shield one or more of the plurality of transistors from electromagnetic radiation in a wavelength range of below 400 nm and to selectively adjust a depth of a subsequent implanting process;

subjecting the absorber material to the implantation process to introduce a plurality of hydrogen particles through the absorber material to a selected depth to a cleave region underlying the surface region of the semiconductor substrate to define a transfer device between the cleave region and a surface of the dielectric material to form a thickness of a multi-layer of a plurality of interconnected conductive metal layers and insulating dielectric having a total metal thickness of 3 to 5 microns or less;

removing the absorber material after the hydrogen implant step;

bonding the surface of the dielectric material overlying the transfer device to a transfer substrate to temporarily bond the semiconductor substrate to the transfer substrate;

subjecting sufficient energy to a portion of the cleave region to remove an upper portion of the semiconductor substrate from a lower bulk substrate material, while using the transfer substrate to hold the upper portion of the semiconductor substrate such that the upper portion comprises a hydrogen damaged region;

subjecting the hydrogen damaged region overlying the transfer device to a smoothing process to remove a portion or all of the portion or all of the hydrogen damaged region and to form a backside surface; and forming a thickness of dielectric material overlying the backside surface.

30B. The method of clause 29B wherein the absorber material comprises photoresist.

31B. The method of clause 29B wherein the absorber material comprises oxide.

32B. The method of clause 31B wherein the oxide comprises CVD silicon oxide.

33B. The method of clause 29B wherein the absorber material comprises a patterned layer over an unpatterned layer.

34B. The method of clause 33B wherein a thickness of the unpatterned layer shifts a peak of the proton profile to be at a depth of the desired location of a cleave surface, and a thickness of the patterned layer shifts the peak to a height of a coolant channels to be formed.

35B. The method of clause 29B wherein the absorber material comprises nitride.

Generally, high-performance logic devices generate heat in regions of high switching activity in the logic core. These sources of switching heating are well known design concerns in complex system on a chip (SOC) and central processing unit (CPU) devices. The retention of data in memory devices is generally degraded with increasing temperature, so the integrated stacking of logic and memory layers is challenged by these thermal concerns. Thermal controls become more important as the density and diversity of the 3D device stack increases.

While beneficial for thermal bonding efficiency, use of oxide layers in the bonding stack may be limited as a heat transfer layer by the relatively low thermal conductivity of $SiO_2$. The use of higher thermal conductivity, electrically insulating materials as inter-layer structures can increase the heat transfer from local device thermal source regions.

Accordingly, in certain embodiments it may be desirable to add structured high-thermal conductivity layers between heat generating device layers, in order to facilitate thermal spreading and removal of heat from the device stack. Specifically, using high-energy proton implantation, low-thermal budget layer cleaving and transfer bonding, may facilitate heat spreading from local device structure "hot spots" and efficiently remove device thermal energy through the use of local coolant flows.

Proton cleaving and layer transfer methods, combined with the patterned cleave regions formed by use of a patterned top layer of photo-resist (or oxide as discussed below) at the proton implant step, bonded to a planar device surface to form inter-layer channels for stack coolant flows, and the use of inter-layer structures with high-thermal conductivity (and low electrical conductivity), provide flexible design elements for controlling the thermal environment in a complex 3D device stack.

Comparing the thermal conductivity of a variety of common semiconductor materials indicates a variety of materials with substantially higher thermal conductivity than $SiO_2$, with SiC and $Al_2O_3$ (sapphire) comprising candidates for this purpose. Other high thermal conductivity materials may also be used for the purpose enhancing heat spreading and transport by factors of ≈10 to ≈100, compared to equivalent $SiO_2$ layers.

The following Table 1 lists thermal conductivity (in W/m-K) of several common semiconductor and insulator films:

Si: 130 (W/m-K)
$SiO_2$: 1.3 (W/m-K)
SiC: 120 (W/m-K)
Ge: 58 (W/m-K)
GaAs: 52 (W/m-K)
$Al_2O_3$: 30 (W/m-K)

Inter-layer thermal spreading layer thickness of ≈0.5 to 2 um, may be expected for efficient heat flows.

Figure 16:
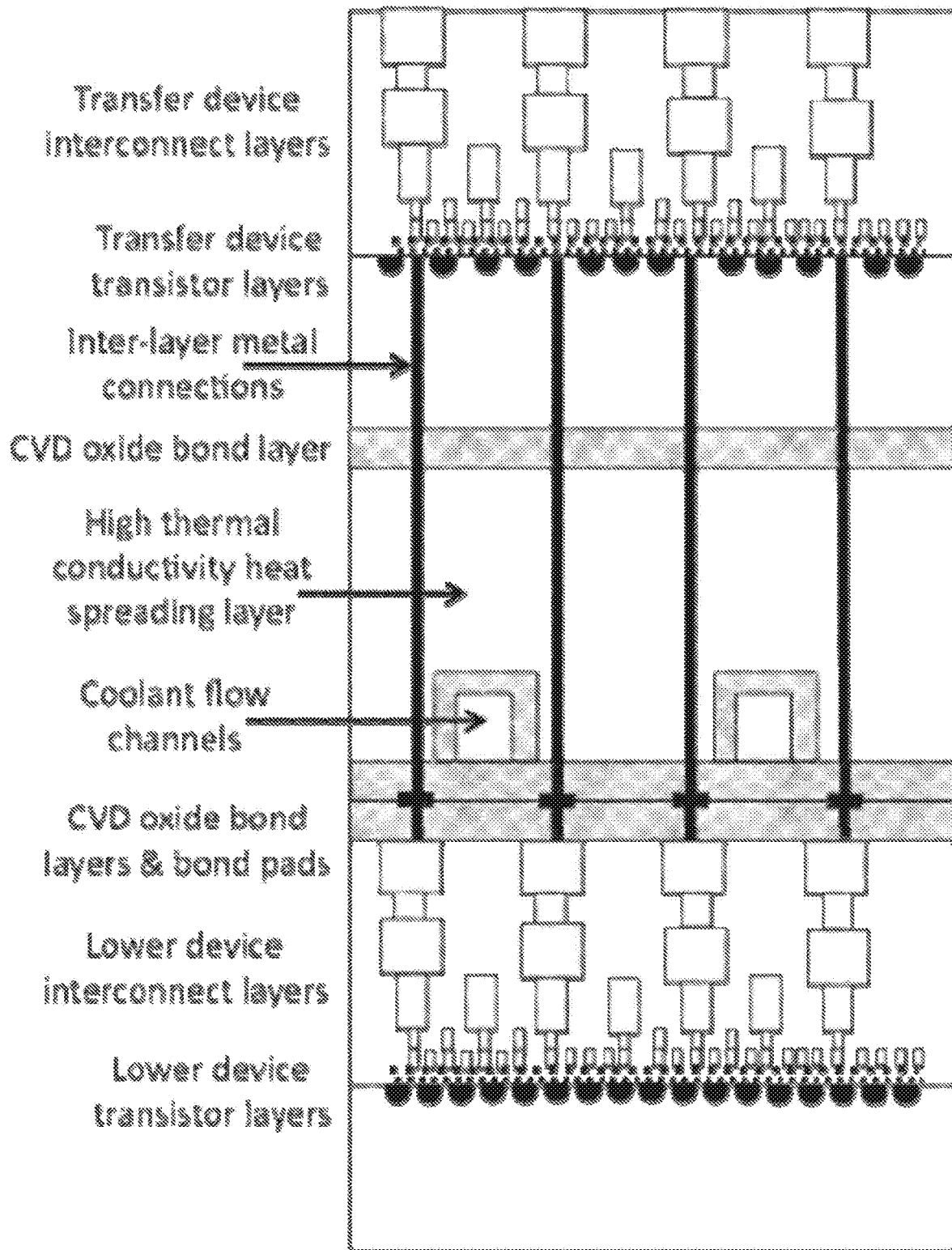
FIG. 16 is a simplified cross-sectional view showing a patterned high-K layer in place, incorporating coolant channels.

FIG. 16 shows a simplified cross-sectional view including a high-K layer in place, incorporating coolant channels.

1C. An apparatus comprising:
a first integrated circuit including a first metal interconnect layer;
a second integrated circuit including a second metal interconnect layer; and
an inter-layer structure including a high-thermal conductivity, low electrical conductivity material and bonded to the first metal interconnect layer by a CVD oxide bond layer.

2C. An apparatus of clause 1C wherein the inter layer structure further comprises inter-layer channels for stack coolant flows.

3C. An apparatus of clause 1C wherein the high-thermal conductivity material exhibits a thermal conductivity greater than 1.3 (W/m-K).

4C. An apparatus of clause 1C wherein the first integrated circuit is formed by proton implant into the first metal interconnect layer followed by cleaving.

Integrated circuit devices, containing diverse layers of semiconductor, dielectric and metal materials, may develop substantial internal stresses during fabrication. Unaddressed, these stresses may be sufficiently high to warp full thickness Si wafers, with thickness greater than 700 micrometers, into a variety of concave, convex, and complex "potato chip" shapes. These deformations may be sufficiently large to create issues in fine-line lithography optics during device fabrication.

If a stress-containing device layer on a detached thin (e.g., several micrometers) substrate were placed in an unsupported fashion on a planar surface, the stress-induced deformation of a wafer-scale combination could pose a challenge for bonding to a planar substrate surface. Because of these effects, thin device layers may be attached to stiff bonding structures, capable of maintaining a planar bond interface with the stressed layer attached, before they are detached from their initial substrate wafers.

Figure 17A:
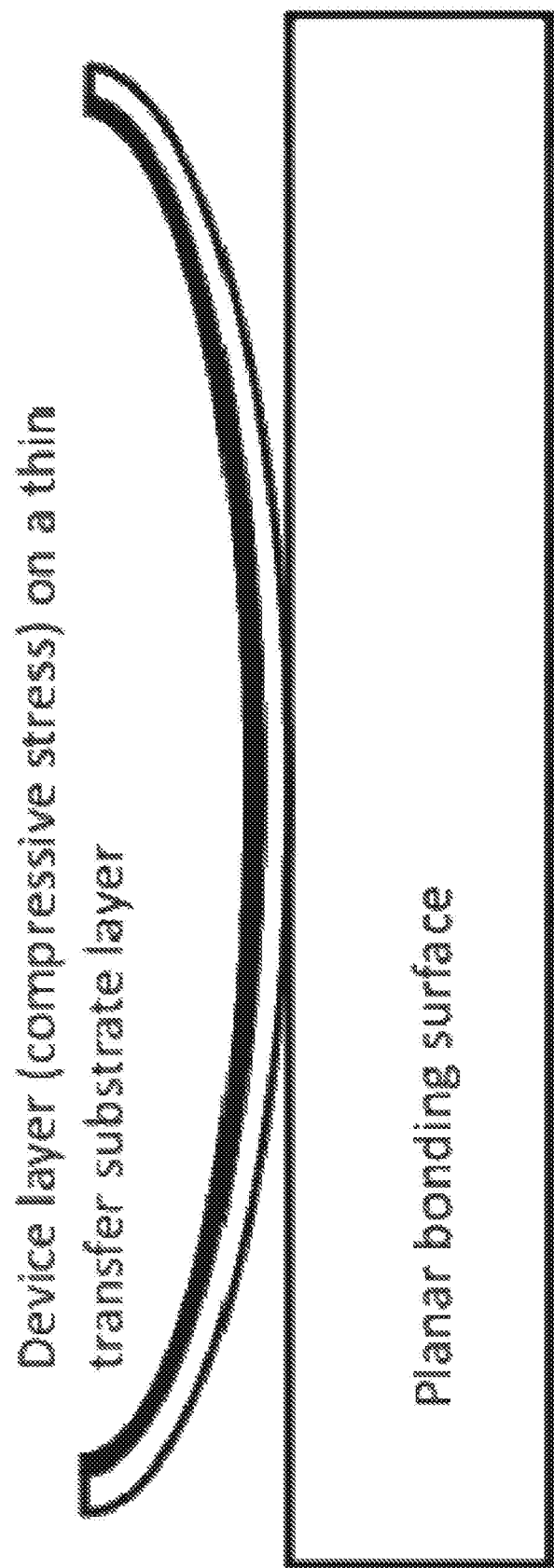
FIG. 17A is a simplified cross-sectional view showing an example of a detached, unsupported, device layer, under net compressive stress after its fabrication, on a thin substrate layer, deforming its thin substrate layer into a concave shape.

FIG. 17A shows a simplified view of an example of a detached, unsupported, device layer, under net compressive stress after its fabrication, on a thin substrate layer, deforming its thin substrate layer into a concave shape. Actual device layer deformations can be in concave, convex, and complex "potato chip" shapes. These deformations can lead to challenges when bonding to a planar surface as well as to bond failures and device degradation due to excess local stresses during subsequent thermal cycles during additional fabrication steps and during device operation.

Even with the use of a stiff temporary bond holder to form a stress-containing layer into a planar form suitable for bonding, un-compensated stresses in a complex bonded stack can lead to bond failures and IC device degradation from thermal stress during subsequent fabrication steps and during device operation.

Accordingly, embodiments may provide for the addition of stress-compensating layer(s) to the back side of stressed device thin transfer layers to facilitate a bonding process, including improved inter-layer device and bond pad alignment, and to compensate for deleterious effects of subsequent fabrication and device operation thermal cycles. U.S. Pat. No. 7,772,088 is hereby incorporated by reference for all purposes.

Figure 17B:
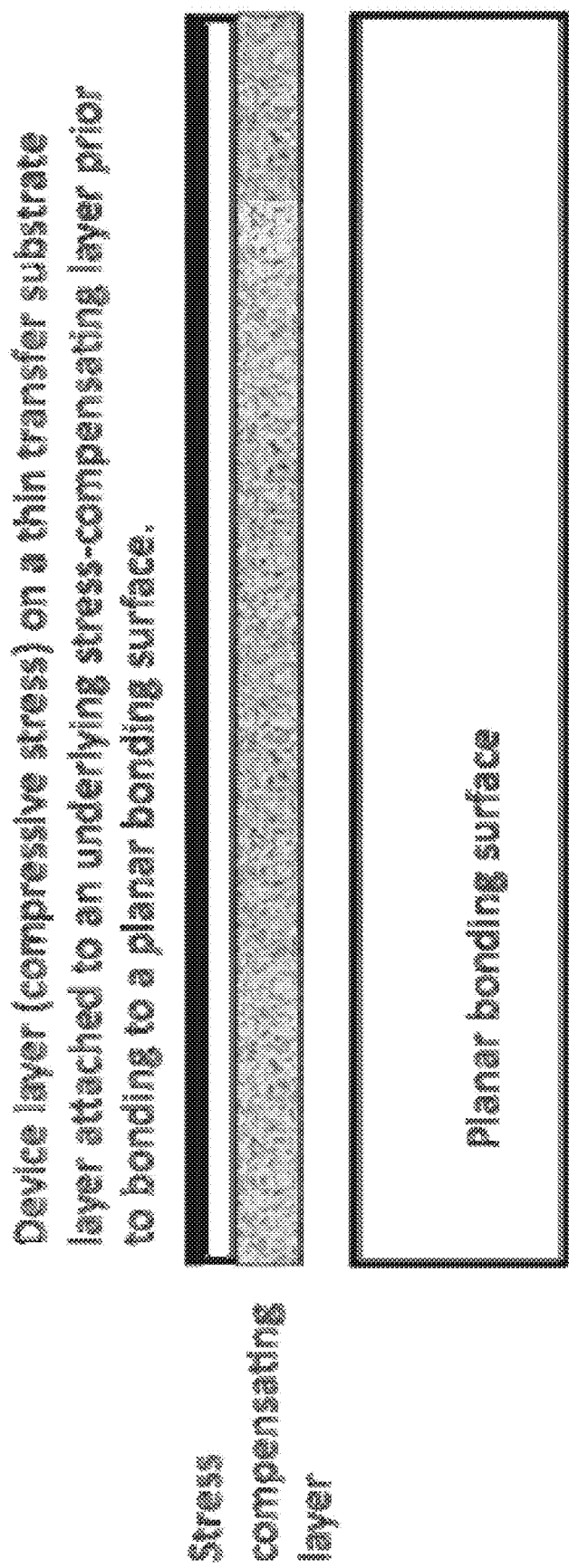
FIG. 17B is a simplified cross-sectional view of the effect of the addition of a stress-compensating layer to the backside of a thin substrate containing a stressed device layer on the top side.

The backside stress compensation materials can be chosen of materials with complementary thermal expansion properties to the device layer and with thickness sufficient to offset the distortion effect of the device structure internal stress FIG. 17B is a simplified cross-sectional view showing the effect of the addition of a stress-compensating layer to the backside of a thin substrate containing a stressed device layer on the top side. The role of the stress-compensating backside layers is to (1) facilitate bonding to a planar bond surface, (2) improve bond pad alignment accuracy during wafer-level bonding, and/or (3) counteract the effects of differential thermal stress during subsequent fabrication steps and during device stack operation.

The stress compensating layers can be formed by direct layer transfer to the transfer device layer backside while the transfer device layer is attached to temporary bonding structure. In some cases, a stress compensating layer can be deposited by CVD or other approaches.

Note that the planar, stress compensated, transfer layer can provide a desirable geometry for achieving a high degree of bond pad alignment during wafer level bonding, which is one consideration for successful wafer-level bonding for 3DIC manufacturing.

Embodiments may employ single crystal layer transfer onto chemical or mechanically "weak" separation layers. In particular, it may be desirable to allow attaching a high-purity, single crystalline material layer onto a temporary holding layer that is sufficiently robust to survive the thermal, chemical and mechanical stresses of IC or other device fabrication processes, but is "weak" enough to form a separation path under directed chemical or mechanical action.

Examples of these weak temporary separation layers can include but are not limited to (1) oxide layers formed by thermal growth, CVD deposition or by direct implantation and subsequent thermal processing, that can form a separation path under an overlying layer by chemical action of a selective etchant, such as HF attack on an underlying $SiO_2$ layer, and (2) various forms of polycrystalline or porous forms of the general substrate material that are susceptible to form a separation path under selected chemical or mechanical attack. Forms of directed mechanical attack can include but are not limited to, (1) stress-assisted crack formation initiated by a laterally directed force on a separating wedge-shaped tool, and (2) kinetic attack by laterally directed fluid jets into a mechanically weak layer, such as a porous substrate material region.

Some forms of chemically or mechanically weak separation layers may lack the high-level crystalline interface required for epitaxial growth of high-purity and high-quality crystalline upper layers useful for fabrication of high performance semiconductor devices.

Employing high-energy proton implants to form Hydrogen-rich layers for mechanical, room-temperature separation along well-defined cleave surfaces, embodiments can be used to separate and bond entire device structures, including a fully-formed transistor layers and multi-level metal interconnect networks onto suitably chosen temporary separation layers for later fabrication and device integration processing. This may be followed by subsequent separation from the carrier substrate.

The methods and apparatuses according to embodiments can also be used to separate and bond uniform, high-purity and crystalline layers to be formed into electrical, mechanical or optical devices followed by subsequent separation from the carrier substrate.

Figure 18:
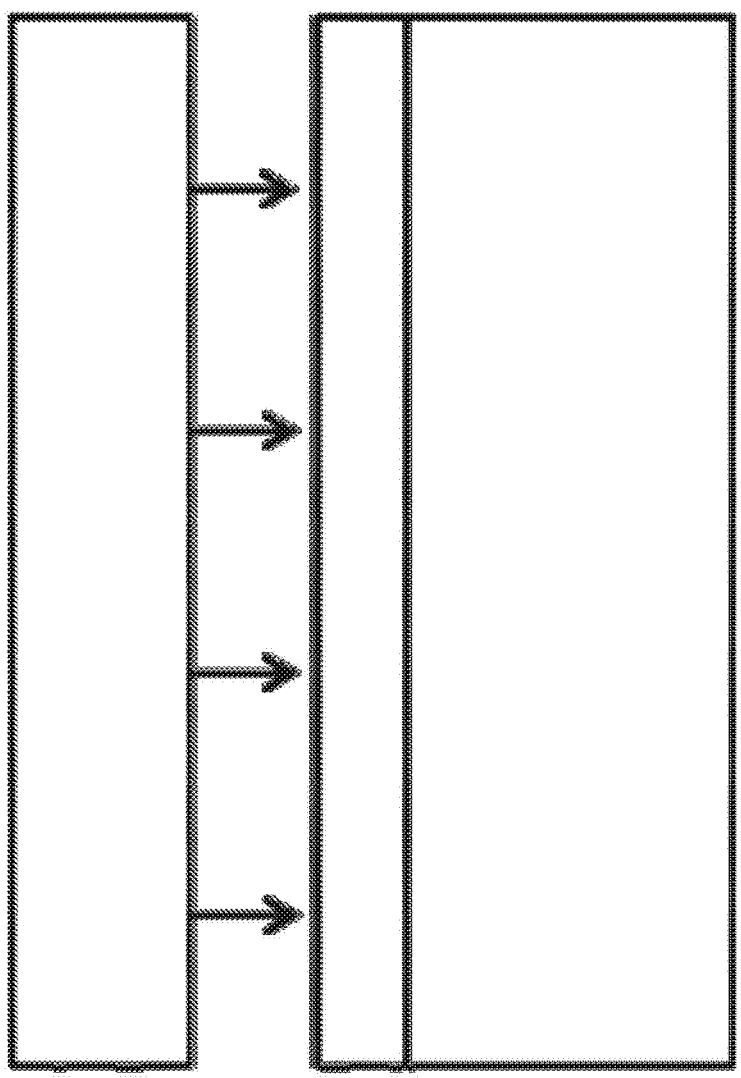
FIG. 18 is a simplified view of the bonding a high-purity, single crystalline transfer layer onto a chemically or mechanically "weak" separation layer on a substrate.

FIG. 18 is a simplified view of the bonding a high-purity, single crystalline transfer layer onto a chemically or mechanically "weak" separation layer on a substrate. The upper crystalline transfer layer is formed to the desired thickness by the use of high-energy proton implantation and room-temperature separation along the peak of the proton distribution. The upper transfer layer can be a uniform crystalline layer or including a combination of IC, mechanical or optical devices and their corresponding metal interconnect networks.

Embodiments may also provide proton implants useful for separation and layer transfer stacking of highly-sensitive CMOS device structures. As previously mentioned, embodiments utilize high-energy proton implants to form a Hydrogen-rich cleave surface several microns below the combined thickness and stopping power effects of a combination of top layers of photo-resist or CVD dielectrics, and a multi-layer metal interconnect network and transistor layers.

Radiation damage effects arising from the passage of a high-dose, high-energy proton beam through the metal interconnect and transistor layers, may be at manageable levels—recoverable by standard annealing cycles at modest temperatures. Moreover, where specific radiation damage effects are of particular concern, embodiments can include an implementation that bypasses concerns for radiation damage effects in device dielectric layers.

One issue relating to possible radiation damage during high-dose, high-energy proton implants into CMOS device layers and their associated metal interconnect network layers, is bond-breaking effects in various dielectric layers. This can be due to electronic stopping events from the passage of the energetic proton beam or from UV-radiation from ion-electron relaxation following recombination event in the accelerator beam line.

When the high-dose, high-energy proton implantation is performed at specific points during the CMOS device fabrication process, radiation effects from the proton beam can be substantially avoided. One point in the CMOS process can be identified as occurring after the high temperature (e.g., greater than 500° C.) processes associated with activation of dopants in CMOS junctions are completed, and before the deposition of sensitive gate stack oxides and subsequent incorporation of inter-layer dielectrics in the metal interconnect network.

At such a point in the CMOS fabrication process, the principal material in the device wafer is crystalline silicon in doped junctions, with poly-silicon filled lateral isolation regions, and the substrate wafer. The only substantial, long-term radiation damage effects in predominantly silicon material are associated with lattice damage arising from the nuclear stopping components of the proton slowing down process.

Lattice damage events for a high-energy proton beam may be localized near the peak of the proton profile. According to embodiments, that peak may be placed several microns below the CMOS junctions in the transistor layer and provide key hydrogen-trapping sites for localization of the cleave surface during layer separation. The several micron separation between the CMOS transistor layer and its associated carrier depletion layers and the proton-induced lattice damage in the region of the subsequent layer separation, may be sufficient to avoid risk for deleterious device effects from the proton lattice damage layer.

In many advanced CMOS devices, the gate stack regions are initially defined by temporary films and structures which are "replaced", after completion of the high-temperature thermal cycles, by final device structures incorporating high-dielectric constant ("high-k") gate oxides and multi-layer metal gate electrodes. Following the "replacement gate" fabrication cycles, the material properties of the final gate and inter-metal layer ("low-k") dielectrics limit allowable thermal cycles for the final CMOS device fabrication process to be less than 500° C.

A high-dose proton implant performed at the point just before the "replacement gate" fabrication, would avoid risk of damage to the final device gate and inter-metal layer dielectrics and would not be exposed to 500° C. or higher thermal cycles, that could lead to spontaneous layer separation prior to the desired non-thermal separation process at layer separation after the fabrication of the transfer device layers is completed.

FIG. 19A shows a simplified cross-sectional view of high-energy, high dose proton implant to form a Hydrogen-rich layer placed several microns below the CMOS transistor layer. This is performed after completion of >500° C. anneals associated with dopant activation in the transistor junctions and before fabrication of "replacement gates" including final device gate dielectrics and metal gate electrodes.

Figure 19B:
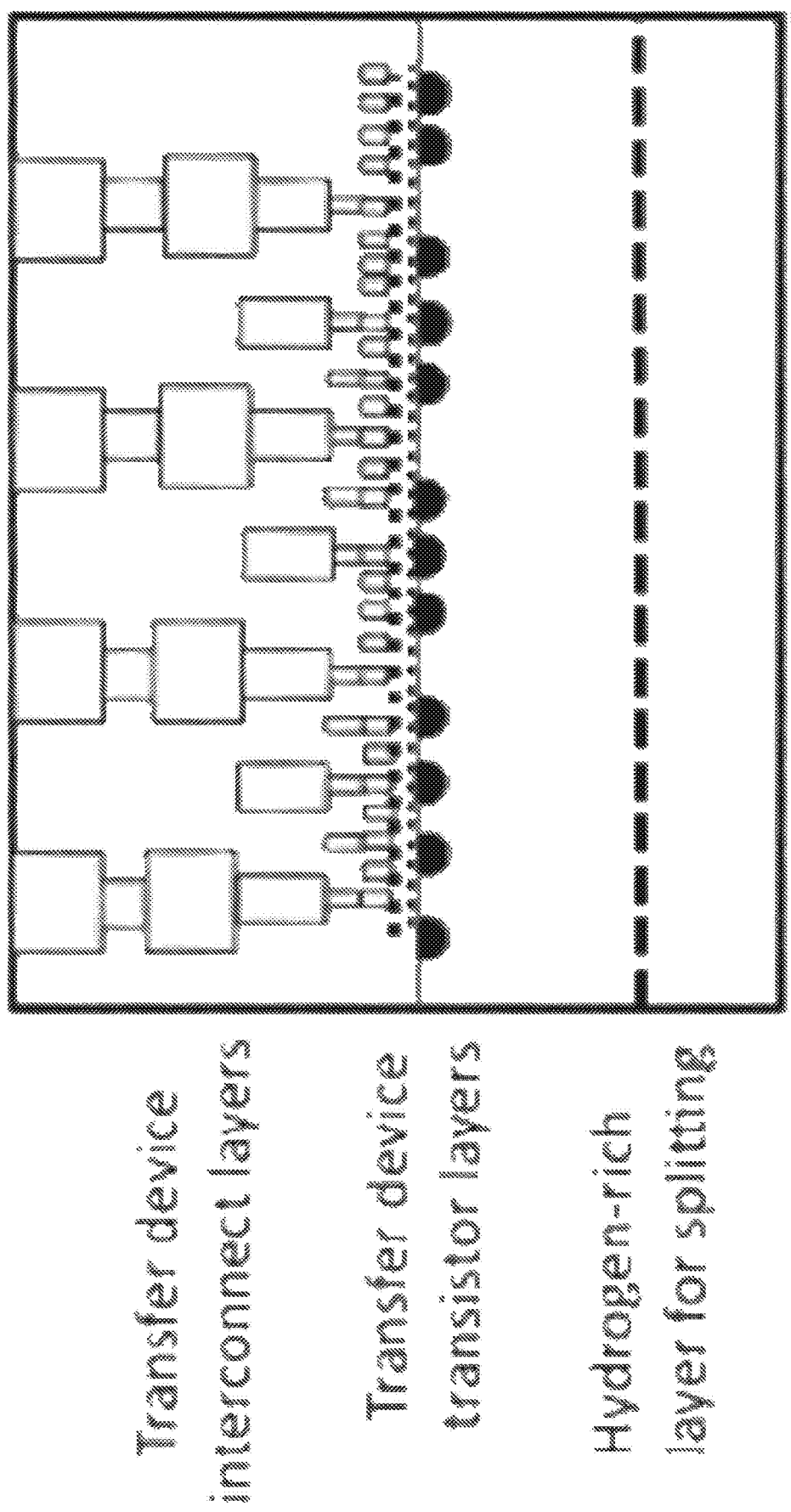
FIG. 19B is a simplified cross-sectional view of CMOS device layers after completion of the formation of final gate stack and metal interconnect structures, with a Hydrogen-rich layer formed by a high-energy, high-dose proton implant performed just prior to the "replacement gate" fabrication steps.

FIG. 19B is a simplified cross-sectional view of CMOS device layers after completion of the formation of final gate stack and metal interconnect structures, with a Hydrogen-rich layer formed by a high-energy, high-dose proton implant performed just prior to the "replacement gate" fabrication steps. The materials properties of the final gate and inter-metal layer dielectrics limit the fabrication process temperatures to be below 500° C., which also avoids conditions leading to spontaneous splitting along the Hydrogen-rich region prior to the desired separation, by non-thermal approaches, after completion of the full device structure.

Utilization of methods and apparatuses according to embodiments may permit modulation of inter-layer bandwidth by stacking order and inter-layer thickness. Specifically, a principal goal of 3DIC stacking is to provide an alternative path for increasing the bandwidth for signal processing communications between devices.

Bandwidth is the product of the data signal frequency, often approximated by the CPU clock frequency, and the number of external communication channels. For much of its history, IC development has focused on increasing the CPU and other data processing chip cycle frequencies, possibly at the cost of increasing chip power use. The number of communication channels has been limited by the density of bond pads available along the periphery of a planar device.

The development of 3DIC stacking methods has increased the possible number of vertical channels, measured by the density inter-layer communication lines. This density of inter-layer communication channels increases as vertical connection channel density increases. A convenient measure of the density of inter-layer connections is the inverse square of the communication pin separation or "pitch". Specifically, IO density=1/(pin pitch).

The minimum metal channel or "pin" pitch, depends on a variety of process and device considerations. One factor is the aspect ratio (AR) of the inter-layer metal channels: the ratio of the metal line diameter to the length of the via hole to be filled. Conventional "Through Silicon Via" (TSV) structures may typically exhibit an AR of between about 5 to 20. This is significantly higher than the typical design rules for vias in high-density metallization for IC devices—often with an AR of less than 2.

One device consideration affecting the packing density of conventional TSV structures, is the inter-device stress arising from the different thermal expansion of micrometer-scale Cu cylinders and Si device materials. The undesirable local stress in the immediate surroundings of a Cu via line can lead to design rules defining micrometer-scale "keep out" zones, where active circuit element are excluded from the vicinity of Cu via landing pads. This affects circuit density, performance, and yield.

Accordingly, methods and apparatus of specific embodiments may provide one or more procedures to locally increase the inter-level metal channel density and corresponding communication bandwidth between adjacent device layers. Use of high-energy, high-dose proton implants through a substantially completed metal interconnect network and fully formed CMOS transistor layer for formation of a Hydrogen-rich region for non-thermal layer separation and bonding onto a 3DIC stack, provides an inter-layer separation of a few micrometers (or less, for the cases of device layers on SOI buried oxides or other device types with minimal carrier depletion layer thicknesses). This allows substantially less inter-layer separation than the tens of micrometers typical of present day TSV and interposer stacking methods. The thinner inter-device Si layers and elimination interposer and associated adhesive layers provide by embodiments allows for fabrication shorter and thinner inter-device metal signal connections and greatly reduces the "dead zone" effects arising from thermal stress of present day several microns thick Cu TSV channels.

Where high inter-layer bandwidth is desired (e.g., connections from CMOS image sensor layers and signal processing devices), some embodiments may employ a variety of layer transfer techniques to align and bond the top layer of the metal interconnect network of the transfer device to inter-layer connection channels in the top layer of the metal network of the lower device layer in the 3DIC stack. Such layer transfer approaches are outlined in FIGS. 12 through 15.

With this particular procedure, the inter-layer communication channel density can be expected to be similar to the pin density in the top layer metallization layers in the two device layers, with pin pitch on the order of a few micrometers or less. This "top-to-top" layer bonding results in a factor of 100 to 1,000× higher inter-layer connection density, and corresponding increased bandwidth, than existing 2.5D and 3D chip stacking technologies.

Figure 20:
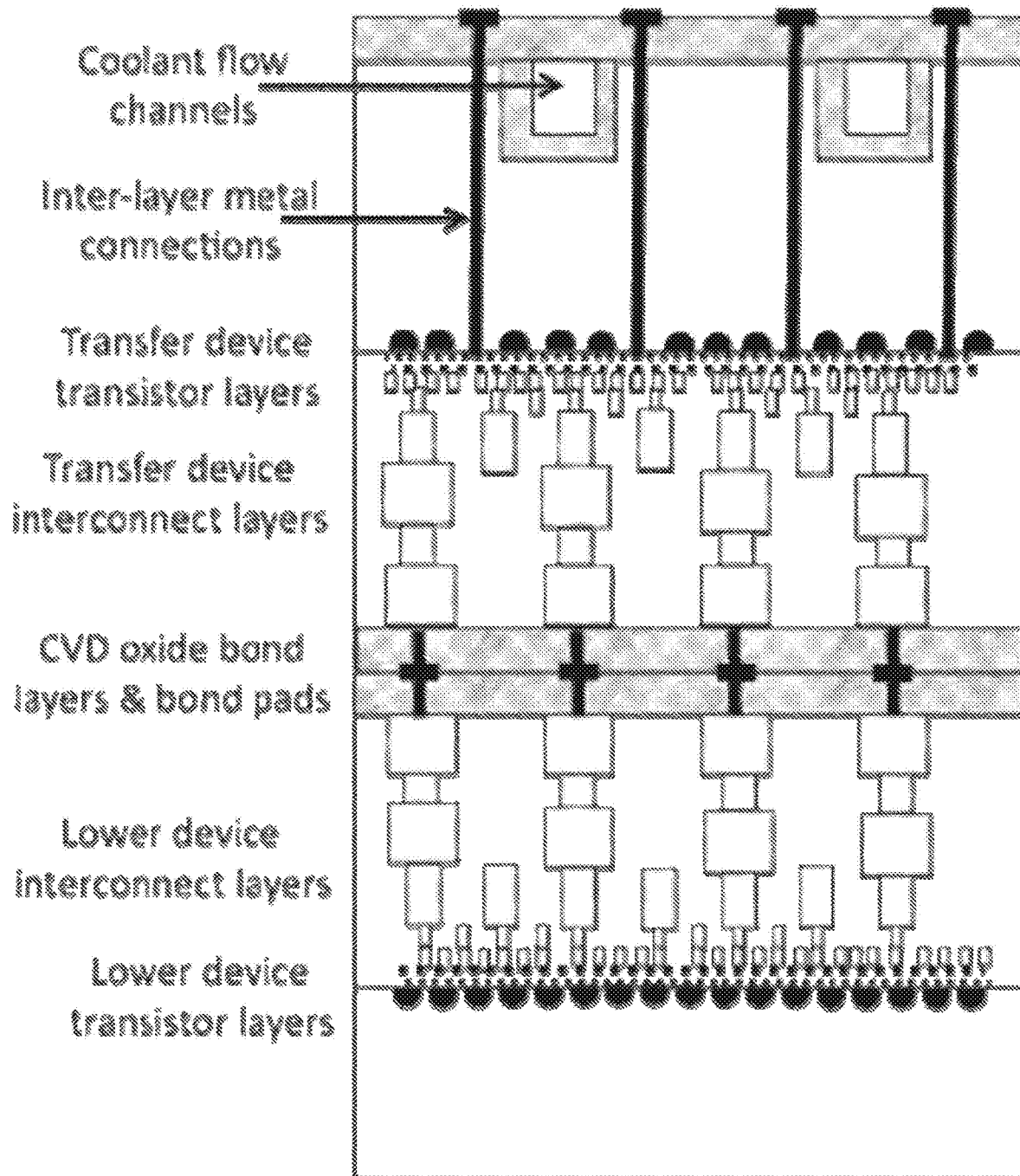
FIG. 20 shows a simplified cross-sectional view of a "top-to-top" metal layer bonding of a transfer device layer and a lower device layer in a 3DIC stack.

FIG. 20 shows a simplified cross-sectional view of a "top-to-top" metal layer bonding of a transfer device layer and a lower device layer in a 3DIC stack. This approach can provide inter-level metal connection channel densities, and corresponding increased bandwidth, similar to via densities of the top metal layers of CMOS devices.

Specific examples of 3DIC structures according to embodiments may be characterized by an IO density (in Pins/cm2) of between about 1.0E+06-1.0E+08, over a pin pitch range (in nm) of 1·E+02-1.E+04. In an example, for a TSV depth of 1 μm, aspect ratios (depth:minimum width of diameter) may range from between 10 to 1 over a range of TSV diameters from about 0.1 to 1 μm.

As mentioned above, proton implantation to form a 3DIC structure according to embodiments, may take place at energies of about 1 MeV, including energies of between about 300 keV-5 MeV, about 500 keV-3 MeV, about 700 keV-2 MeV, or about 800 keV-1 MeV. Incorporated by reference herein for all purposes, is U.S. Patent Publ. No. 2008/0206962.

It is noted that implant properties of hydrogen ions at such higher energy ranges may vary as between the 40 keV energies typical of layer transfer processes for SOI wafer manufacturing. A first order description is the ratio of the "half-width" of the proton profile reflecting "straggling" (<ΔX>), to the depth of the "projected range" profile (<X>).

Comparison of such <ΔX>/<X> results in an example, is as follows:
proton implant energy 40 keV: <ΔX>/<X>=0.196
proton implant energy 1 MeV: <ΔX>/<X>=0.048≈0.05
Thus, the 1 MeV proton profile is "sharper" than the 40 keV profile.

3DIC structures are commonly stacked at the wafer level. Wafer-level processing, especially when combined with the directness of the transfer methods for fully-metallized CMOS devices described herein, has substantial advantages for economic and efficient processing.

Wafer-level processing of bonded structures typically assumes that the same size wafers are used, and the placement of dies on the joined wafers are closely coordinated to result in vertical stacked 3DIC structures after separation into discrete systems. These conditions are commonly met for large-area logic and memory devices fabricated on 200 or 300 mm Si wafers in mass-production foundry processing.

Many desirable components for communication linkage, such as RF tuners, amplifiers and the like, are considerably smaller in die size than cm$^2$-sized logic and memory devices. These smaller die sized devices may be fabricated on diverse wafer sizes such as 100 and 150 mm, and may use non-bulk silicon substrates such as Radio-Frequency Silicon on Insulator (RF-SOI), GaAs, etc.

There are many challenges associated with stacked structures with diverse die sizes. Device alignment is important, and can be complicated by the thickness variation inherent to backgrinding processes used to thin dies. Total Thickness Variation (TTV) for backgrinding processes are typically in the range of about 5%. Such variation can compound when multiple layers are stacked, making it difficult to perform semiconductor forming processes to facilitate interlayer connection. As a result, stacked devices employ relatively large solder bumps and interposer layers to connect devices in a vertical stack. In addition, many devices use bonding wires to connect multiple layers that are disposed side-by-side in a package.

Embodiments of the present disclosure include devices and processes for 3DIC structures that include heterogeneous die sizes. Dies that are formed by performing ion implantation through circuit structures including dielectric and conductive materials to cleave base substrates simplify the thinning process, and have less variation than backgrinding processes. TTV values that can be obtained by ionic cleaving may be, for example, less than 2%, less than 1.5%, and less than 1.0%. In addition, backgrinding applies a substantial amount of mechanical stress to semiconductor devices, which may disrupt structures in the device, causing further alignment and performance issues.

Figure 21:
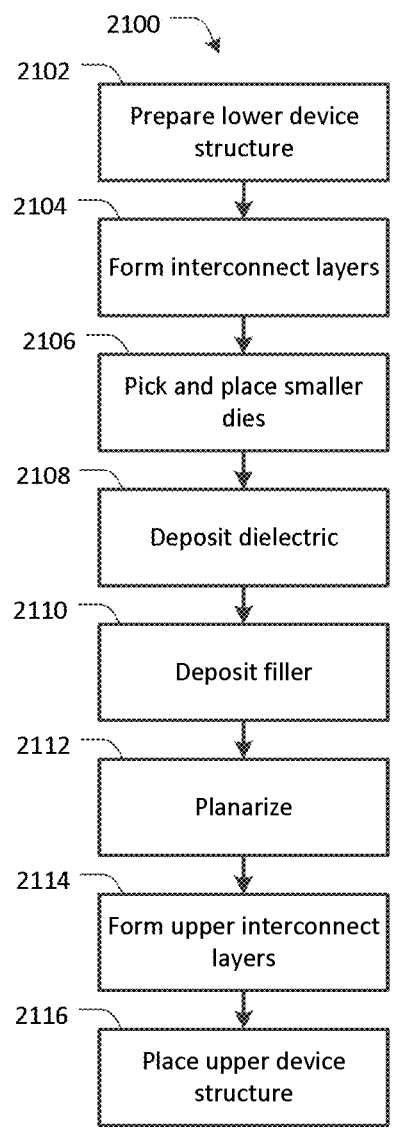
FIG. 21 illustrates a process for forming a 3DIC structure with different die sizes.

FIG. 21 shows an embodiment of a process 2100 for forming a 3DIC structure with different die sizes. An advantage of process 2100 is that it combines the economic advantages of wafer-level processing with the flexibility of incorporating layers of smaller area dies, which may be fabricated on a diverse variety of substrate materials and wafer sizes into composite 3DIC structures.

Figure 22:
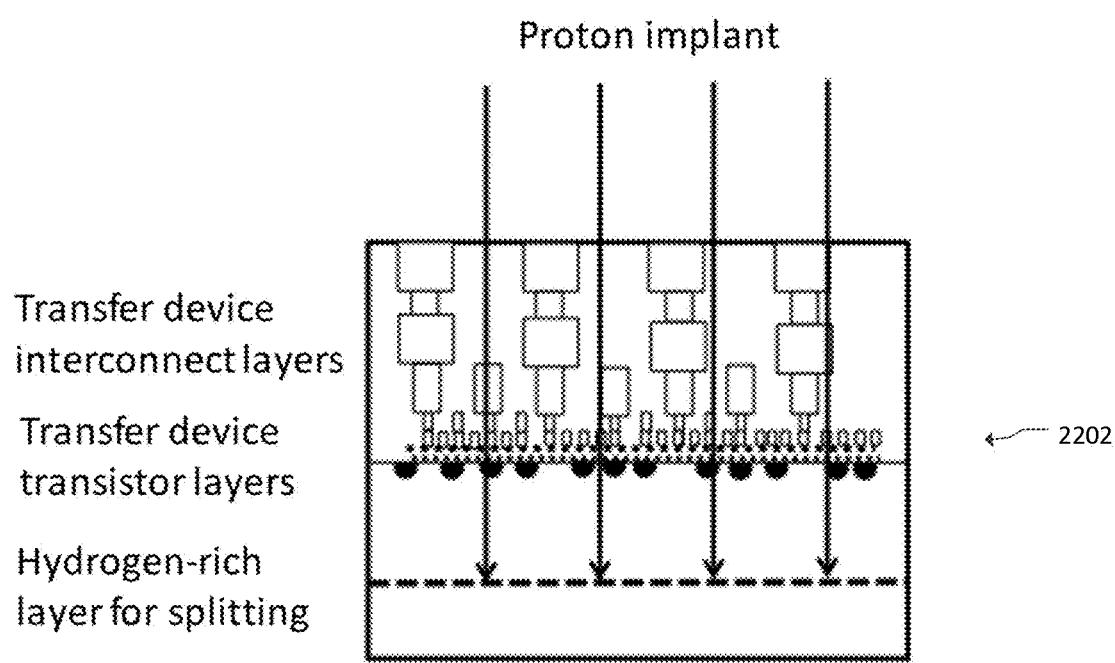
FIG. 22 is a simplified cross-sectional view showing an example of a lower device structure.

A base device structure is prepared at 2102. FIG. 22 illustrates an embodiment in which a base device structure 2202 is prepared using high-energy hydrogen implantation, where the peak concentration of a high-dose hydrogen implant is located in the substrate region below a metallized layer which may be, for example, a CMOS or MEMS device layer.

Figure 23:
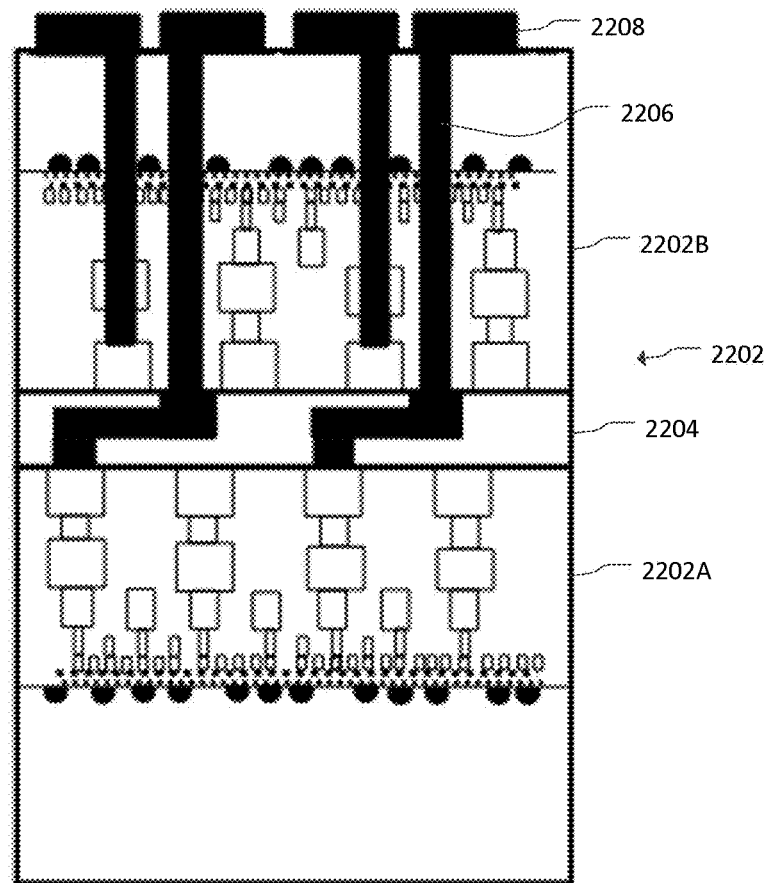
FIG. 23 is a simplified cross-sectional view showing an example of a stacked device structure.

Following cleaving along an approximate location of the hydrogen concentration peak, residual damage along the cleave plane is removed and the transferred device layer is bonded to another wafer-scale device layer as shown in FIG. 23. In the embodiment shown in FIG. 23, the base device structure 2202 includes two wafer-level bonded semiconductor layers, 2202A and 2202B, which are formed by implanting ions through dielectric and conductive structures that are formed on semiconductor wafers. In some embodiments, the base device structure 2202 may be more than two stacked semiconductor layers or a single stacked semiconductor layer.

FIG. 23 illustrates wafer-level bonding in a device orientation where the bonding occurs along the metalized layers of the two layers, where the upper (second) device layer 2202B is face down compared to the lower (first) device layer 2202A, which is face up. Although only a single device of each of the first and second device layers are illustrated in FIG. 23, in an embodiment, cleaving and bonding operations are performed on a plurality of devices on a wafer.

Before the two device layers 2202A and 2202B are bonded together, there is an opportunity for deposition and patterning of one or more intermediate layers 2204, insulated by inter-metal dielectric materials, that can provide both vertical (device to device) and lateral connections for signal, timing, poser and ground connections. Such inter-device metal connection layers 2204 are analogous in function to redistribution layers (RDL) in modern 2.5 D multi-chip packaging schemes.

After bonding of the first device layer 2202A to second device layer 2202B, with inclusion of the intermediate connection layer 2204, vertical vias 2206 are etched and filled with metal to provide connections between the device layers and a top surface array of bond signal pads.

An interconnect layer 2208 is formed on the exposed upper surface of base device structure 2202 in process 2104. The interconnect layer 2208 may include appropriate bonding pads on the top layer of the base device structure 2202 for direct pick and place addition of various smaller die components, as well as lateral wiring connections to interface between the contact pads exposed by the base device structure 2202.

In an embodiment, the top metal layers of interconnection layer 2208 include multi-level metal networks for lateral communication, power and ground connections for a composite device, with the addition of bonding pad arrays designed for placement and bonding of face-down metal connections with smaller, diverse die types.

Figure 24:
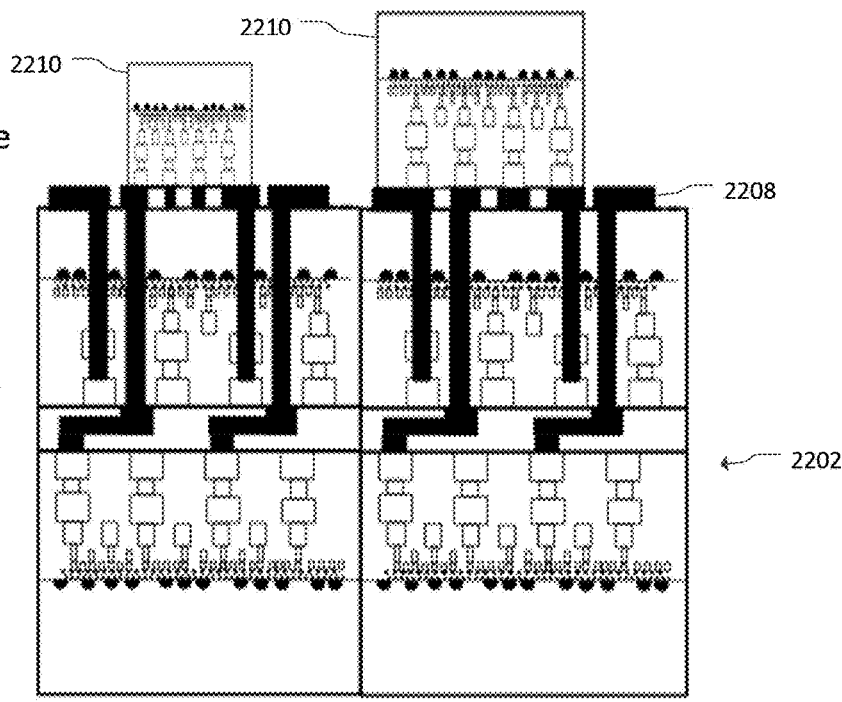
FIG. 24 is a simplified cross-sectional view showing an example of smaller die size devices bonded on a 3DIC.

As illustrated in FIG. 24, one or more die 2210 is placed on the interconnect layer 2208 in process 2106. The one or more smaller die 2210 may be placed using known pick and place techniques to align terminals of the one or more smaller die 2210 with the bonding pads exposed on the upper surface of the interconnect layer 2208. The location and metal-to-metal bonding of discrete die types on a composite wafer-level bonded structure 2202 can be accomplished by an automated die pick, place and bond apparatus.

In some embodiments, smaller dies 2210 have different sizes and thicknesses from one another. The smaller dies 2210 may be a heterogenous set of devices that perform different functions, or a homogenous set of devices.

Since dies 2210 may have various thicknesses, and in some embodiments may be thicker than the desired substrate thickness (e.g., in the range of 1 to 10 um), a layer of deposited material with a similar erosion rate under CMP processes as the substrate die of the added smaller devices may be formed between and over the dies 2210 at 2108.

Figure 25:
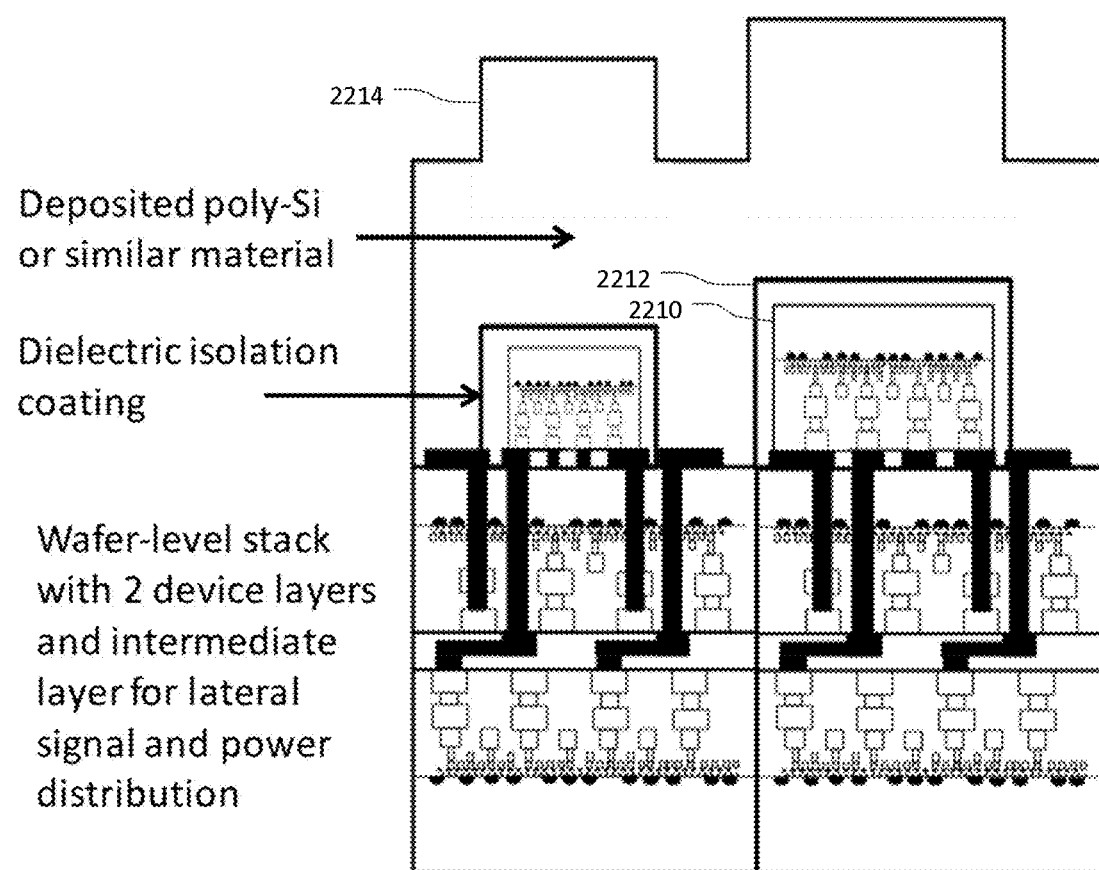
FIG. 25 is a simplified cross-sectional view showing an example of materials deposited over smaller die size devices bonded on a 3DIC.

For example, as seen in FIG. 25, dielectric material 2212 may be deposited over exposed surfaces of the device structure including dies 2210 in process 2108. The dielectric material 2212 provides for electrical isolation of the smaller dies 2210. The dielectric material 2212 may be one or more of a variety of materials commonly used in the semiconductor industry that provide insulation from stray current flows, including a CVD oxide or other suitable insulating material.

In some embodiments, a filler material 2214 is deposited over the dielectric material 2212 at 2110. When the dies 2210 are Si devices, the deposited layer may be plasma deposited poly-Si or amorphous-Si. The filler material 2214 may be selected to have a similar erosion rate to the dielectric material 2212 and the substrate material of the smaller die devices 2210 when planarizing the structure at 2112, for example by performing CMP.

Although process 2100 and the associated figures describe forming a separate dielectric material 2212 and filler material 2214, in some embodiments only a single material or more than two materials are deposited over the dies 2210.

A planarization process is performed at 2112 to planarize the upper surface of the device until contact pads are exposed. The slurry chemistry for the CMP process may be selected based on the dielectric material 2212 and the filler material 2214 to achieve approximately equal erosion rates of the substrates in the added smaller die structures 2210 and the deposited over-layer materials. In an embodiment, planarization process 2112 thins the added smaller die 2210 substrates to thicknesses of about 10 µm or less for later formation of vertical metal vias for interconnection with later added structures and bonding pads. In an embodiment, planarization 2112 is performed until in an overall layer thickness of 10 to 30 µm is obtained.

In addition, planarization process 2112 provides a planar top surface for the newly enlarged composite device structure for subsequent addition of multi-level metal interconnects for lateral signal, power and ground connections as well as bonding pads designed for connections of additional layers added to the composite structure with wafer-level or discrete die placement methods. In an embodiment, the planarization process 2112 may be performed on the top surface until the surface roughness has an RA value that is 5 Angstroms or less, or 3 Angstroms or less.

The deposition and planarization elements of process 2100 may be performed such that substrates of the smaller dies 2110 are thinned to a desired thickness. In addition, the dielectric and filler materials 2208 and 2210 provide mechanical support, and in some embodiments one or more of the layers formed over dies 2110 facilitate heat transfer out of a final 3DIC structure.

In some embodiments, no additional layers are placed on the smaller dies 2210. In those embodiments, the device may be packaged after planarization 2112 without placing upper device structures on the smaller dies 2210.

Figure 26:
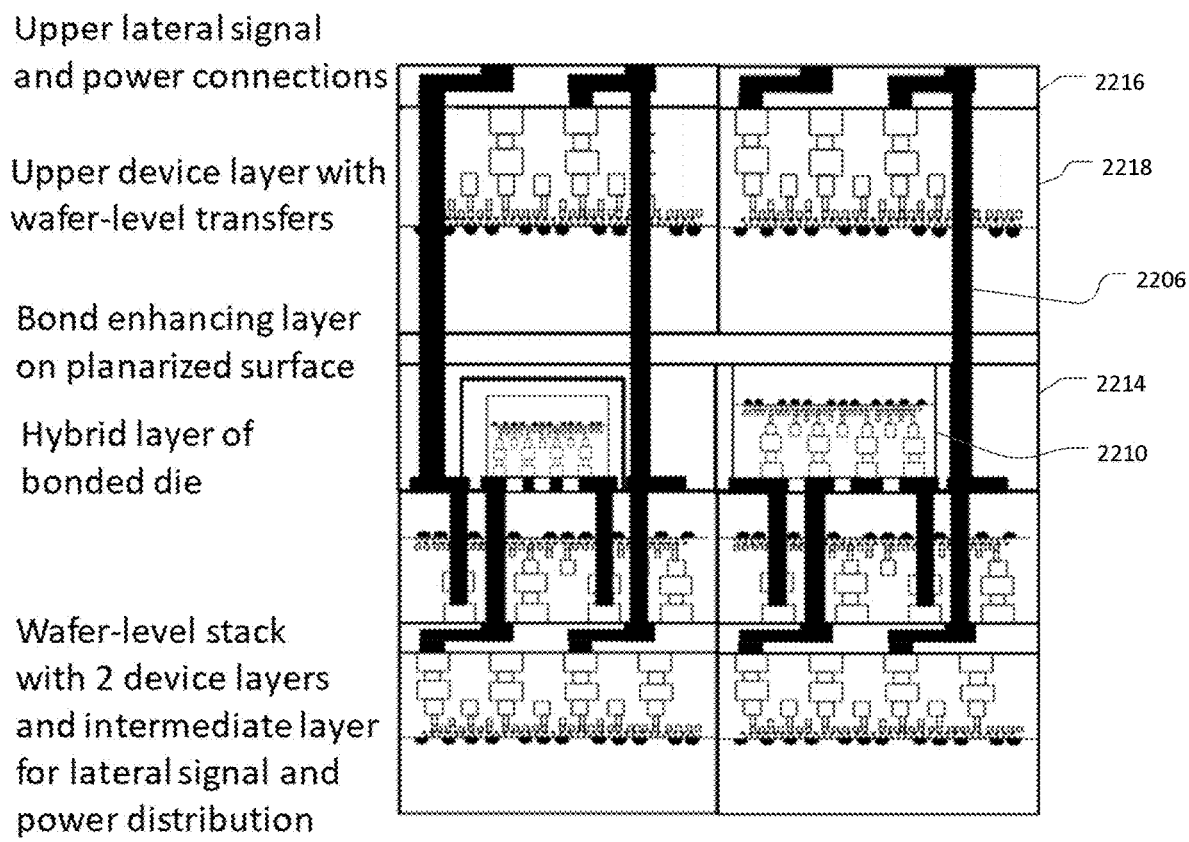
FIG. 26 is a simplified cross-sectional view showing an example of a 3DIC structure with different die sizes.

As illustrated in FIG. 26, interconnect structures 2216 to electrically couple at least one of the one or more smaller dies 2210 to upper device layers 2218 of the 3DIC are formed at process. The interconnect structures 2216 may be formed on exposed surfaces of smaller dies 2210, and/or on an exposed surface of upper device structure 2218 before it is placed onto the smaller dies. In various embodiments, the upper device structure 2218 may be a single substrate as illustrated in FIG. 23, two wafer level bonded substrates, or more than two substrates.

Embodiments of process 2100 provide for the addition of layers of discrete dies to a wafer-level process flow for bonding of multi-level device structures into a composite 3DIC structure. A device made according to process 2100 may have lateral electrical isolation of diverse added dies in the multi-chip layer, and may include vertical metal connections in dense, high-band width networks as well as lateral metal connection networks for the composite device structure containing wafer-level and discrete die placements. When smaller dies of different thicknesses are provided, process 2100 can accommodate these structures by planarization and thinning of the diverse substrates in the composite device layer.

In the course of 3DIC fabrication using wafer-level transfer of metalized transistor and MEMS device layers, situations arise where it is advantageous to locally adjust the depth of the hydrogen implantation, which determines the approximate local location of the cleave plane in the in-process step for layer transfer.

A major challenge for operation of dense high-performance circuit elements with 3DIC stack arrays, such as micro-processor logic and graphics processors for image analysis and display drivers, is the removal of heat from active device cores.

As described above, a network of channels for flow of coolant fluids can be formed in close proximity to a heat-generating transistor layer by adjusting the local penetration depth of the hydrogen implant profile by adding a patterned "range adjusting" layer comprised of materials formed at a sufficient thickness to result in a local offset in the hydrogen depth and subsequent cleave surface. After cleaving of the device transfer layer along the variable depth cleave surface, a network of channels can be formed in the bottom surface by bonding the transfer device layer to a planar surface, such as the planarized top layer of another device layer, as shown in FIG. 1.

The range compensating layers may comprise patterned layers of CVD silicon oxide of appropriate thickness combined with an unpatterned silicon nitride layer, which acts as an etch stop for the removal of the patterned oxide layer after the implant step. In another embodiment, the range compensating layer is a patterned layer of thick photoresist.

Figure 27:
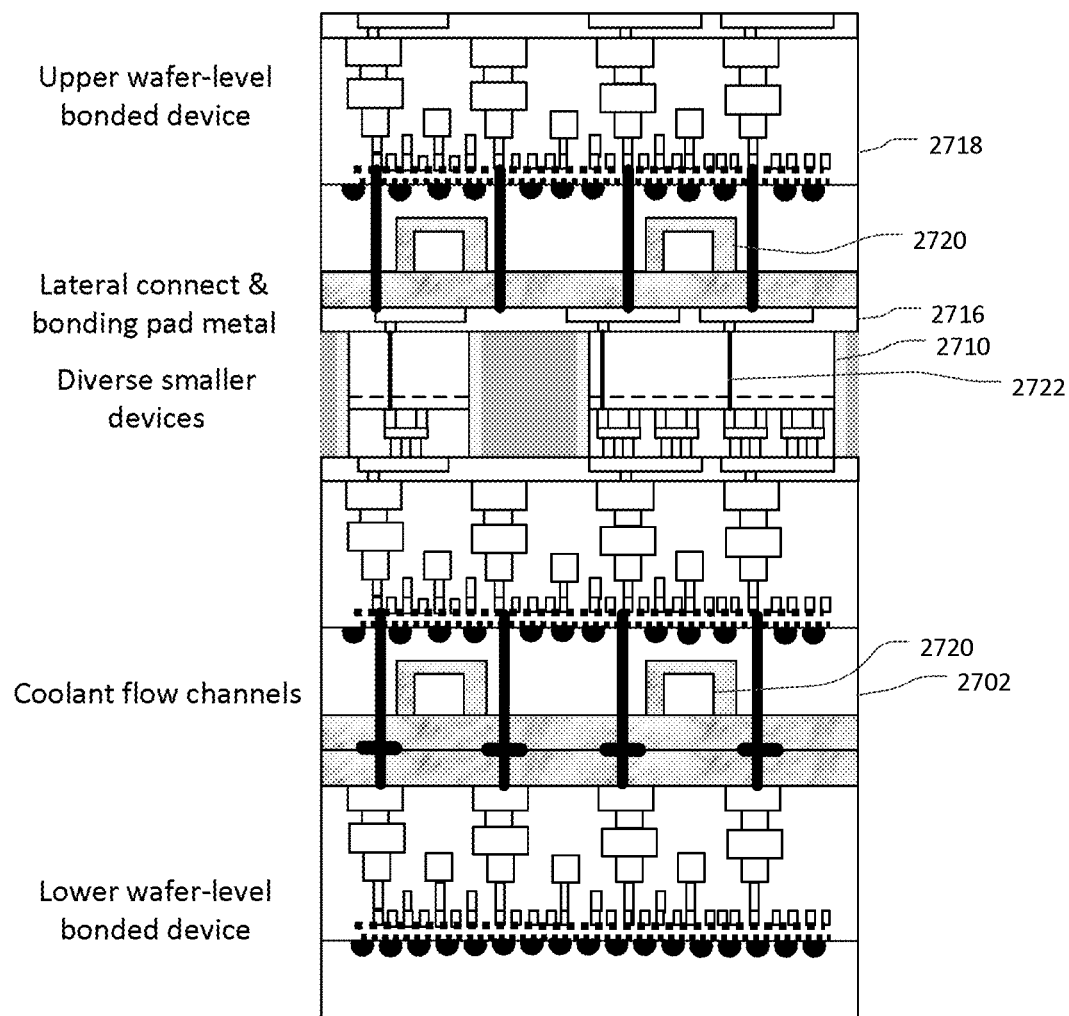
FIG. 27 is a simplified cross-sectional view showing another example of a 3DIC structure with different die sizes.

FIG. 27 shows an embodiment of a device that includes diverse sized dies 2710 disposed between a lower which has several features that are not present in the device of FIG. 26. The diverse dies 2710 are formed over a base device structure 2702, which includes upper and lower parts that may be formed by implanting ions through metal and dielectric structures to form a cleave layer at the wafer level, and bonding the upper and lower parts to form the lower device structure 2702. In addition, the device of FIG. 27 shows a plurality of cooling channels 2720 that are disposed at the interface between the upper and lower parts of the base device structure 2702, and at a lower surface of the substrate of upper device structure 2718.

Another feature of the device shown in FIG. 27 that is different from the device of FIG. 26 is the location of vertical interconnect structures. While the embodiment of FIG. 26 has vertical vias 2206 that penetrate the upper device structure 2218 and filler material 2214, FIG. 27 shows vertical vias 2722 that pass through small die structures 2710 to provide electrical communication between devices of the lower structure 2702, the small dies 2710, and the upper structure 2718. Persons of skill in the art will recognize that numerous variations are possible beyond the specific features shown in FIG. 26 and FIG. 27.

Figure 28:
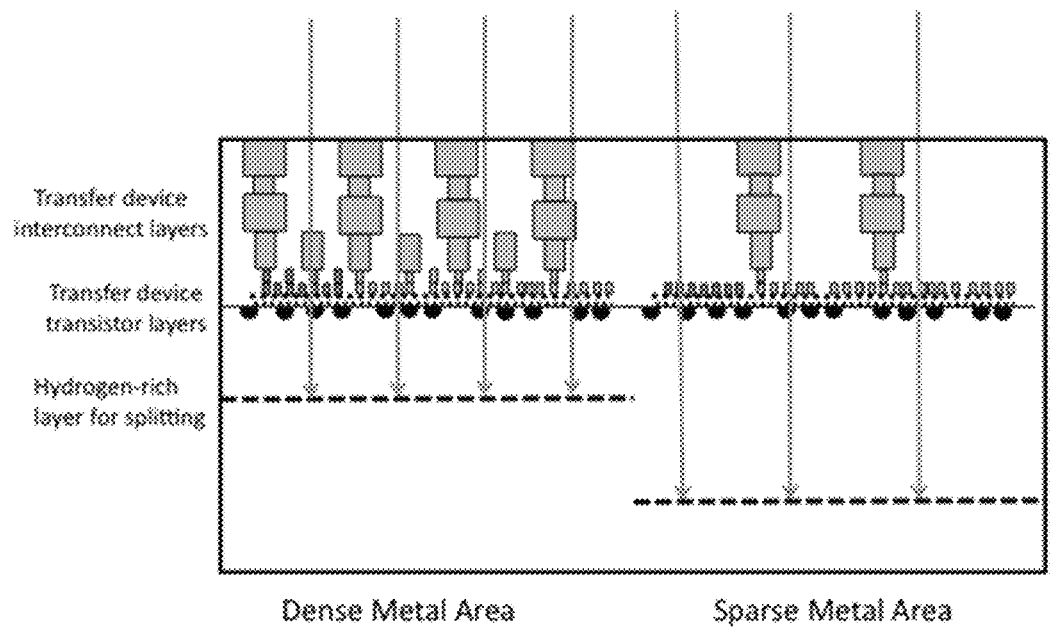
FIG. 28 is a simplified cross-sectional view showing an example of proton implantation.

Processes according to the present disclosure may be applied for transferring devices which contain large variations in the density of total metal layers in local regions of the transferred device. When implanting hydrogen ions through metal and dielectric structures of a semiconductor device, the depth of the cleave plane may be affected by the arrangement of conductive and dielectric structures in a circuit layer. For example, as seen in FIG. 28, the depth of peak energy, which manifests as a cleave plane, may be less in a high-density area of a device than a low-density, or sparse area. In some circumstances, it may be desirable, for purposes of process simplicity in the layer transfer bonding, to have the implanted hydrogen profile depth at the same planar location below a circuit layer.

Hydrogen cleave plane depth can vary in between different areas of a high-performance microprocessor where a dense, multi-layer metallization layer over the logic core is surrounded by more sparse metal interconnect networks in memory (e.g. embedded SRAMs) and timing and input/output circuits. Other examples include optical sensor (cell-phone cameras, etc.) devices where densely metalized image processing circuits are surrounded with more sparsely metalized photosensor arrays. In addition, MEMS devices often contain multiple layers and open spaces of various material densities. These variations can translate to different stopping powers for hydrogen ions, which can vary the depth of a cleave plane. In an embodiment that includes transferring devices containing MEMS devices.

Figure 29:
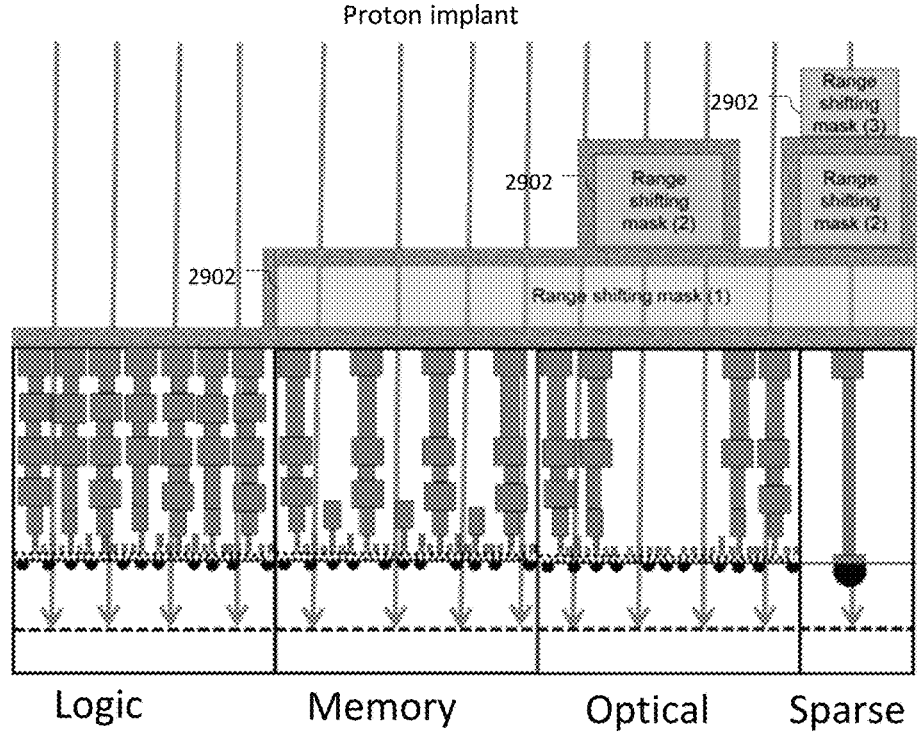
FIG. 29 is a simplified cross-sectional view showing an example of proton implantation through range compensating layers.

As seen in FIG. 29, local hydrogen profile shifts can be compensated for by a patterned range compensating layer 2902 of appropriate thickness and hydrogen stopping power to result in an approximately planar hydrogen peak profile depth and cleave plane. Accordingly, embodiments of the present disclosure may include forming a range compensating layer 2902 over a top surface of a semiconductor device to compensate for variations in ion penetration depth resulting from variations in density and/or the types of materials present between an upper surface of the semiconductor device and a cleave plane.

In some embodiments such as the example illustrated in FIG. 29, the compensating layer 2902 has an even thickness, and is selectively deposited over areas of the device which would otherwise have a higher ion penetration depth than areas with no compensating layer. In other embodiments, the compensating layer 2902 has variations in thickness to account for multiple variations in ion penetration depth. For example, a shape of the compensating layer 2902 can be developed by performing ion implantation on a device that lacks a compensating layer, measuring depth variation in the cleave plane, and forming a compensating layer whose thickness varies as a mirror image of the depth variation, e.g. greater depth ion penetration areas would correlate with thicker sections of the compensating layer, and vice versa.

Closely spaced stopping power variations over lateral scales approximately equal to the lateral straggling of high-energy hydrogen ions, on the order of 1 or more microns, are not generally replicated in variations in hydrogen profile depth. Accordingly, the thickness of the range compensating layer 2902 may vary from one functional region of a circuit to another, as opposed to varying based on individual nano-scale structures within a region.

In an embodiment, provisions are made for active removal of heat generated by circuit switching and resistive power losses in a volumetric 3D composite multidevice layer system by formation of cooling channels formed along the cleave surface defined by a high-concentration Hydrogen profile. The cleave surface depth is defined by the thickness, stopping power and location of patterned layers added to the device surface before Hydrogen implantation.

As illustrated in FIG. 2A, embodiments of the present disclosure include a cooling channel. In the example of FIG. 2A, he cooling channel was created by modulating a depth profile of implanted Hydrogen with a patterned CVD oxide overlayer that is present when hydrogen is implanted to form a cleave layer. An associated CVD nitride layer is used to provide an etch stop for the CVD oxide layer patterning. Both of the CVD nitride and oxide layers are removed in later processing.

FIG. 2 illustrates an embodiment of cooling channels formed along the cleave surface by offsetting the proton depth with a patterned stopping layer photoresist (PR) layer. In other embodiments, the stopping layer may be a similar dense material deposited on the device wafer surface. The thickness and stopping power of the underlying un-patterned PR layer can be used to modulate the depth of the cleave surface features in the substrate material below the transferred device layers. FIG. 2 shows the formation of a completed cooling fluid channel by bonding the modulated cleave surface to a planar top surface of an underlying device or substrate layer.

In an embodiment, cooling channels are enhanced by applying a surface coating. A surface coating material may be selected to improve heat transfer from the active device layers to a cooling fluid in the cooling channels, and/or to reduce or eliminate chemical reactions between a heat transfer fluid in the cooling channel and a substrate material. For example, in some embodiments, a cooling channel is disposed in a layer with high thermal conductivity, and the high thermal conductivity material reacts with a heat transfer fluid that flows through the coolant channel. In such an embodiment, exposed surfaces of the coolant channel may be coated with an inert material such as an oxide or nitride material that prevents chemical reactions between the heat transfer fluid and the high thermal conductivity layer material. For example, the inert material may be $SiO_2$ or $Si_3N_4$.

Persons of skill in the art will recognize that characteristics of the coating material including material type, thickness, and deposition technique may be selected based on the particular thermal conductivity layer material and heat transfer fluid used in an embodiment. In some embodiments, the coating material assists in heat transfer, and has a higher thermal conductivity than a substrate material over which the coating is formed. Other favorable characteristics of a coating layer on coolant channels include excellent adhesion to the coolant channel wall material, uniform conformal coating thickness for good thermal conductivity and free flow of coolant materials and, being inert to the coolant fluid material at device operating temperatures.

In an embodiment, a fluid in the coolant channels may be a heat transfer fluid with a relatively high thermal conductivity. In some embodiments, the fluid is an inert substance such as water, or a highly dilute solution. In other embodiments, the heat transfer fluid may be a nanofluid that comprises nanoparticles that enhance the thermal conductivity of the fluid compared to the liquid phase component. The heat transfer fluid may circulate through an external heat exchanger to transfer heat away from the device.

The location of the cooling channel can be chosen to be at a transfer device bond layer as seen in FIG. 2, or in an alternate location for cases where direct bonding of device metal layers is desired, for high-bandwidth circuit connections, as seen in FIG. 20. In FIG. 20, the cooling channels are located near a planar bond surface for a subsequently added device layer.

In some embodiments, one or more heat transfer layer may be included in a 3DIC device. A heat transfer layer may be a material that has superior heat transfer characteristics to materials used in an active layer. The heat transfer layer may be disposed adjacent to the cooling channels, so that a heat transfer fluid travelling through the cooling channels transfers heat from device circuitry to the heat transfer layer. In other embodiments, cooling channels are formed directly in a high thermal conductivity heat transfer layer.

Multi-layer lamination of devices allows for the insertion of layers of high-thermal conductivity materials and interfaces to improve both the lateral spreading of heat from local active circuit regions and the vertical transfer of heat to the network of fluid flowing in cooling channels. The provisions for controlling the local depth of the cleave surface in materials also allows for the formation of cooling channels in subsequently laminated high-thermal conductivity layers in a similar fashion as the transferred device layers. For example, FIG. 16 illustrates a high thermal conductivity heat spreading layer with coolant flow channels that is bonded between two circuit layers by CVD oxide bond layers.

As indicated in Table 1 above, the room-temperature thermal conductivity of Silicon, the dominant substrate material for current IC fabrication, has a relatively high thermal conductivity, matched closely only by Silicon Carbide (SiC). In an embodiment, it is desirable to use a material that has higher thermal conductivity than Si as a high thermal conductivity layer.

Figure 30:
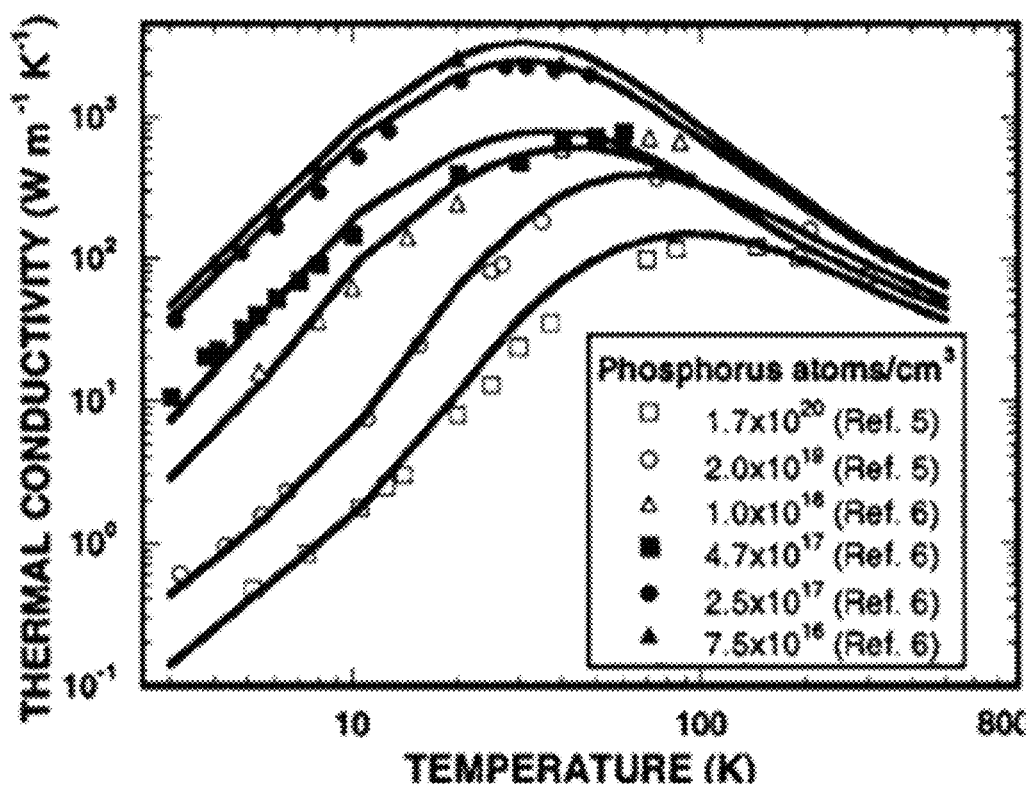
FIG. 30 illustrates thermal conductivity of a silicon substrate at various phosphorus dopant concentrations and temperatures.
Figure 31:
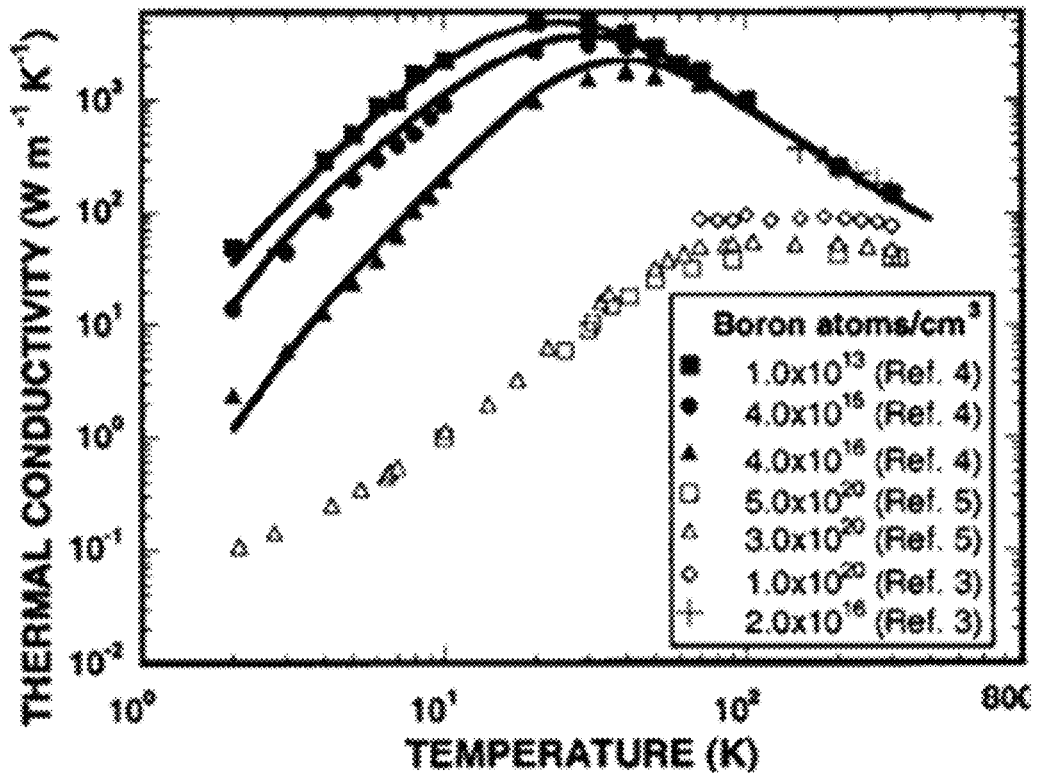
FIG. 31 illustrates thermal conductivity of a silicon substrate at various boron dopant concentrations and temperatures.

A consideration for a material for a high thermal conductivity heat transfer material is the thermal conductivity properties of materials at temperatures characteristic of active circuit operations, which are generally in the range of 80 to 120 C. For Si at room temperature (25C, 300K) and above, thermal conductivity decreases strongly with increased temperature, leading to a risk of "thermal runaway" for local regions heated by active circuit power. As seen in FIGS. 30 and 31, Si thermal conductivity decreases at all temperatures for increased dopant concentrations due to phonon-dopant scattering. For commonly used Si substrates, the dopant levels are relatively low ($\approx 10^{15}$ dopants/$cm^3$) leading to relatively high thermal conductivity compared to the higher concentrations illustrated in FIGS. 30 and 31.

Figure 32:
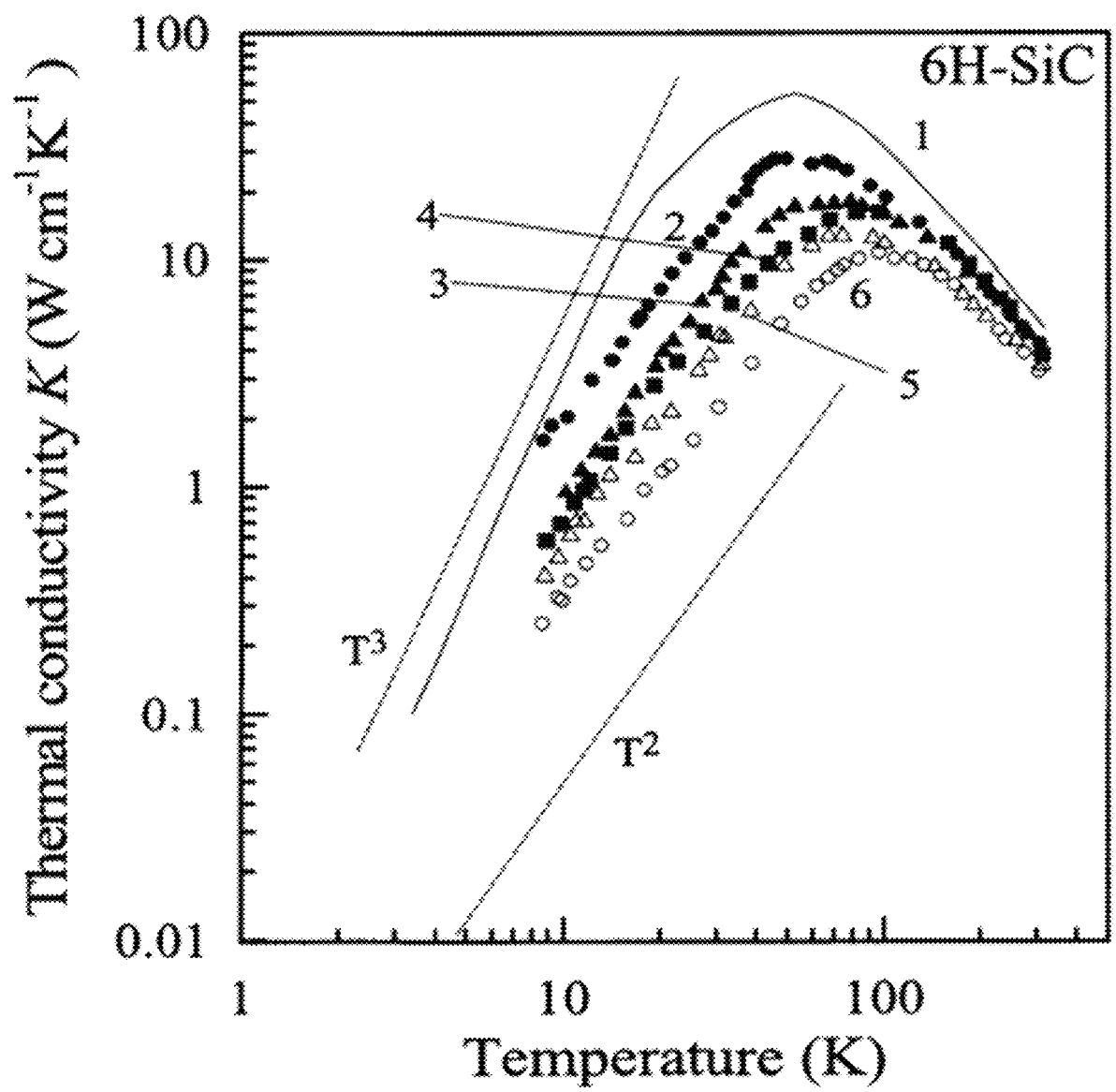
FIG. 32 illustrates thermal conductivity according to temperature for 6H—SiC at various temperatures and dopant concentrations.

FIG. 32 illustrates thermal conductivity of 6H—SiC at various temperatures and doping concentrations as reported by Morelli et al. (1993). In the FIG. 32, sample 1 is a very pure or highly compensated sample, and the remaining samples have electron concentrations as follows: sample 2–n=$3.5 \times 10^{16}$ $cm^{-3}$; sample 3–n=$2.5 \times 10^{16}$ $cm^{-3}$; sample 4–n=$8.0 \times 10^{17}$ $cm^{-3}$; sample 5–n=$2.0 \times 10^{17}$ $cm^{-3}$; and sample 6–n=$3.0 \times 10^{18}$ $cm^{-3}$. Thermal conductivity values of various forms of silicon carbide are reported as being higher than silicon, with conductivity values of 3C, 4H and 6H polytypes being twice as high as silicon at 300K.

Figure 33:
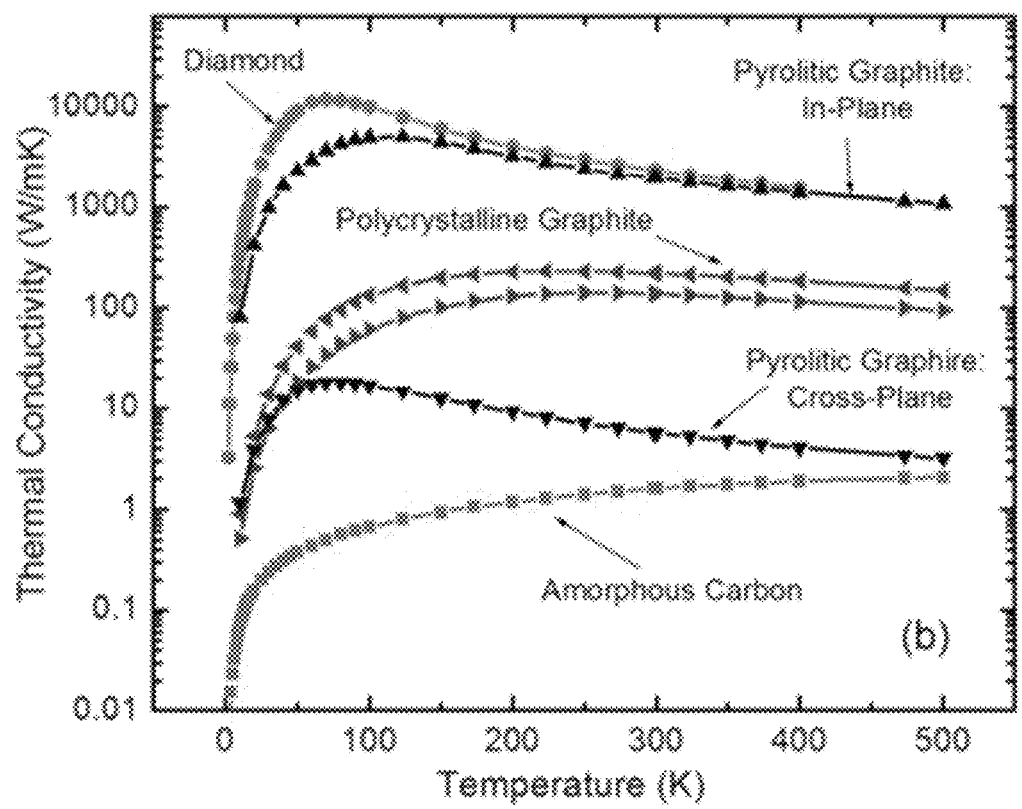
FIG. 33 illustrates thermal conductivity of various carbon materials.

As illustrated in FIG. 33, thermal conductivity of some carbon-based materials is much higher than silicon. In particular, diamond, graphite, graphene and Carbon nanotubes all have thermal conductivity values that are substantially higher than thermal conductivity of silicon, especially at higher temperatures. While FIGS. 30 and 31 show a steep decline in silicon's thermal conductivity above room temperature, the decline in thermal conductivity of carbon-based materials is relatively shallow, and in the case of amorphous carbon, thermal conductivity increases above room temperature. In particular, thermal conductivity values reported for diamond and graphene are an order of magnitude greater than thermal conductivity of silicon at 300K. Another material with a high thermal conductivity that is comparable to forms of diamond is cubic Boron Arsenide. In embodiments of the present disclosure, one of these materials may be used as a bulk substrate material.

In the present disclosure, the term "plane" is used to describe a cleave plane, which is generally understood to be a location at which a cleaved layer is separated from a substrate. However, as explained above, a range compensating layer may be applied to a substrate before ion implantation, which can result in an as-cleaved surface that includes one or more contours which may define, for example, a cooling channel. Accordingly, use of the term "cleave plane" in the present disclosure should not be construed as limiting embodiments of this disclosure to cleaved surfaces that are perfectly flat.

In an embodiment, a chemically or mechanically weak cleave surface is formed by ion implantation prior to the formation of any sensitive or reliability concerned device layers, interfaces of structures. Such an embodiment may be used in the formation of a full device structure, including a full network of metal interconnects and inter-metal layer dielectrics, to be followed by initiation of cleave action at the pre-formed cleave surface for transfer to a 3DIC stack structure.

Such an embodiment would reduce concerns for device yield and reliability problems related to the formation of the buried cleave surface. In the case of Hydrogen-based cleave surface formation, this embodiment allows for use of substantially lower proton ion energies for the implant step for a desired cleave surface depth.

Benefits of such an embodiment include that the mechanical, thermal and chemical conditions for the post-cleave plane formation device fabrication and testing process should be conducted to avoid premature initiation of the cleave action. In an embodiment that uses Hydrogen-driven cleaving, this involves restricting the post-cleave surface formation processing to temperatures below $\approx 500C$.

Many advanced devices, for example those which contain high-dielectric constant, or high-K, gate oxides, such as $HfO_2$ and related forms, have thermal budget restrictions in this general area.

Figure 34:
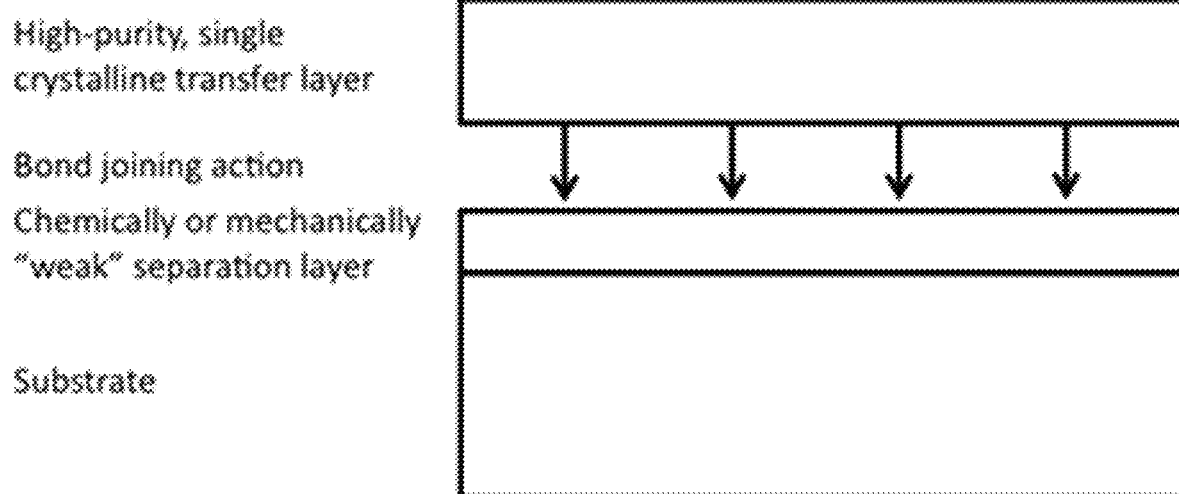
FIG. 34 illustrates a bonding step for a transfer layer.

FIG. 34 illustrates a bonding step for a transfer layer. In an embodiment, the transfer layer is a high-purity, crystalline transfer layer that is bonded to a substrate layer containing a chemically of mechanically weak separation layer that can subsequently be cleaved after initiation of appropriate cleave surface formation conditions.

Figure 35:
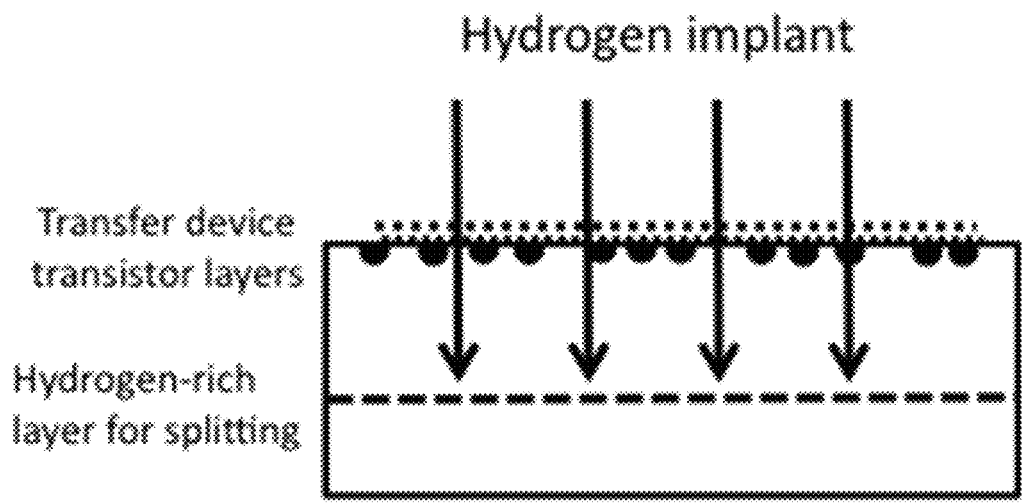
FIG. 35 illustrates forming a buried Hydrogen profile below a partially completed device layer.
Figure 36:
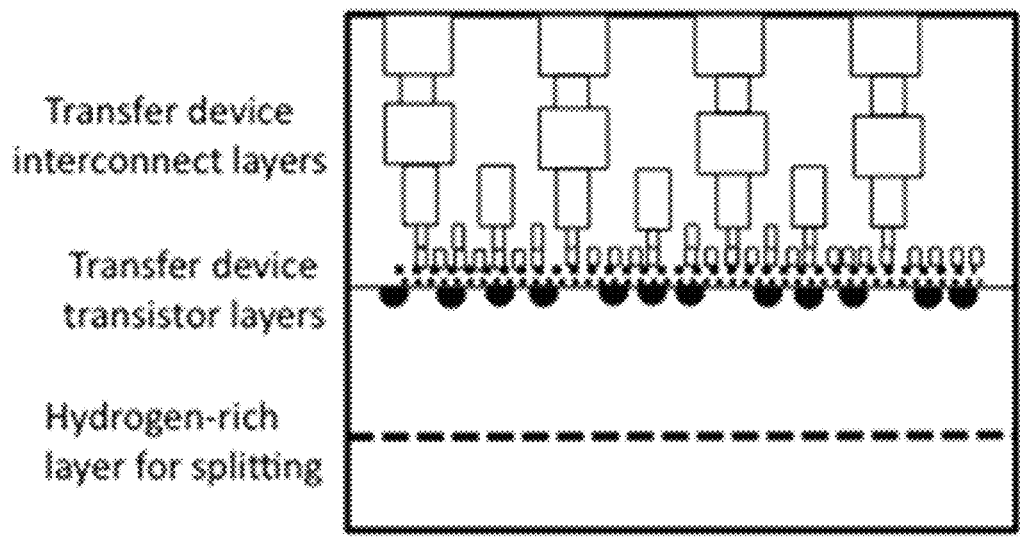
FIG. 36 illustrates a complete device layer over the Hydrogen profile.

FIGS. 35 and 36 illustrate an embodiment of forming a buried Hydrogen profile with peak concentration appropriate for formation of a cleave surface at a depth below a partially completed device layer, prior to formation of sensitive device layers, interfaces or structures. FIG. 36 illustrates a fully completed device structure, including fully constructed metal interconnect and inter-metal dielectric layers prior to introduction of process conditions for initiation of a cleave surface at the buried Hydrogen-rich cleave surface.

A process may be performed where a chemically or mechanically weak layer is formed in a partially completed device substrate prior to the formation of sensitive device layers, interface or structures. Thermal, mechanical and chemical processing of the subsequent device fabrication may be restricted to conditions which do not initiate cleaving action at the cleave surface locations. The sensitive structures may include gate dielectric and inter-metal layer dielectric layers. An example of a subsequent process restriction for the case of a Hydrogen implant formed cleave surfaces include processing at temperatures at or below 500C. In an embodiment, the completed, fully-metallized device structure is transferred to a 3DIC stack following cleaving initiated at the cleave surface.

Control of implant conditions during proton implantation is important for successful layer transfer of electronic devices. One aspect of this control is the radiation damage associated with the passage of protons through electronic device materials and into an underlying substrate.

In some embodiments, the compensating layer 2902 has an even thickness, and is selectively deposited over areas of the device which would otherwise have a higher ion penetration depth than areas with no compensating layer. In other embodiments, the compensating layer 2902 has variations in thickness to account for multiple variations in ion penetration depth. For example, a shape of the compensating layer 2902 can be developed by performing ion implantation on a device that lacks a compensating layer, measuring depth variation in the cleave plane, and forming a compensating layer whose thickness varies as a mirror image of the depth variation, e.g. greater depth ion penetration areas would correlate with thicker sections of the compensating layer, and vice versa.

Despite the complexity of the possible collisions and other interactions, the stopping of ions is dominated by two major categories of collisions: (1) collisions between an energetic implanted atom and core electrons and nuclei of the target atoms, referred to as nuclear stopping, and (2) collisions between the energetic atoms and loosely bound electrons in the outer shell of target atoms, which is referred to as electronic stopping.

The effects caused by these two forms of ion-target atom collisions depend on the type of materials in the target. In embodiments of the present disclosure, the types of target materials include electronic devices and surrounding structures. Nuclear stopping collisions result in a large transfer of kinetic energy to the target atoms, often knocking the target atom out of its original lattice site and creating interstitial target atoms and vacant lattice sites. These interstitials and vacancies can combine with similar defects to form stable structures, which may be collectively referred to as implant damage.

In a layer transfer processes that uses proton implants there are effects of residual implant damage. During and soon after performing implantation, the accumulated recoil damage from the nuclear stopping of protons in the target leads to formation of stable damage structures which provide effective trap sites for the implanted protons. The proton trapping in the implant damage layer near the end of the ion tracks holds the Hydrogen in place, rather than quickly diffusing away, and allows for formation of Hydrogen-filled platelets which are the seeds for the formation of cleave surfaces that allow for separation of a transfer device layer from a substrate.

Electronic stopping in electronic materials results in local scattering of electrons, often referred to as "ionization." In conductive materials, such as Cu metal lines and doped Si materials, local scattering of electrons may be rapidly repaired by the local motion of electrons in these materials. However, in insulating materials, such as low dielectric constant (low-k) layers that are used to insulate Cu and Co metal interconnect layers, high-dielectric (high-k) oxides commonly used as gate dielectrics between the CMOS gate and channel regions and oxide or nitride spacers formed along the sidewalls of gate electrodes, local electron scattering cannot be easily neutralized, resulting in isolated charged regions and trap sites related to broken atomic bonds in the dielectric materials. The present application discloses processes that repair such damage.

Key aspects of proton range and damage effects can be illustrated by Monte Carlo modeling, e.g. modeling conducted with Stopping and Range of Ions in Matter (SRIM) software. An example of SRIM modeling of proton range and damage effects is illustrated in FIG. 37.

Figure 37:
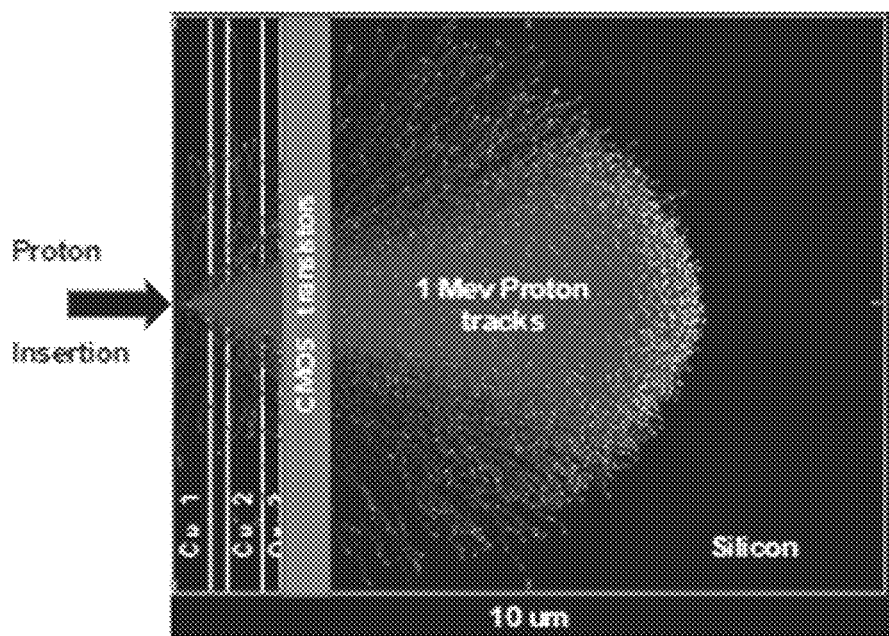
FIG. 37 illustrates 1 MeV protons implanted into a 3 μm thick multilayer containing Cu metal and $SiO_2$ dielectric layers on a Si substrate with a CMOS device layer located just below the metal/oxide multilayer.

FIG. 37 is a graphical illustration of a model calculation for 1 MeV protons implanted into a 3 µm thick multilayer containing Cu metal and $SiO_2$ dielectric layers on a Si substrate with a CMOS device layer located just below the metal/oxide multilayer. The proton tracks show that 1 MeV protons extend deeper than 10 µm below the top metal layer. In addition, FIG. 37 shows that ions injected at a single point on the wafer surface spread laterally over several microns near the deepest portions of the profile, which is referred to as lateral straggling. The proton insertion at a point on the metal/oxide multilayer surface results in a spread of implanted protons approximately 15 µm below the surface and several µm in lateral directions.

Figure 38A:
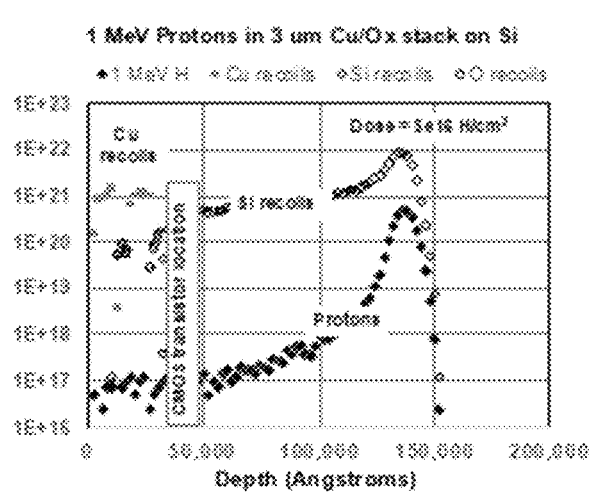
FIGS. 38A and 38B respectively illustrate a recoil profile and an ionization profile for the implantation of FIG. 37.
Figure 38B:
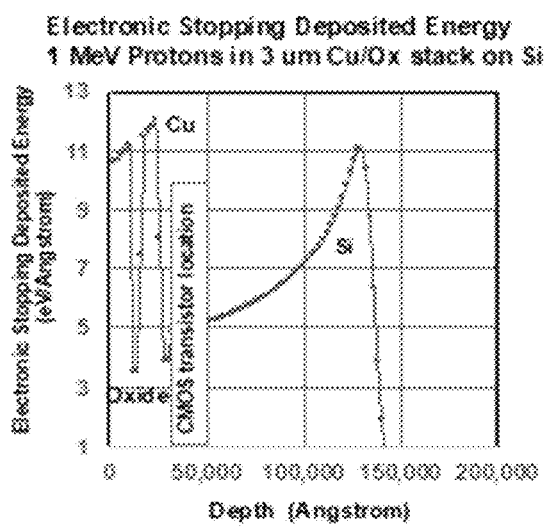

FIG. 38A illustrates 1 MeV proton and target atom recoil profiles for high-dose protons implanted through the 3 µm thick metal and oxide multilayer structure, CMOS transistor region and silicon substrate illustrated in FIG. 37, while FIG. 38B illustrates the corresponding ionization profile. In FIG. 38A, the depth profiles for the implanted protons have a peak concentration at about 14 µm below the top surface, which is about 11 µm below the CMOS transistor and depletion layers.

Both the proton and Si recoil distributions are sharply peaked near the deep portions of the implant profiles. The Si recoil concentration at the CMOS device layers, which are about 3 µm deep, is more than ten times lower than the recoil concentration peak at the approximate depth of the layer cleave surface, which is 14 µm. The high levels of Si recoils at the depth of 14 µm depth produce, under proper process conditions, a dense network of accumulated damage structures that serve to trap the implanted Hydrogen in place.

Another effect of proton passage through the model device layers is the deposited energy from scattering of energetic protons by loosely bound target electrons. The deposited energy, typically referred to as ionization energy expressed in eV/Angstrom, has strong peaks in the Cu metal and deep Si layers as seen in FIG. 38B. These effects are quickly neutralized by motion of nearby electrons in these two conductive materials. Although the deposited energy from electron scattering in the oxide layers is relatively small at about 4 eV/Angstrom in this example, any scattering collisions that results in a displaced electron creates a broken bond that is not readily repaired by electron motion in the insulating dielectric layers.

While such damage may not have a strong effect on highly conductive materials, it can have substantial deleterious effects on other structures, such as dielectric structures. The deleterious effects may be less noticeable in certain relatively large-scale structures such as thin film transistors (TFTs) and some MOSFETS for which reduced switching times and leakage currents are less important. However, the inventors of the present disclosure have discovered that the damage caused by ion implantation through sensitive structures has a profound effect on smaller scale and high-performance devices such as modern processors and memory devices, to the extent that many high-performance devices are rendered inoperable by ion implantation.

One way to reduce damaging effects of ion implantation is choosing an appropriate implantation energy. In an embodiment, the proton energy may be set high enough so that peaks of proton and recoil damage distributions are deeper than the location of the electronic device transistor layer and the thickness of a depletion layer formed when the device is at operating potential, e.g. 1 µm in 10 Ohm-cm Si, which is a commonly used resistivity. Any overlap of the proton damage layer with the device depletion region could result in strong leakage currents, carrier recombination and other deleterious effects on the device performance.

Since the cleave surface may be subsequently bonded to another surface to form a 3D stacked structure, the proton depth below the transistor layer and the associated depletion width should allow for removal of most or all of the cleave surface damage region to form a bond surface of adequate planarity and smoothness for high-strength atomic bonding.

In embodiments, the implant conditions is set to be favorable for the formation a dense and stable accumulated damage region at the location of the desired cleave surface with trapping of a significant portion of the peak proton distribution. In particular, embodiments may use high proton ion density beams, slow beam and wafer scan speeds, and maintenance of the target temperature during implantation below the onset on in-situ annealing of recoil damage, which is approximately 100C for Si and lower for other materials of interest such as III-V compounds. Implant machines that are appropriate for embodiments of the present application include refurbished ion implantation machines that were produced before about 2002.

Thermal processing after implant and before cleaving along the Hydrogen rich layer, such as deposition of CVD layers, thermal treatment of intermediate bond layers, etc. may be performed in order to maintain the integrity of the Hydrogen trapping damage layers. Studies of Hydrogen release from implanted Si and examination of proton damage structures after thermal annealing suggest that a maximum allowed temperature to maintain stable proton trapping is approximately 400C. Accordingly, embodiments of the present application may include limiting all thermal processes performed after Hydrogen implantation and prior to cleaving to temperatures that do not exceed a maximum temperature that may be, for example, 500C, 450C or 400C.

The inventors of the present disclosure have discovered that damage caused by Hydrogen implantations, including stopping and recoil damage, can be repaired under specific conditions. Without a repair operation, devices may have compromised performance or be completely inoperable. Recovery of damage associated with electronic stopping in diverse layers of electronic devices is important for success in 3DIC device stacking using proton implant process techniques.

In an embodiment, a thermal process that repairs damage to the dielectric and conductive structures is performed at a temperature of 350C or greater in an environment that includes hydrogen gas. Conditions in a repair process should be sufficient to allow hydrogen to penetrate the device surface and bond to a molecule that was damaged by an implantation process. In one specific embodiment, the repair annealing is conducted at a temperature of 400C in an atmosphere that includes from 2 to 5 percent hydrogen, with a remainder being one or more inert gas.

In an embodiment, the repair annealing is conducted for a period of time that is sufficient to allow the hydrogen gas to diffuse though circuit structures in a device, which may include an interconnect network of metal and low-dielectric constant dielectric material, and to occupy passivating sites at damaged dielectric bonds. For example, in a specific embodiment, annealing is conducted at a temperature of 400C for one hour to repair implantation damage.

Several variables influence the appropriate time and temperature for implant repair. The specific temperature relates to the amount of time it takes Hydrogen to diffuse through metal and dielectric interconnect networks and gate stack structures to regions where damaged bonds are located, which may be specific to each device. The diffusion of atoms in materials is proportional to $(Dt)^{1/2}$, where D is a diffusion rate exponentially dependent on temperature and t is the diffusion time.

For many silicon-based dielectrics and device designs, 400C for one hour using a 4% Hydrogen and 96% Nitrogen gas blend is appropriate to repair implantation damage. A repair process may be performed at a temperature as low as 300C. In another embodiment, a temperature of up to 500C may be used. However, certain materials are sensitive to elevated temperatures. Exposing a device to elevated temperatures and longer times may cause unfavorable phase changes in high-k dielectric gate oxides such as $HfO_2$, $HfSiO_2$, etc., loss of lateral dimension control on dopant diffusion in sub-20 nm gate length finFETs, and degradation of dopant activation in laser-doped junction contact regions. With these principles in mind, persons of skill in the art will recognize that appropriate thermal repair processes may be performed at temperatures from 300C to 500C and times of at least 30 minutes in a gas environment comprising at least 1% Hydrogen.

Accordingly, persons of skill in the art will recognize that variations in time, temperature and Hydrogen concentration may differ in various embodiments as these variables are interrelated. A combination of lower times, temperatures and concentrations may not be sufficient to repair implantation damage, while longer times and temperatures may cause the Hydrogen ions accumulated in a cleave layer to diffuse into the substrate, or have other negative effects associated with an extended thermal profile. Higher concentrations of Hydrogen are an explosive hazard. It is also possible to vary temperatures in a repair process.

Some embodiments may use a forming gas for a thermal repair process after ion implantation. Forming gasses are a mixture of Nitrogen and Hydrogen gasses with a Hydrogen concentration that is typically between 3% and 5%. However, other embodiments may use inert gasses other than Nitrogen gas, and different concentrations of Hydrogen. For example, embodiments may use an inert gas such as Argon, and embodiments may use Hydrogen concentrations of more than 1%. Lower concentrations of Hydrogen may require longer exposure times, while higher concentrations of Hydrogen represent an explosive hazard. When performing the thermal repair process, the Hydrogen gas penetrates exposed surfaces of a damaged device, and may terminate broken bonds in order to repair damage.

Thermal anneals with forming gas or other hydrogen-bearing gas have appropriate time and temperature conditions to allow diffusion of Hydrogen into the sensitive dielectric layers of electronic devices, including low-k insulators in the metal interconnect network, gate oxides such as $SiO_2$, SiON, high-k dielectrics such as $HfO_2$, and oxide and nitride spacer gate sidewall insulators. Materials with higher K values are more sensitive to damage from implantation, so a thermal repair process is increasingly effective for higher K materials. For example, a thermal repair process may be performed after implanting through materials having a K value of 10 or more, or materials having a K value of 15, 20, 25 or more. Specific high-K materials that benefit from a thermal repair process include hafnium oxide ($HfO_2$), hafnium silicon oxide ($HfSiO_2$), hafnium silicate ($HfSiO_4$), tantalum oxide (Taos), tungsten oxide ($WO_3$), cerium oxide ($CeO_2$), titanium oxide ($TiO_2$), yttrium oxide ($Y_2O_3$), strontium titanate ($SrTiO_3$), lanthanum aluminate ($LaAlO_3$), niobium pentoxide ($NiO_5$), zirconium silicate ($ZrSiO_4$), zirconium oxide ($ZrO_2$), barium titanate ($BaTiO_3$) and lead titanate (PbTiO$_3$). Experimentation has determined that when ions are implanted through high-K materials to form a cleave layer, circuits that depend on the high-K properties are not functional without performing a thermal repair process according to an embodiment of the present disclosure.

In an embodiment, a thermal cycle for a repair process does not exceed a threshold for dissolution of the Hydrogen trapping implant damage structure in the region of the intended cleave surface. If the temperature exceeds the dissolution threshold, the trapped Hydrogen will disperse into the substrate so that it is not possible to perform a cleaving operation. In addition, the temperatures to which a substrate is exposed to after a thermal repair process may be limited to being below a threshold value, e.g. 500C, 450C or 400C after repairing and before cleaving to limit dispersion.

It is desirable to perform a thermal repair process to repair ion damage with direct access for the ambient gas to the dielectric layers in the metal interconnect network and transistor gate stack regions. Thus, a thermal repair process is performed prior to sealing of the electronic device surfaces. Accordingly, it is preferred to perform a thermal repair process prior to performing deposition processes that could limit access to damage sites. In a 3DIC device, the thermal anneal is performed before the layers are bonded.

In embodiments of the present disclosure, a network of channels for flow of cooling fluids is defined by modulation of implanted Hydrogen depth by a patterned layer of materials at the device wafer surface during Hydrogen implant with thickness, stopping power and location chosen to create a non-planar cleave surface in the transfer device substrate. Similar methods for modulating the depth of the cleave plane may be used to define cooling channels in a selected high-thermal conductivity material layer for subsequent insertion into a laminated multi-layer, multi-device 3DIC stack. In an embodiment, the surface regions of a cooling fluid flow network are coated with material chosen to increase thermal conductivity between the heated device layer and substrate and the flowing cooling fluid, and to prevent chemical reactions between the device substrate and cooling fluids.

Embodiments incorporate the advantages of wafer-level bonding processes, including incorporation of cooling fluid network channels, with a design flexibility for incorporation of dies fabricated on different wafer sizes, different wafer thickness and different substrate materials. Devices formed using the cleaving and stacking techniques provided in this disclosure have numerous advantages over conventional technologies. Substrates that are formed by backgrinding are subject to substantially higher levels of mechanical stress and higher levels of thickness variation over the substrate surface. Ionic cleaving can be performed with fewer process steps than backgrinding, simplifying the process and reducing the amount of handling required. Layers of the 3DIC structures according to the present disclosure may be interconnected through dense high bandwidth vertical and lateral metal connections, which may displace the need for interposer and solder bump structures, leading to smaller, more tightly integrated, higher speed devices that are more efficient to manufacture.

While the above is a full description of specific embodiments, various modifications, alternative constructions and equivalents may be used. Therefore, the above description and illustrations should not be taken as limiting the scope of the present disclosure.

The invention claimed is:

1. A method of forming a semiconductor device, the method comprising:
providing a semiconductor substrate with a circuit layer having different regions with different respective stopping powers;
forming a range compensating layer over the semiconductor substrate, the range compensating layer having a plurality of different thicknesses, each of the plurality of different thicknesses being inversely proportional to the respective stopping powers of the regions of the underlying circuit layer;
implanting ions into the semiconductor substrate, the ions traveling through the range compensating layer and the circuit layer to define a cleave plane in the semiconductor substrate;
removing the range compensating layer; and
cleaving the semiconductor substrate at the cleave plane.

2. The method of claim 1, wherein a depth of the cleave plane under two different regions corresponding to two different thicknesses of the range compensating layer are disposed at is substantially the same level of the semiconductor substrate.

3. The method of claim 1, wherein the stopping power of the structures are caused by differences in material composition of dielectric and conductive structures in different regions of the circuit layer.

4. The method of claim 1, further comprising:
exposing the circuit layer to hydrogen to repair damage caused by implanting the ions.

5. The method of claim 4, wherein the hydrogen is delivered to damage sites by exposing the circuit layer to a hydrogen-bearing gas at a temperature of 300° C. or more for a time of 30 minutes or more.

6. The method of claim 1, wherein the range compensating layer includes an etch stop layer.

7. The method of claim 1, wherein forming the range compensating layer over the circuit layer includes:
depositing the range compensation layer over the circuit layer; and
patterning the range compensation layer to have a first thickness and a second thickness that is greater than the first thickness;
wherein the first thickness is disposed over a first circuit region having a first density of conductive and dielectric structures, and the second thickness is disposed over a second circuit region having a second density of conductive and dielectric structures, and
the first density is greater than the second density.

8. The method of claim 7, wherein the first thickness is a thickness of an etch stop layer included in the range compensating layer.

9. The method of claim 7, wherein patterning the range compensation layer includes patterning the range compensation layer to have a third thickness that is different from the first thickness and the second thickness.

10. The method of claim 1, wherein the semiconductor device is a microprocessor, and the range compensating layer is formed to have a greater thickness over a memory region of the microprocessor compared to a logic core region of the microprocessor.

11. The method of claim 1, wherein the semiconductor device is an optical sensor, and the range compensating layer is formed to have a greater thickness over a photosensor array region of the microprocessor compared to an imaging processing circuit region of the microprocessor.

12. A method of forming a semiconductor device, the method comprising:
provingd a semiconductor substrate with a circuit layer, the circuit layer having a plurality of conductive and dielectric structures arranged in different regions, each of the regions having a different stopping power;
depositing a range compensation layer over the circuit layer; and
patterning the range compensation layer to have a first thickness and a second thickness that is greater than the first thickness, wherein the first thickness is disposed over a first region having a first stopping power, and the second thickness is disposed over a second region having a second stopping power that is less than the first stopping power;
implanting ions into the semiconductor substrate, the ions traveling through the range compensating layer and the circuit layer to define a cleave plane in the semiconductor substrate;
removing the range compensating layer; and
cleaving the semiconductor substrate at the cleave plane.

13. The method of claim 12, wherein a depth of the cleave plane under the first region is substantially the same as a depth of the cleave plane under the second region.

14. The method of claim 12, further comprising:
exposing the circuit layer to a gas that includes hydrogen to repair damage caused by implanting the ions.

15. The method of claim 12, wherein repairing the damage includes delivering hydrogen to damage sites below a surface of the circuit layer.

16. The method of claim 15, wherein the hydrogen is delivered to the damage sites by exposing the circuit layer to a hydrogen-bearing gas at a temperature of 300° C. or more for a time of 30 minutes or more.

17. The method of claim 12, wherein the range compensating layer includes an etch stop layer.

18. The method of claim 17, wherein the first thickness is a thickness of an etch stop layer included in the range compensating layer.

19. The method of claim 12, wherein the semiconductor device is a microprocessor, and the range compensating layer is formed to have a greater thickness over a memory region of the microprocessor compared to a logic core region of the microprocessor.

20. The method of claim 12, wherein the semiconductor device is an optical sensor, and the range compensating layer is formed to have a greater thickness over a photosensor array region of the microprocessor compared to an imaging processing circuit region of the microprocessor.

21. A method of forming a semiconductor device, the method comprising:
providing a semiconductor substrate with a circuit layer;
forming a range compensating layer over the semiconductor substrate, the range compensating layer having a plurality of different thicknesses, each of the plurality of different thicknesses being inversely proportional to a stopping power of structures disposed under the respective thickness of the range compensating layer;
implanting ions into the semiconductor substrate, the ions traveling through the range compensating layer and the circuit layer to define a cleave plane in the semiconductor substrate;
removing the range compensating layer; and
cleaving the semiconductor substrate at the cleave plane,
wherein the semiconductor device is an optical sensor, and the range compensating layer is formed to have a greater thickness over a photosensor array region of the microprocessor compared to an imaging processing circuit region of the microprocessor.

* * * * *